(12) United States Patent
Yamamoto et al.

(10) Patent No.: US 9,460,936 B2
(45) Date of Patent: *Oct. 4, 2016

(54) SEMICONDUCTOR DEVICE AND METHOD OF MANUFACTURING THE SAME

(71) Applicant: Renesas Electronics Corporation, Tokyo (JP)

(72) Inventors: Yoshiki Yamamoto, Tokyo (JP); Hideki Makiyama, Tokyo (JP); Takaaki Tsunomura, Tokyo (JP); Toshiaki Iwamatsu, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/856,382

(22) Filed: Sep. 16, 2015

(65) Prior Publication Data

US 2016/0005865 A1 Jan. 7, 2016

Related U.S. Application Data

(63) Continuation of application No. 14/381,562, filed as application No. PCT/JP2012/062772 on May 18, 2012, now Pat. No. 9,293,347.

(51) Int. Cl.
*H01L 21/32* (2006.01)
*H01L 29/66* (2006.01)
(Continued)

(52) U.S. Cl.
CPC ........... *H01L 21/32* (2013.01); *H01L 29/0847* (2013.01); *H01L 29/42384* (2013.01); *H01L 29/6656* (2013.01); *H01L 29/66545* (2013.01);
(Continued)

(58) Field of Classification Search
CPC .......... H01L 29/1608; H01L 29/2003; H01L 27/1203; H01L 27/1214
See application file for complete search history.

(56) References Cited

U.S. PATENT DOCUMENTS 5,168,072 A 12/1992 Moslehi
5,397,909 A 3/1995 Moslehi
(Continued)

FOREIGN PATENT DOCUMENTS

JP 06-077246 A 3/1984
JP 2000-277745 A 10/2000
(Continued)

OTHER PUBLICATIONS

Kikuchi, Y. et al, "Novel damascene gate metal-oxide-semiconductor field-effect transistors fabricated by in-situ arsenic- and boron-doped epitaxy", Japanese Journal of Applied Physics, Japan Society of Applied Physics, vol. 49, No. 7, Jul. 1, 2010, pp. 71301-1 through 71301-5.
(Continued)

*Primary Examiner* — Fernando L Toledo
*Assistant Examiner* — Neil Prasad
(74) *Attorney, Agent, or Firm* — Shapiro, Gabor and Rosenberger, PLLC

(57) ABSTRACT

The semiconductor device has a gate electrode GE formed on a substrate via a gate insulating film GI and a source/drain semiconductor layer EP1 formed on the substrate. The upper surface of the semiconductor layer EP1 is positioned higher than the upper surface of the substrate straight below the gate electrode GE. And, end parts of the gate electrode GE in a gate length direction are positioned on the semiconductor layer EP1.

9 Claims, 55 Drawing Sheets

(51) Int. Cl.
  *H01L 29/78*  (2006.01)
  *H01L 29/423*  (2006.01)
  *H01L 29/786*  (2006.01)
  *H01L 29/08*  (2006.01)

(52) U.S. Cl.
  CPC ... *H01L 29/66628* (2013.01); *H01L 29/66772* (2013.01); *H01L 29/78* (2013.01); *H01L 29/786* (2013.01); *H01L 29/7834* (2013.01); *H01L 29/7848* (2013.01); *H01L 29/78618* (2013.01); *H01L 29/78627* (2013.01)

(56) References Cited

U.S. PATENT DOCUMENTS

| | | |
|---|---|---|
| 6,124,627 A | 9/2000 | Rodder et al. |
| 6,127,232 A | 10/2000 | Chatterjee et al. |
| 6,187,641 B1 | 2/2001 | Rodder et al. |
| 6,323,525 B1 | 11/2001 | Noguchi et al. |
| 6,365,465 B1 | 4/2002 | Chan et al. |
| 2001/0026000 A1 | 10/2001 | Matsuoka |
| 2002/0093053 A1 | 7/2002 | Chan et al. |
| 2004/0050319 A1 | 3/2004 | Koyanagi et al. |
| 2006/0003584 A1 | 1/2006 | Koyanagi et al. |
| 2006/0131676 A1 | 6/2006 | Saito et al. |
| 2006/0157797 A1 | 7/2006 | Tateshita |
| 2007/0108514 A1 | 5/2007 | Inoue et al. |
| 2007/0228417 A1 | 10/2007 | Yasutake |
| 2008/0283906 A1 | 11/2008 | Bohr |
| 2010/0117147 A1 | 5/2010 | Kim et al. |
| 2011/0147828 A1 | 6/2011 | Murthy et al. |
| 2013/0240950 A1 | 9/2013 | Bohr |

FOREIGN PATENT DOCUMENTS

| | | |
|---|---|---|
| JP | 2004-128493 A | 4/2004 |
| JP | 2007-067425 A | 3/2007 |
| JP | 2007-134432 A | 5/2007 |
| JP | 2007-165665 A | 6/2007 |
| JP | 2007-234993 A | 9/2007 |
| JP | 2007-281038 A | 10/2007 |
| JP | 2007-324430 A | 12/2007 |
| JP | 2010-527153 A | 8/2010 |

OTHER PUBLICATIONS

Extended European search report (including supplementary European search report and search opinion) from European Patent Application No. 12876943.7, Jan. 14, 2016.

SEMICONDUCTOR DEVICE AND METHOD OF MANUFACTURING THE SAME

TECHNICAL FIELD

The present invention relates to a semiconductor device and method of manufacturing the same and, for example, can be suitably used in a semiconductor device including a MISFET and method of manufacturing the same.

BACKGROUND

A MISFET is formed by forming a gate electrode on a substrate via a gate insulating film and forming a source/drain region on the substrate.

Also, there is a technique of forming a MISFET by growing a source/drain epitaxial layer on a substrate.

Japanese Patent Application Laid-Open Publication No. 2000-277745 (Patent Document 1) discloses a technique regarding a double-gate MOSFET using a SOI substrate.

Japanese Patent Application Laid-Open Publication No. 2007-165665 (Patent Document 2) discloses a technique in which a p-channel-type MISFET is formed on a Si substrate, a trench is formed in a region serving as source and drain regions of the p-channel-type MISFET, and a SiGe layer is buried in that trench by an epitaxial growth method.

PRIOR ART DOCUMENTS

Patent Documents

Patent Document 1: Japanese Patent Application Laid-Open Publication No. 2000-277745
Patent Document 2: Japanese Patent Application Laid-Open Publication No. 2007-165665

SUMMARY

Problems to be Solved by the Invention

To form a source/drain semiconductor layer on a substrate, it is desirable to improve performance as much as possible even for a semiconductor device having a MISFET formed by using an epitaxial growth method, for example, to improve reliability of the semiconductor device, or to achieve both.

Other problems and novel features will become evident from the description of the specification and the attached drawings.

Means for Solving the Problems

According to one embodiment, in a semiconductor device, a source/drain semiconductor layer is formed on a substrate, and end parts of a gate electrode in a gate length direction ride onto the semiconductor layer.

Also, according to one embodiment, in a semiconductor device manufacturing method, a dummy gate is formed on a substrate, then a source/drain formation semiconductor layer is formed on the substrate by, for example, an epitaxial technique, and then a sidewall film is formed on a sidewall of the dummy gate. Then, an insulating film is formed on the substrate so as to cover the dummy gate, and then an upper surface of the dummy gate is exposed. Then, a gate electrode is formed in a trench formed by removing the dummy gate and the sidewall film, via a gate insulating film.

Effects of the Invention

According to one embodiment, it is possible to improve performance of the semiconductor device or reliability of the semiconductor device, or achieve both.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiment, and the repetitive description thereof will be omitted. Also, the description of the same or similar portions is not repeated in principle unless particularly required in the following embodiments.

Also, in some drawings used in the embodiments, hatching is omitted even in a cross-sectional view so as to make the drawings easy to see. And also, hatching is used even in a plan view so as to make the drawings easy to see.

(First Embodiment)

<Regarding Structure of Semiconductor Device>

Figure 1:
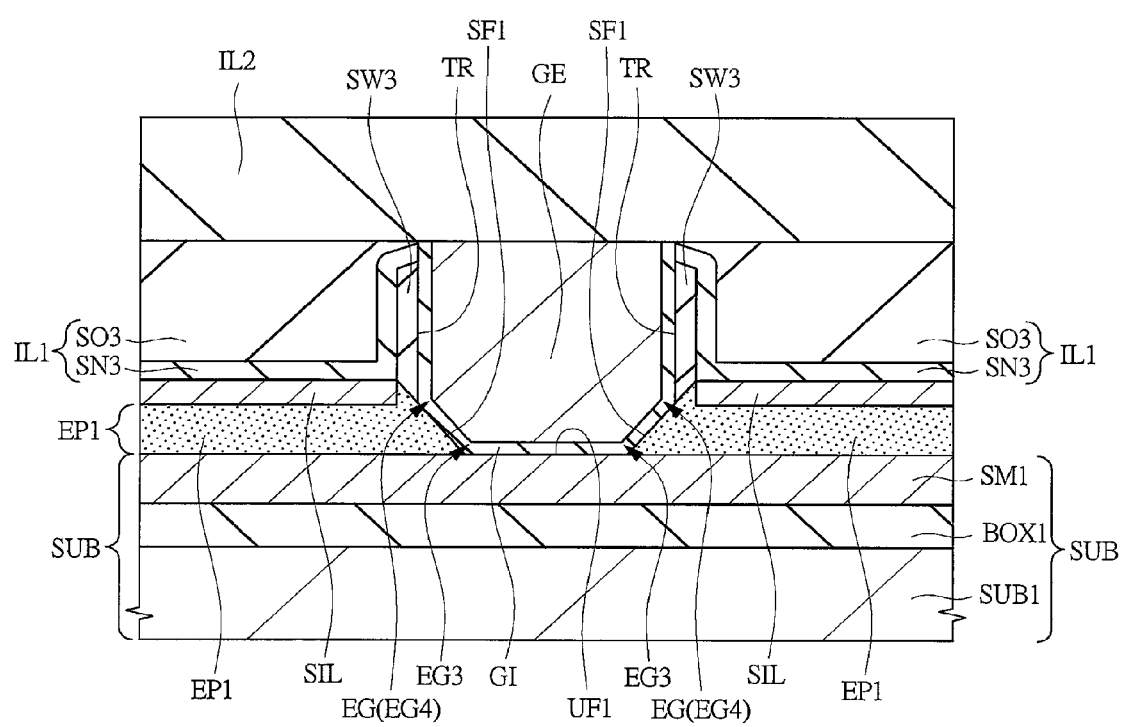
FIG. 1 is a cross-sectional view of main parts of a semiconductor device of a first embodiment.
Figure 2:
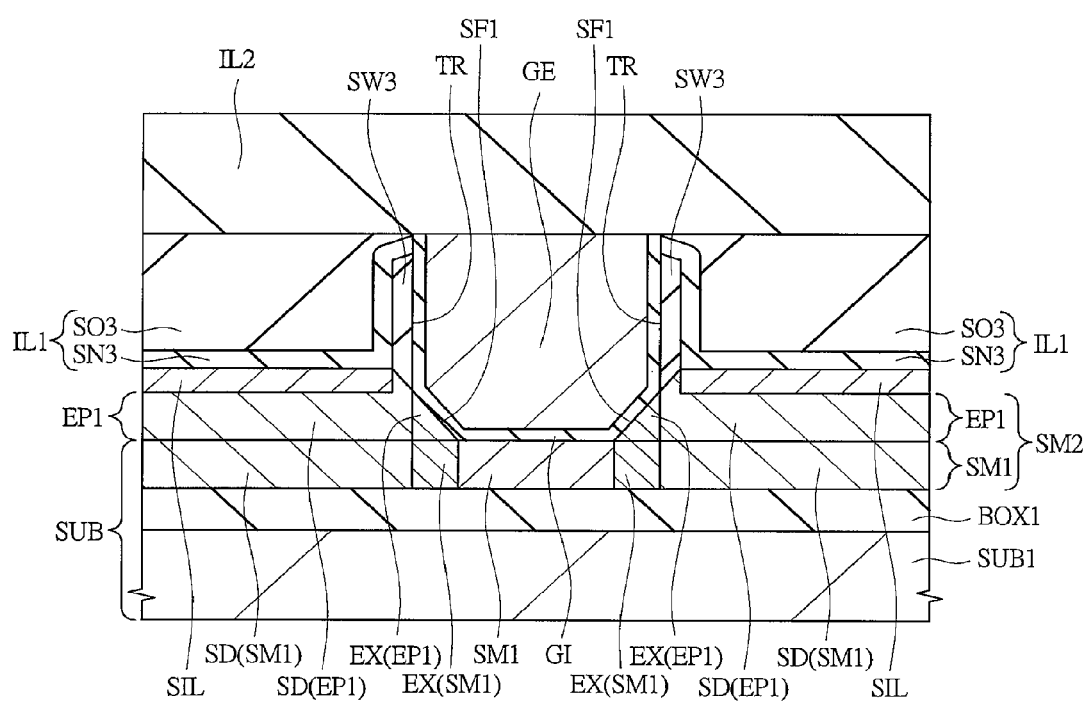
FIG. 2 is a cross-sectional view of main parts of the semiconductor device of the first embodiment.

FIG. 1 and FIG. 2 are cross-sectional views of main parts of a semiconductor device of a first embodiment. Also, FIG. 1 and FIG. 2 are cross-sectional views of the same region. However, in FIG. 1, in order to make respective regions of a semiconductor layer SM1 and a semiconductor layer EP1 easily understood, the entire semiconductor layer EP1 is hatched with dots and the entire semiconductor layer SM1 is hatched with fine diagonal lines, and formation regions of an $n^-$-type semiconductor region EX and an $n^+$-type semiconductor region SD are not depicted. Also, in FIG. 2, in order to make respective regions of the $n^-$-type semiconductor region EX and the $n^-$-type semiconductor region SD easily understood, the entire $n^-$-type semiconductor region EX is hatched in a same manner, and the entire $n^+$-type semiconductor region SD is hatched in another same manner. Therefore, by viewing FIG. 1 and FIG. 2 together, the structures of the semiconductor layer SM1 and the semiconductor layer EP1 and the formation regions of the $n^-$-type semiconductor region EX and the $n^+$-type semiconductor region SD in the semiconductor layer SM1 and the semiconductor layer EP1 can be easily understood. Note in FIG. 1 and FIG. 2 that structures of an insulating film IL3 and a wiring M1, which will be described further below, and thereabove are not depicted.

The semiconductor device in the first embodiment and those in the following second to fourth embodiments are semiconductor devices each including a MISFET (Metal Insulator Semiconductor Field Effect Transistor).

The semiconductor device of the first embodiment depicted in FIG. 1 and FIG. 2 is a semiconductor device using a SOI (SOI: Silicon On Insulator) substrate SUB.

The SOI substrate SUB has a substrate (semiconductor substrate or support substrate) SUB1 made of monocrystalline silicon or the like, an insulating layer (buried insulating film, buried oxide film, or BOX (Buried Oxide) layer)

BOX1 made of silicon oxide or the like formed on a main surface of the substrate SUB1, and a semiconductor layer (SOI layer) SM1 made of monocrystalline silicon formed on an upper surface of the insulating layer BOX1. The substrate SUB1 is a support substrate which supports the insulating layer BOX1 and structures thereabove. The substrate SUB1, the insulating layer BOX1, and the semiconductor layer SM1 form the SOI substrate SUB. On a main surface of the SOI substrate SUB, a MISFET is formed. Here, the case is described in which the MISFET is an n-channel-type MISFET.

On the semiconductor layer SM1, a gate electrode GE is formed via a gate insulating film GI.

The gate electrode GE is a metal gate electrode (metal gate electrode) using a metal material such as titanium nitride (TiN), tantalum nitride (TaN), tungsten nitride (WN), titanium carbide (TiC), tantalum carbide (TaC), tungsten carbide (WC), or tantalum nitride-carbide (TaCN). Note that the metal herein refers to a conductive material assuming metallic conduction and includes not only a simple metal substance (pure metal) and an alloy but also a metal compound assuming metallic conduction (such as a metal nitride and metal carbide). With the gate electrode GE being a metal gate electrode, it is possible to advantageously inhibit a depletion phenomenon of the gate electrode GE and eliminate parasitic capacitance. It is also possible to advantageously decrease the size of a MISFET element (make a gate insulating film thinner).

As the gate electrode GE, a metal gate electrode is preferable. As another embodiment, a lamination-type gate electrode can be used, with the above-described metal material (metal film) formed as a lower layer and a polysilicon film (doped polysilicon film) used as an upper layer.

Also, as another embodiment of the metal gate electrode (gate electrode GE), a structure with lamination of a plurality of different metal films can be used.

Furthermore, as the gate insulating film GI, a metal oxide film can be used such as a hafnium oxide film, a zirconium oxide film, an aluminum oxide film, a tantalum oxide film, or a lanthanum oxide film. Still further, these metal oxide films can also contain either one or both of nitrogen (N) and silicon (Si). In this case, the gate insulating film GI is a high-dielectric-constant film (so-called High-k film) with a dielectric constant (relative permittivity) higher than that of a silicon nitride film. When a high-dielectric-constant film is used for the gate insulating film GI, the physical film thickness of the gate insulating film GI can be increased compared with the case of using a silicon oxide film, and therefore a leak current can be advantageously reduced.

Although not depicted, a silicon oxide film of 1 mm or thinner can be formed as an interface layer between the above-described metal oxide film and semiconductor layer SM1. This interface layer has a physical film thickness formed to be thinner than the physical film thickness of the above-described metal oxide film. The semiconductor layer SM1 below the gate electrode GE serves as a region (channel formation region) where a channel of the MISFET is to be formed.

On the semiconductor layer SM1, a semiconductor layer EP1 is formed, which is an epitaxial layer (epitaxial semiconductor layer). The semiconductor layer EP1 is formed on the semiconductor layer SM1 by epitaxial growth, and is made of silicon (monocrystalline silicon).

The semiconductor layer EP1 is formed on both sides (both sides in the gate length direction) of the gate electrode GE. Note that the sections depicted in FIG. 1 and FIG. 2 are planes parallel with the gate length direction of the gate electrode GE (planes along the gate length direction).

In the present embodiment, part of the gate electrode GE is present on the semiconductor layer EP1 (more specifically, on a tilted side surface SF1 of the semiconductor layer EP1). Specifically, end parts of the gate electrode GE in a gate length direction are positioned on the semiconductor layer EP1. In other words, end parts of the gate electrode GE in the gate length direction of the MISFET (MISFET with the gate electrode GE as a gate electrode) are positioned on the semiconductor layer EP1. That is, while a center side of the gate electrode GE in the gate length direction is on a portion of the semiconductor layer SM1 where the semiconductor layer EP1 is not formed, both end sides of the gate electrode GE in the gate length direction ride onto the semiconductor layer EP1 formed on the semiconductor layer SM1. That is, while the center side of the gate electrode GE (the center side in the gate length direction) does not overlap with the semiconductor layer EP1 (does not overlap in a thickness direction of the SOI substrate SUB), the end parts of the gate electrode GE (the ends in the gate length direction) overlap the semiconductor layer EP1 (overlap in the thickness direction of the SOI substrate SUB). Therefore, the semiconductor layer EP1 is present straight below portions near the both end parts of the gate electrode GE (portions near the both ends in the gate length direction), and the semiconductor layer EP1 is not present (the semiconductor layer SM1 is present) straight below the center side of the gate electrode GE (the center side in the gate length direction).

However, the gate electrode GE is not in contact with the semiconductor layers SM1 and EP1, and the gate insulating film GI is interposed between the gate electrode GE and the semiconductor layer SM1 and between the gate electrode GE and the semiconductor layer EP1. The gate insulating film GI is contiguously formed from the bottom surface to both side surfaces (sidewalls) of the gate electrode GE.

Also in the present embodiment, the end parts of the gate electrode GE in the gate length direction are positioned on the semiconductor layer EP1. The side surface SF1 of the semiconductor layer EP1 (the side surface on a gate electrode GE side) is tilted, and the end parts of the gate electrode GE in the gate length direction are positioned on the tilted side surface SF1 of the semiconductor layer EP1. In other words, the side surface SF1 of the semiconductor layer EP1 (the side surface on the gate electrode GE side) is tilted in the gate length direction of the MISFET (MISFET with the gate electrode GE as a gate electrode), and the end parts of the gate electrodes GE are positioned on the tilted side surface SF1 of the semiconductor layer EP1 in the gate length direction of the MISFET (MISFET with the gate electrode GE as a gate electrode). That is, the end parts of the gate electrode GE (the ends in the gate length directions) ride onto the tilted side surface SF1 of the semiconductor layer EP1.

Also, since the semiconductor layer EP1 is formed on a substantially flat upper surface of the semiconductor layer SM1, the upper surface of the semiconductor layer EP1 is positioned higher than the upper surface of the semiconductor layer SM1 straight below the gate electrode GE. Here, the upper surface of the semiconductor layer SM1 straight below the gate electrode GE corresponds to the surface (upper surface) of a portion of the semiconductor layer SM1 in contact with the gate insulating film GI below the gate electrode GE, and is provided with a character UF1 in FIG. 1 and denoted as the upper surface UF1.

In the semiconductor layers SM1 and EP1 on both sides (both sides in the gate length direction) of the gate electrode GE, a source or drain semiconductor region of the MISFET is formed. This source or drain semiconductor region is formed of the n⁻-type semiconductor regions EX and the n⁺-type semiconductor regions SD with an impurity concentration higher than that of the n⁻-type semiconductor region EX. That is, in a laminated layer of the semiconductor layer SM1 and the semiconductor layer EP1, (paired) n⁻-type semiconductor regions (extension regions or LDD regions) EX are formed in regions separated from each other across a channel formation region. Outside the n⁻-type semiconductor regions EX (on a side away from the channel formation region), (paired) source/drain n⁺-type semiconductor regions SD with an impurity concentration higher than that of the n⁻-type semiconductor regions EX are formed. The source or drain region semiconductor regions have the n⁻-type semiconductor regions EX and the n⁺-type semiconductor regions SD with impurity concentration higher than that of the n⁻-type semiconductor regions EX, and therefore include an LDD (Lightly Doped Drain) structure.

The n⁻-type semiconductor region EX is adjacent to the channel formation region, and the n⁺-type semiconductor region SD is formed away from the channel formation region by the n⁻-type semiconductor region EX and at a position in contact with the n⁻-type semiconductor region EX.

When viewed in the thickness direction of the SOI substrate SUB, the n⁻-type semiconductor region EX is formed from the semiconductor layer EP1 over the semiconductor layer SM1, and the n⁺-type semiconductor region SD is formed also from the semiconductor layer EP1 over the semiconductor layer SM1. Furthermore, at least part of the n⁻-type semiconductor region EX is positioned straight below the gate electrode GE.

Since the source or drain semiconductor region (corresponding to the n⁻-type semiconductor region EX and the n⁺-type semiconductor region SD) is formed in the semiconductor layer EP1, the semiconductor layer EP1 can be regarded as a source/drain (source/drain formation) epitaxial layer.

Above the n⁺-type semiconductor region SD, a metal silicide layer Sit is formed. The metal silicide layer SIL is, for example, a cobalt silicide layer, a nickel silicide layer, or a nickel-platinum silicide layer.

On the main surface of the SOI substrate SUB, an insulating film IL1 is formed so as to cover the semiconductor layer EP1 (and the metal silicide layer SIL). The insulating film IL1 is preferably formed of a laminated film of a silicon nitride film (liner film) SN3, which is a liner film, and an insulating film SO3 on the silicon nitride film SN3. The silicon nitride film SN3 has a thickness thinner than that of the insulating film SO3.

As the insulating film SO3, a silicon-oxide-based insulating film can be used. Here, the silicon-oxide-based insulating film is an insulating film made predominantly of silicon oxide, but can further contain one or more of carbon (C), fluorine (F), nitrogen (N), boron (B), and phosphorus (P).

The upper surface of the insulating film IL1 is substantially planarized, and a trench TR is formed in the insulating film IL1. In this trench TR, the gate electrode GE is buried (formed) via the gate insulating film GI. That is, the gate electrode GE is formed in the trench TR of the insulating film IL1, and the gate insulating film GI is contiguously formed on the sidewall (side surface) and the bottom surface (lower surface) of the gate electrode GE.

That is, in the present embodiment, the insulating film IL1 is formed on the SOI substrate SUB so as to cover the semiconductor layer EP1, and the gate electrode GE is buried in the trench TR formed in the insulating film IL1. Specifically, the gate insulating film GI is formed on the side surface and the bottom surface of the trench TR, and the gate electrode GE is buried in the trench TR via the gate insulating film GI.

Also, preferably, a sidewall insulating film SW3 is formed on the sidewall of the gate electrode GE via the gate insulating film GI. That is, not only the gate insulating film GI but also the sidewall insulating film SW3 is interposed between the sidewall of the gate electrode GE and the insulating film IL1. While the gate insulating film GI is in contact with the gate electrode GE, the sidewall insulating film SW3 is not in contact with the gate electrode GE. Between the sidewall insulating film SW3 and the gate electrode GE, the gate insulating film GI is interposed.

On the insulating film IL1 with the gate electrode GE buried therein, an insulating film IL2 is formed so as to cover the gate electrode GE.

In the insulating films IL1 and IL2, a contact hole CNT (not depicted herein) is formed, which will be described further below. In the contact hole CNT, a plug PG (not depicted herein) is formed, which will be described further below. Both are not depicted herein. Also, on the insulating film IL2, an insulating film IL3 (not depicted herein), which will be described further below, and a wiring M1 (not depicted herein), which will be described further below, are formed, but are not depicted herein.

<Regarding Semiconductor Device Manufacturing Method>

Figure 3:
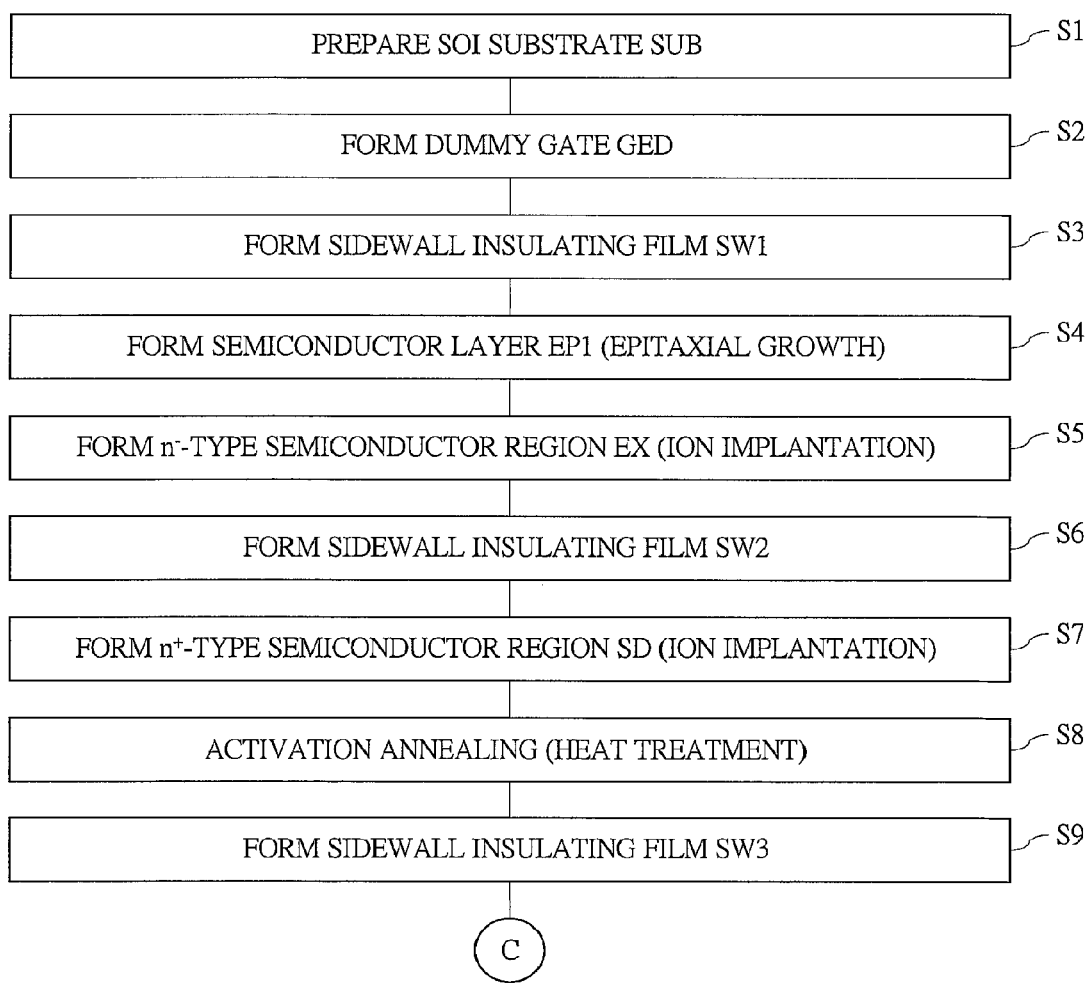
FIG. 3 is a process flow diagram of a process of manufacturing the semiconductor device of the first embodiment.
Figure 4:
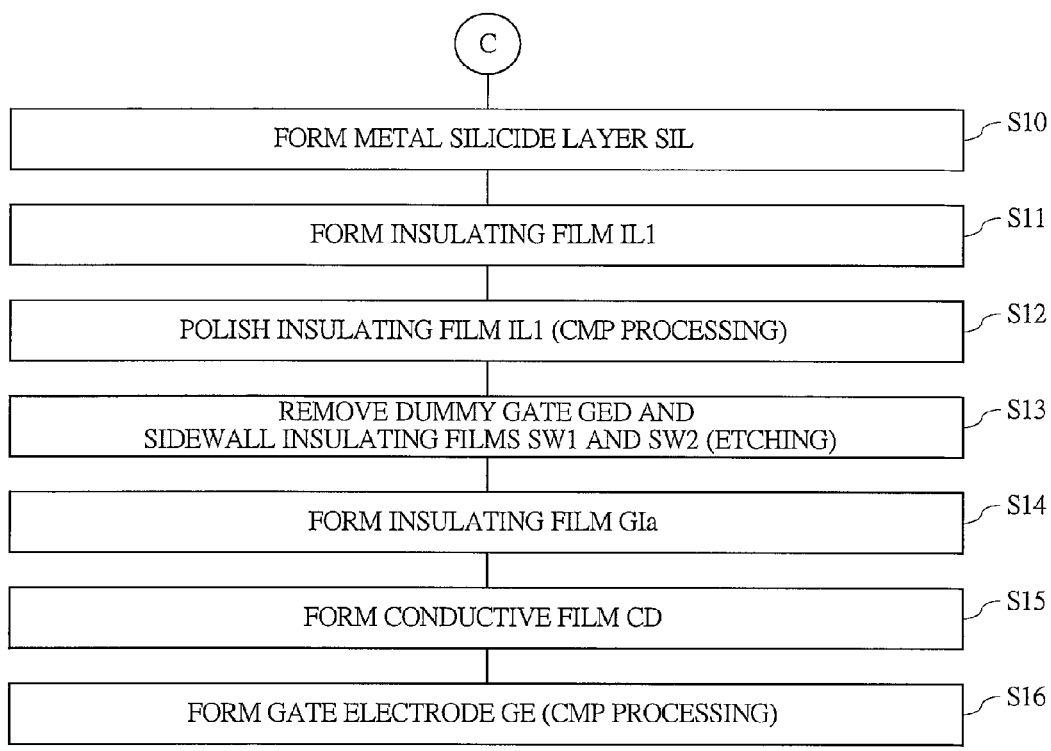
FIG. 4 is a process flow diagram of the process of manufacturing the semiconductor device of the first embodiment.

Next, a process of manufacturing the semiconductor device of the present embodiment is described with reference to the drawings. FIG. 3 and FIG. 4 are process flow diagrams of the process of manufacturing the semiconductor device of the present embodiment. FIG. 5 to FIG. 29 are cross-sectional views of main parts in the process of manufacturing the semiconductor device of the present embodiment.

Figure 5:
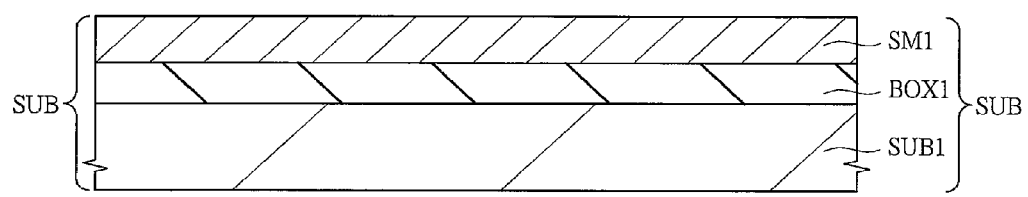
FIG. 5 is a cross-sectional view of main parts in the process of manufacturing the semiconductor device of the first embodiment.

First, as depicted in FIG. 5, the SOI substrate SUB is prepared (step S1 of FIG. 3).

The SOI substrate SUB has the substrate SUB1 made of monocrystalline silicon or the like, the insulating layer BOX1 made of silicon oxide or the like formed on the main surface of the substrate SUB1, and the semiconductor layer SM1 made of monocrystalline silicon formed on the upper surface of the insulating layer BOX1.

Compared with the thickness of the substrate SUB1, the semiconductor layer SM1 has a thin thickness. The thickness of the semiconductor layer SM1 can be, for example, on the order of 3 nm to 20 nm.

The SOI substrate SUB can be manufactured by using any of various schemes. For example, the SOI substrate SUB can be formed by attaching and laminating a semiconductor substrate (silicon substrate) with an oxide film formed on its surface and another semiconductor substrate (silicon substrate) together by applying high heat and pressure and then making a silicon layer (silicon substrate) on one side thinner. Alternatively, the SOI substrate SUB can be formed by SIMOX (Silicon Implanted Oxide) method, in which $O_2$ (oxygen) is ion-implanted with high energy onto the main surface of a semiconductor substrate made of Si (silicon) and then Si (silicon) and oxygen are bound together by heat treatment to form a buried oxide film (BOX film) at a position slightly deeper than the surface of the semiconductor substrate. Furthermore, the SOI substrate SUB can be manufactured also by using another scheme, for example, Smart Cut process.

Next, an element isolation region (not depicted) is formed on the SOI substrate SUB. The element isolation region can be formed by, for example, forming an element isolation trench in the main surface of the SOI substrate SUB (semiconductor layer SM1) by a photolithography technique, dry etching technique, and so forth, the element isolation trench penetrating through the semiconductor layer SM1 and the insulating layer BOX1 and having a bottom part positioned in the substrate SUB1, and then burying an insulating film in this element isolation trench by using a film forming technique, CMP technique, and so forth. In the semiconductor layer SM1 surrounded by the element isolation region in a planar manner, a MISFET is formed in a manner as described below.

Next, in the semiconductor layer SM1, p-type impurities (for example, boron) for making a p-type well (p-type semiconductor region) are introduced by ion implantation or the like to the semiconductor layer SM1 in a region where an n-channel-type MISFET is scheduled to be formed.

Figure 6:
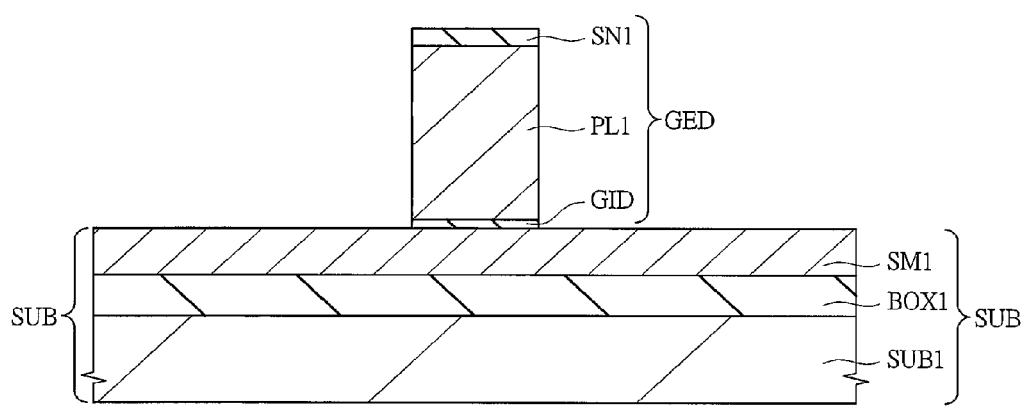
FIG. 6 is a cross-sectional view of main parts in the process of manufacturing the semiconductor device continued from FIG. 5.

Next, as depicted in FIG. 6, a dummy gate (dummy gate electrode or dummy gate structure) GED is formed on the SOI substrate SUB, that is, the semiconductor layer SM1 (Step S2 of FIG. 3).

The dummy gate GED (in particular, a polysilicon film PL1 of the dummy gate GED) is a dummy (pseudo) gate (gate electrode) not functioning as a gate (gate electrode) of a MISFET. The dummy gate GED is formed of a laminated film of an insulating film GID, a polysilicon film (polycrystalline silicon film) PL1 thereon, and a silicon nitride film SN1 thereon. In place of the silicon nitride film SN1, another insulating film, for example, a silicon oxide film, can be used. As the insulating film GID, a silicon oxide film can be used.

While the polysilicon film PL1 can be formed directly on the semiconductor layer SM1, it is preferable to form the polysilicon film PL1 on the semiconductor layer SM1 via the insulating film GID. Since the insulating film GID is removed later, the insulating film GID is a dummy gate insulating film not functioning as a gate insulating film. As the insulating film GID, a silicon oxide film can be suitably used, and the thickness of the insulating film GID is thinner than that of the polysilicon film PL1.

The insulating film GB) can be used as an etching stopper film (etching prevention film of the semiconductor layer SM1) when the polysilicon film PL1 is removed later (corresponding to a second stage of etching at step S13, which will be described further below). At that time, it is possible to prevent the semiconductor layer SM1 from being etched. Thus, it is preferable to interpose the insulating film GID between the polysilicon film PL1 and the semiconductor layer SM1.

To form the dummy gate GED, for example, a silicon oxide film (this silicon oxide film becomes an insulating film GID) is formed on the main surface of the SOI substrate SUB, and then the polysilicon film PL1 and the silicon nitride film SN1 are sequentially formed (deposited) thereon. Then, this laminated film of the polysilicon film PL1 and the silicon nitride film SN1 is patterned by using a photolithography technique and an etching technique, and thereby the dummy gate GED can be formed. Between the dummy gate GED and the semiconductor layer SM1, the insulating film GID (in this case, the silicon oxide film) is interposed.

Also, since the dummy gate GED is removed later, the dummy gate GED may not be conductive, and the polysilicon film PL1 can be replaced by another material film. However, the polysilicon film PL1 is suitable in view of easy later removal; an easily-ensured high etching selection ratio with respect to the silicon oxide film, the silicon nitride film, and so forth; easy processing as a dummy gate; resistance to occurrence of inconvenience in process, and so forth. Also, by using a polysilicon film on the same layer as that of the polysilicon film PL1, another element (for example, a polysilicon resistance) can be formed.

Next, on the sidewall of the dummy gate GED, a sidewall insulating film (offset spacer) SW1 is formed as a sidewall film (step S3 of FIG. 3).

Figure 7:
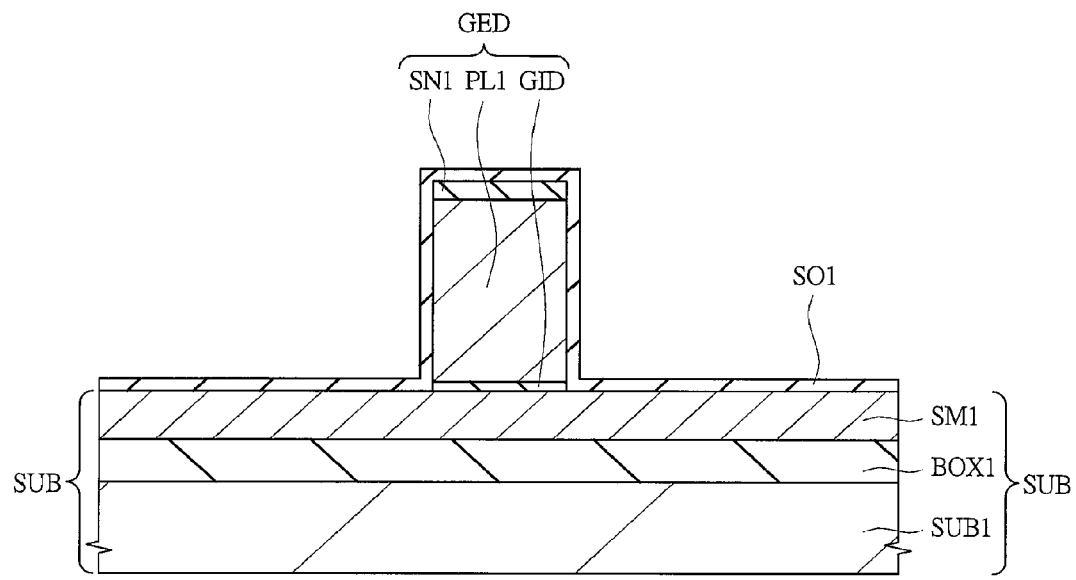
FIG. 7 is a cross-sectional view of main parts in the process of manufacturing the semiconductor device continued from FIG. 6.
Figure 8:
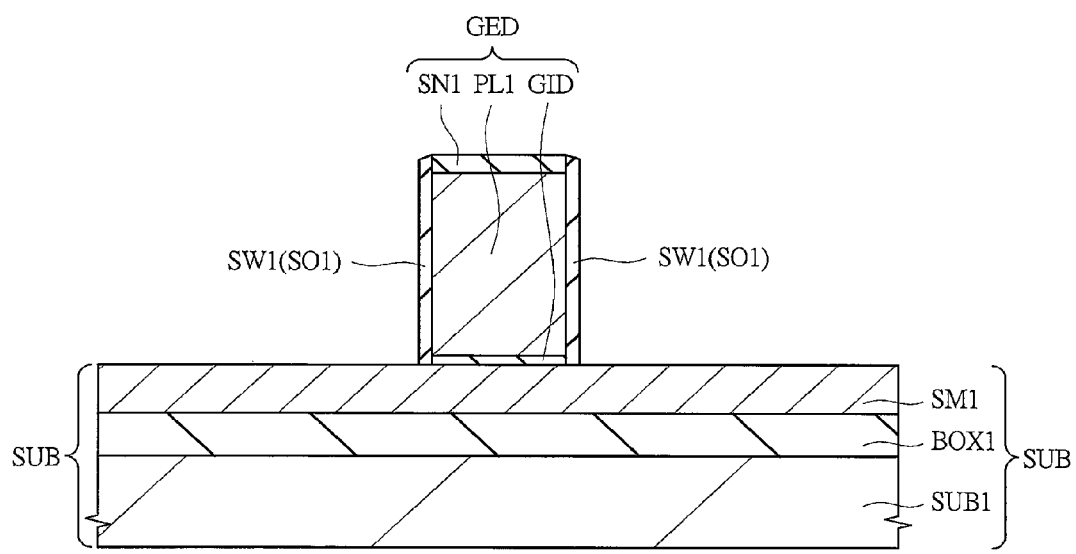
FIG. 8 is a cross-sectional view of main parts in the process of manufacturing the semiconductor device continued from FIG. 7.

The sidewall insulating film SW1 forming process at step S3 can be performed as follows. That is, first, as depicted in FIG. 7, a silicon oxide film SO1 is formed (deposited) on the entire main surface of the SOI substrate SUB by a CVD (Chemical Vapor Deposition) technique or the like so as to cover the dummy gate GED. Then, this silicon oxide film SO1 is etched back (anisotropic etching), thereby leaving the silicon oxide film SO1 on the sidewall of the dummy gate GED as a sidewall insulating film SW1 and removing the silicon oxide film SO1 of another region. With this, the sidewall insulating film SW1 is formed on the sidewall of the dummy gate GED. The thickness of the sidewall insulating film SW1 (thickness in a direction substantially perpendicular to the sidewall of the dummy gate GED) can be, for example, on the order of 3 nm to 10 nm.

Also, since the sidewall insulating film SW1 and a sidewall insulating film SW2, which will be described further below, are removed later, they do not necessarily have insulating properties. However, insulating films are preferable in view of easy formation as a sidewall film, preventability of inconvenience when an etching residue occurs at the time of removal, and so forth, and silicon oxide and silicon nitride are particularly suitable. Thus, as a material of the sidewall insulating film SW1 and the sidewall insulating film SW2, which will be described further below, silicon oxide is used in the present embodiment, and silicon nitride is used in a second embodiment, which will be described further below.

Figure 9:
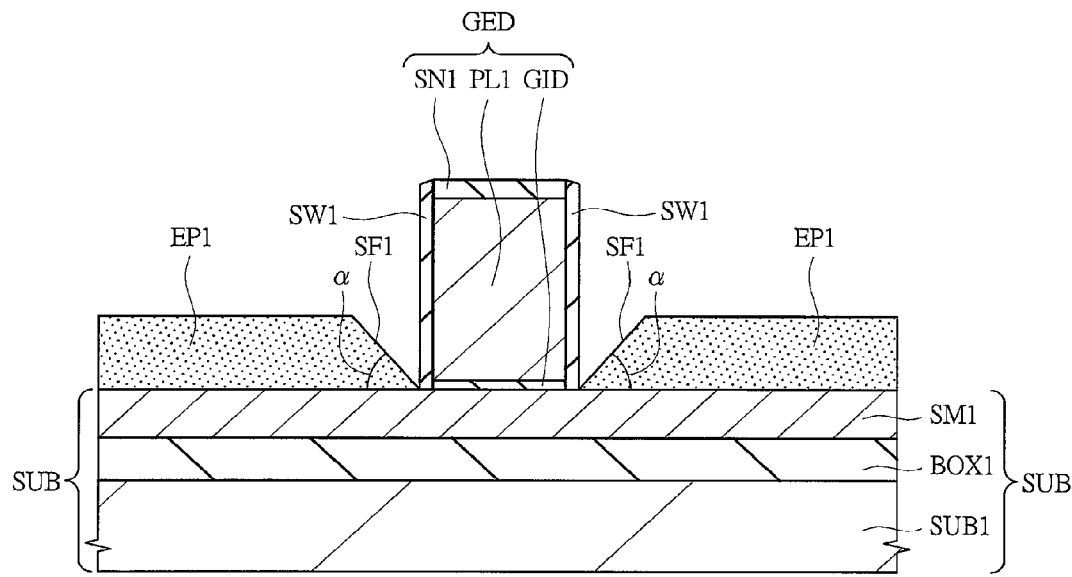
FIG. 9 is a cross-sectional view of main parts in the process of manufacturing the semiconductor device continued from FIG. 8.

Next, as depicted in FIG. 9, the semiconductor layer EP1 is epitaxially grown on the semiconductor layer SM1 (step S4 of FIG. 3).

The semiconductor layer EP1 is formed on the semiconductor layer SM1 in both side regions of the dummy gate GED (more specifically, a structure formed of the dummy gate GED and the sidewall insulating film SW1). That is, on the semiconductor layer SM1, the semiconductor layer EP1 is formed on both sides of the dummy gate GED (more specifically, the structure formed of the dummy gate GED and the sidewall insulating film SW1) so as to be adjacent to the dummy gate GED (more specifically, the structure formed of the dummy gate GED and the sidewall insulating film SW1).

The semiconductor layer EP1 is an epitaxial layer (epitaxial semiconductor layer) formed by epitaxial growth, and is made of silicon (monocrystalline silicon). The semiconductor layer EP1 epitaxially grows selectively on the semiconductor layer SM1, and is not formed on the sidewall insulating film SW1 or the silicon nitride film SN1.

For epitaxial growth of the semiconductor layer EP1, with the polysilicon film PL1 of the dummy gate GED having its upper surface covered with the silicon nitride film SN1 and its side surface (sidewall) covered with the sidewall insulating film SW1 and with the polysilicon film PL1 of the dummy gate GED not exposed, the semiconductor layer EP1 is epitaxially grown. Thus, it is possible to prevent formation of the epitaxial layer on the polysilicon film PL1 of the dummy gate GED.

That is, if the semiconductor layer EP1 is epitaxially grown with formation of the sidewall insulating film SW1 omitted and with the sidewall of the polysilicon film PL1 of the dummy gate GED exposed, epitaxial growth occurs also on the exposed portion of the polysilicon film PL1, and the semiconductor layer EP1 may be attached to the polysilicon film PL1. This can be prevented by the sidewall insulating film SW1.

Preferably, the semiconductor layer EP1 is epitaxially gown so that the side surface SF1 of the semiconductor layer EP1 is tapered. That is, the side surface SF1 of the semiconductor layer EP1 is preferably tilted with respect to the main surface of the SOI substrate SUB (that is, the main surface of the semiconductor layer SM1). That is, an angle $\alpha$ formed by the main surface of the SOI substrate SUB (that is, the main surface of the semiconductor layer SM1) and the side surface SF1 of the semiconductor layer EP1 is preferably smaller than 90° (that is, $\alpha<90°$). In other words, the side surface SF1 of the semiconductor layer EP1 is preferably tilted so that the thickness of the semiconductor layer EP1 is increased as being away from the dummy gate GED. The taper of the side surface SF1 of the semiconductor layer EP1 can be controlled by adjusting the composition of film-formation gas of the semiconductor layer EP1, film-formation temperature, and so forth.

Note that the case in which an angle formed by the side surface SF1 of the semiconductor layer EP1 and the main surface of the semiconductor layer SM1 (therefore, the main surface of the SOI substrate SUB) is an acute angle is referred to as that the side surface SF1 of the semiconductor layer EP1 is tilted, and this side surface SF1 is a tilted side surface of the semiconductor layer EP1. Therefore, when the side surface SF1 of the semiconductor layer EP1 is perpendicular to the main surface of the semiconductor layer SM1 (therefore, the main surface of the SOI substrate SUB), it cannot be said that the side surface SF1 of the semiconductor layer EP1 is tilted.

Since the semiconductor layer EP1 is formed on the substantially flat upper surface of the semiconductor layer SM1, the upper surface of the semiconductor layer EP1 is positioned higher than the upper surface of the semiconductor layer SM1. Thus, the upper surface of the semiconductor layer EP1 formed at step S4 is positioned higher than the upper surface of the semiconductor layer SM1 straight below the dummy gate GED. Note that height herein refers to height in a direction substantially perpendicular to the main surface of the substrate SUB.

A combination of the semiconductor layer SM1 and the semiconductor layer EP1 formed on the semiconductor layer SM1 is hereinafter referred to as a semiconductor layer SM2.

Figure 10:
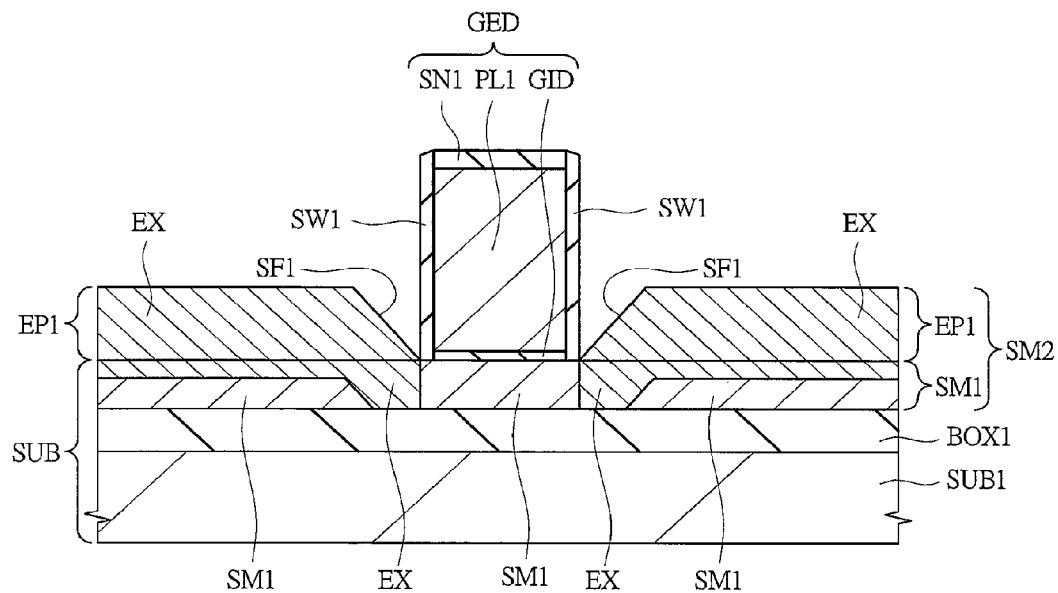
FIG. 10 is a cross-sectional view of main parts in the process of manufacturing the semiconductor device continued from FIG. 9.

Next, as depicted in FIG. 10, n-type impurities such as phosphorus (P) or arsenic (As) are ion-implanted in both side regions of the dummy gate GED and the sidewall insulating film SW1 in the semiconductor layer SM2 (that is, the semiconductor layers SM1 and EP1) to form the n⁻-type semiconductor region (extension region or LDD region) EX (step S5 of FIG. 3). In the ion implanting process for forming the n⁻-type semiconductor region EX, the dummy gate GED and the sidewall insulating film SW1 can function as a mask (ion implantation inhibiting mask). Thus, the n⁻-type semiconductor region EX is formed in (the laminated body of) the semiconductor layer SM1 and the semiconductor layer EP1 so as to be self-aligned to the sidewall insulating film SW1 on the sidewall of the dummy gate GED.

Next, the sidewall insulating film (sidewall spacer) SW2 is formed as a sidewall film on the sidewall of the dummy gate GED (step S6 of FIG. 3).

Figure 11:
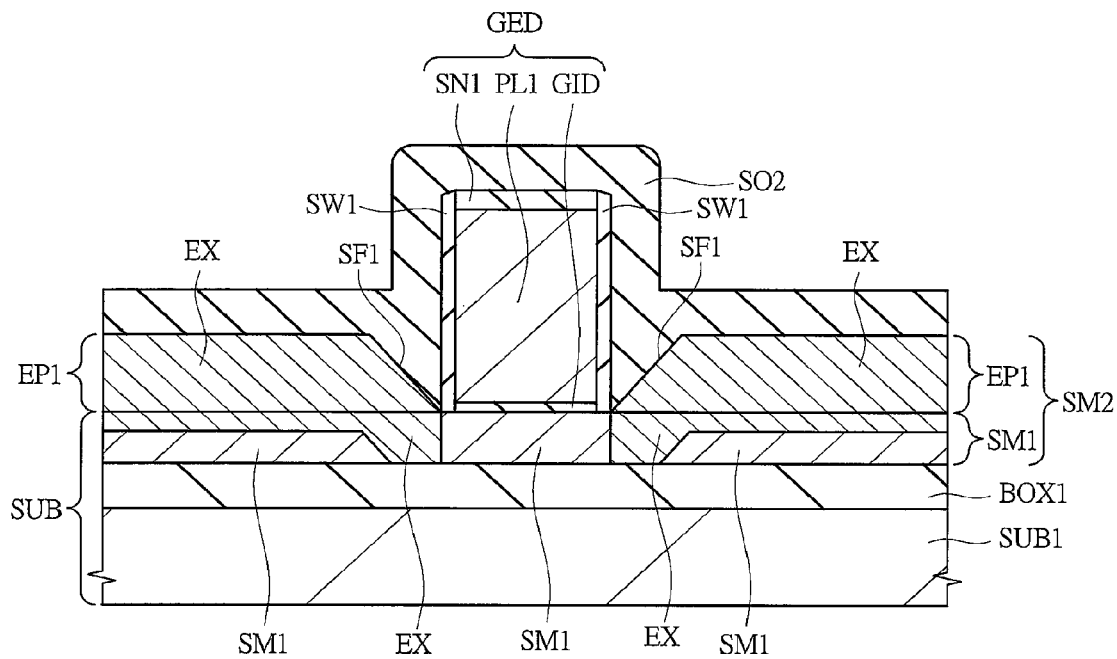
FIG. 11 is a cross-sectional view of main parts in the process of manufacturing the semiconductor device continued from FIG. 10.
Figure 12:
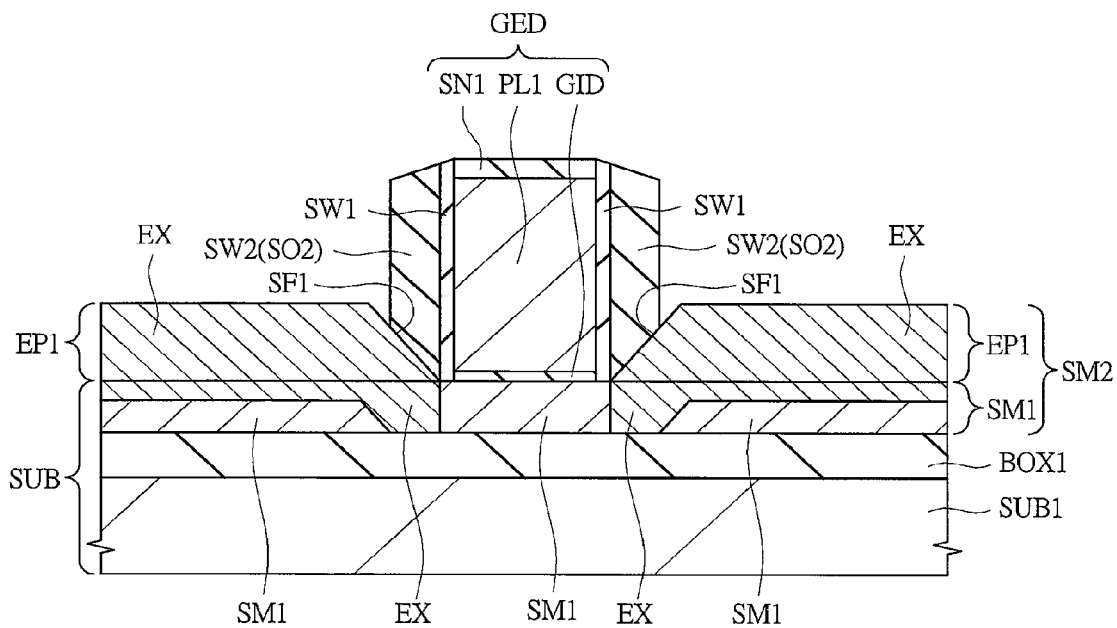
FIG. 12 is a cross-sectional view of main parts in the process of manufacturing the semiconductor device continued from FIG. 11.

The sidewall insulating film SW2 forming process at step S6 can be performed as follows. That is, first, as depicted in FIG. 11, the silicon oxide film SO2 is formed (deposited) by a CVD technique or the like on the entire surface of the main surface of the SOI substrate SUB so as to cover the dummy gate GED and the sidewall insulating film SW1. Then, this silicon oxide film SO2 is etched back (anisotropic etching). Thus, as depicted in FIG. 12, the sidewall insulating film SW2 is formed with the silicon oxide film SO2 left on the sidewall of the dummy gate GED, and the silicon oxide film SO2 in other regions is removed. With this, the sidewall insulating film SW2 is formed on the sidewall of the dummy gate GED via the sidewall insulating film SW1. The 2 thickness of the sidewall insulating film SW (thickness in a direction substantially perpendicular to the sidewall of the dummy gate GED) can be, for example, on the order of 3 nm to 10 nm.

The sidewall insulating film SW2 is adjacent to the sidewall of the dummy gate GED via the sidewall insulating film SW1, and is formed on the semiconductor layer EP1 (specifically, on the tilted side surface SF1 of the semiconductor layer EP1). That is, the bottom surface of the sidewall insulating film SW2 is in contact with a semiconductor layer EP2 (specifically, the tilted side surface SF1 of the semiconductor layer EP1), and the inner wall of the sidewall insulating film SW2 (side surface facing the dummy gate GED) is in contact with the sidewall insulating film SW1 on the sidewall of the dummy gate GED.

Figure 13:
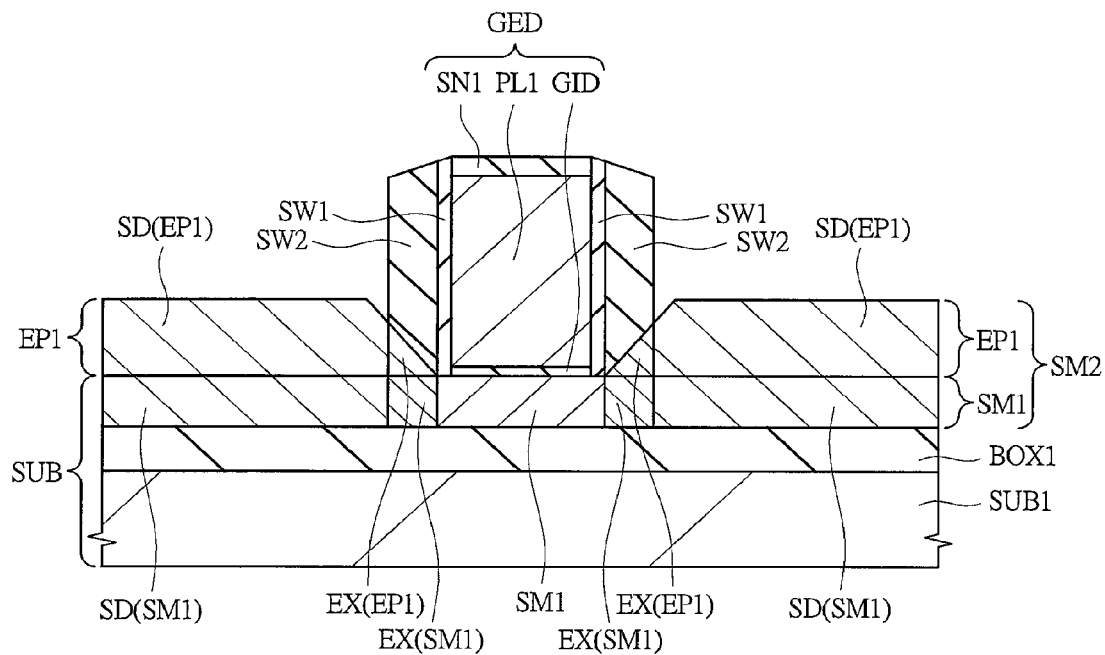
FIG. 13 is a cross-sectional view of main parts in the process of manufacturing the semiconductor device continued from FIG. 12.

Next, as depicted in FIG. 13, n⁺-type impurities such as phosphorus (P) or arsenic (As) are ion-implanted in both side regions of the dummy gate GED and the sidewall insulating films SW1 and SW2 in the semiconductor layer SM2 (that is, the semiconductor layers SM1 and EP1) to form the n⁺-type semiconductor region SD (step S7 of FIG. 3). In the ion implanting process for forming the n⁺-type semiconductor region SD, the dummy gate GED and the sidewall insulating films SW1 and SW2 can function as a mask (ion implantation inhibiting mask). Thus, the n⁺-type semiconductor region SD is formed so as to be self-aligned to the sidewall insulating film SW2 formed on the sidewall of the dummy gate GED via the sidewall insulating film SW1. The n⁺-type semiconductor region SD has an impurity concentration higher than that of the n⁺-type semiconductor region EX.

In ion implantation for forming the n⁺-type semiconductor region EX, n⁺-type impurities can be implanted in a relatively shallow region of the semiconductor layer SM2 (SM1, EP1). By comparison, in ion implantation for forming the n⁺-type semiconductor region SD, n⁺-type impurities are implanted even in a deep region of the semiconductor layer SM2 (SM1, EP1) (that is, in the entire thickness of the semiconductor layer SM2).

Before the sidewall insulating film SW2 is formed at step S6, ion implantation for forming the n⁺-type semiconductor region EX (step S5) is performed, and after the sidewall insulating film SW2 is formed at step S6, ion implantation for forming the n⁺-type semiconductor region SD (step S7) is preformed. Thus, when the process is performed up to step S7, the n⁺-type semiconductor region EX is in a state of being formed in the semiconductor layer SM2 (SM1, EP1) at a portion straight below the sidewall insulating film SW2.

Since the sidewall insulating film SW2 is removed together with the dummy gate GED at step S13, which will be described further below, and then the gate electrode GE is formed at steps S14 to S16, which will be described further below, the gate electrode GE is formed also in a region where the sidewall insulating film SW2 used to be present. Thus, when the gate electrode GE is formed later, the n$^+$-type semiconductor region EX is in a state of being substantially formed straight below part of the gate electrode GE (both end sides in the gate length direction).

Next, activation annealing is performed, which is a heat treatment for activating the impurities introduced to the n$^+$-type semiconductor region SD, the n$^+$-type semiconductor region EX, and so forth (step S8 of FIG. 3). Also, when the ion implanted region is amorphized, crystallization can be made at the time of this activation annealing at step S8.

Next, a sidewall insulating film (sidewall spacer) SW3 is formed as a sidewall film on the sidewall of the dummy gate GED (step S9 of FIG. 3).

Figure 14:
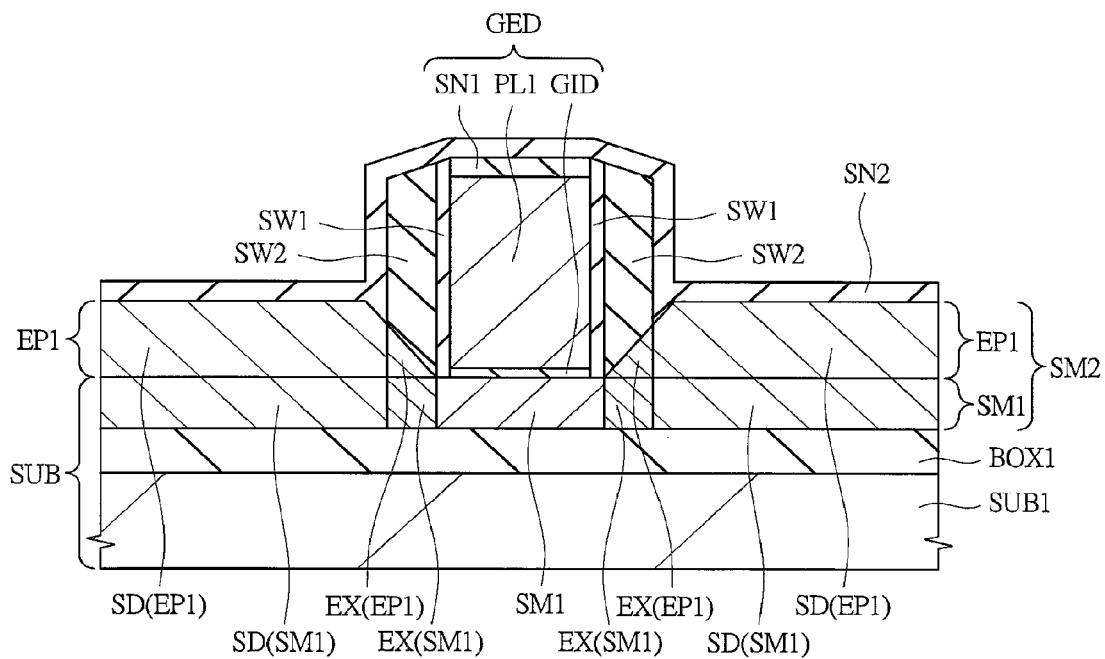
FIG. 14 is a cross-sectional view of main parts in the process of manufacturing the semiconductor device continued from FIG. 13.
Figure 15:
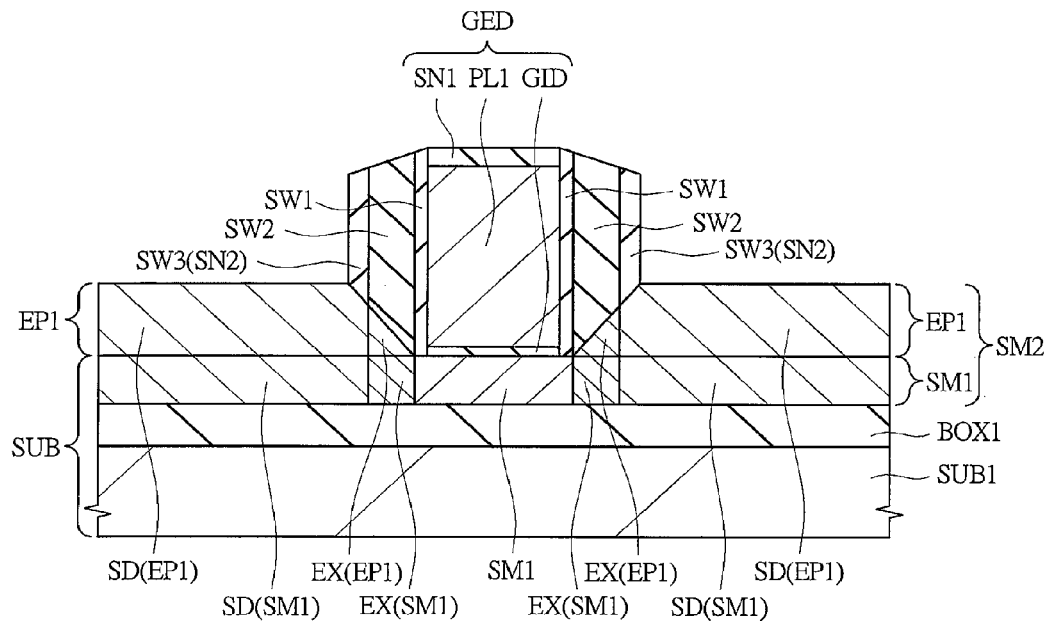
FIG. 15 is a cross-sectional view of main parts in the process of manufacturing the semiconductor device continued from FIG. 14.

The sidewall insulating film SW3 forming process at step S9 can be performed as follows. That is, first, as depicted in FIG. 14, the silicon nitride film SN2 is formed (deposited) by a CVD technique or the like on the entire surface of the main surface of the SOI substrate SUB so as to cover the dummy gate GED and the sidewall insulating films SW1 and SW2. Then, this silicon nitride film SN2 is etched back (anisotropic etching). Thus, as depicted in FIG. 15, the sidewall insulating film SW3 is formed with the silicon nitride film SN2 left on the sidewall of the dummy gate GED, and the silicon nitride film SN2 in other regions is removed. With this, the sidewall insulating film (sidewall spacer) SW3 is formed on the sidewall of the dummy gate GED via the sidewall insulating films SW1 and SW2. The thickness of the sidewall insulating film SW3 (thickness in a direction substantially perpendicular to the sidewall of the dummy gate GED) can be, for example, on the order of 10 nm to 30 nm.

At this stage, on the sidewall of the dummy gate GED, the sidewall insulating film SW1, the sidewall insulating film SW2, and the sidewall insulating film SW3 are formed (laminated), in the order in which the nearest to the dummy gate GED comes first.

While formation of the sidewall insulating film SW3 can be omitted, it is more preferable to form the sidewall insulating film SW3. When the sidewall insulating film SW3 is formed, the formation position of the metal silicide layer SIL can be away from the position of the dummy gate GED also by the thickness of the sidewall insulating film SW3, in addition to the thicknesses of the sidewall insulating films SW1 and SW2. Thus, the metal silicide layer SIL can be formed in a region where the thickness of the semiconductor layer EP1 is relatively thick (therefore, a region where the thickness of the semiconductor layer SM2 is relatively thick). Therefore, in the semiconductor layer SM2, it is possible to prevent a region in which a silicon region is absent in the thickness direction from occurring with formation of the metal silicide layer SIL. Also, if the gate electrode GE and the gate insulating film GI are formed with the sidewall insulating film SW3 left in a subsequent process, not only the gate insulating film GI but also the sidewall insulating film SW3 is interposed between the metal silicide layer SIL, and the gate electrode GE. Therefore, withstand voltage between the gate electrode GE and the metal silicide layer SIL can be improved.

Next, the low-resistant metal silicide layer SIL is formed on a surface (upper layer part) of the n$^-$-type semiconductor region SD by Salicide (Self Aligned Silicide) technique (step S10 of FIG. 4).

Figure 16:
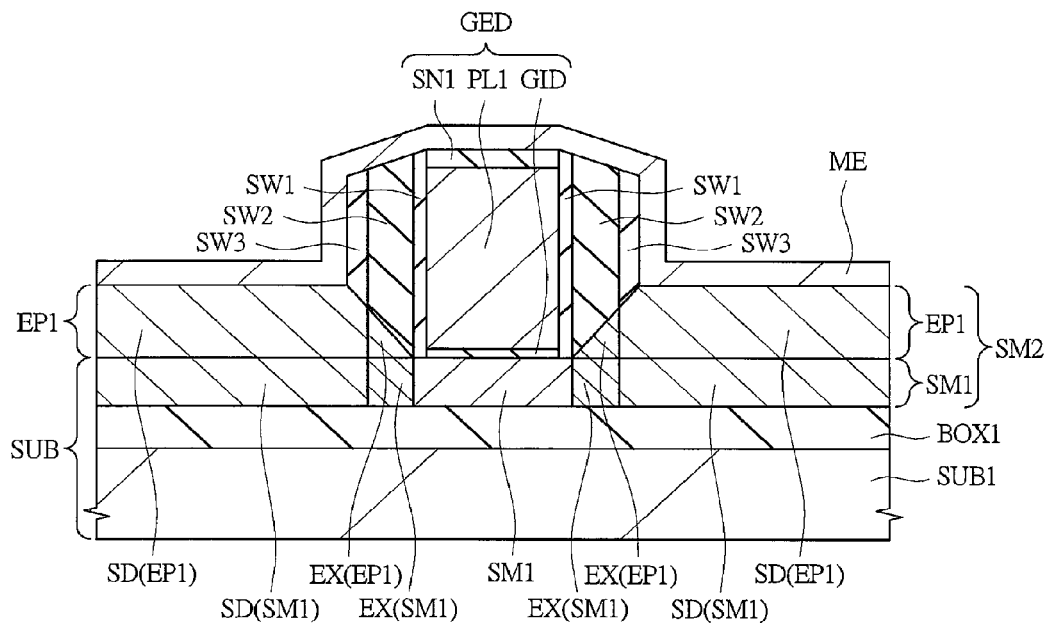
FIG. 16 is a cross-sectional view of main parts in the process of manufacturing the semiconductor device continued from FIG. 15.
Figure 17:
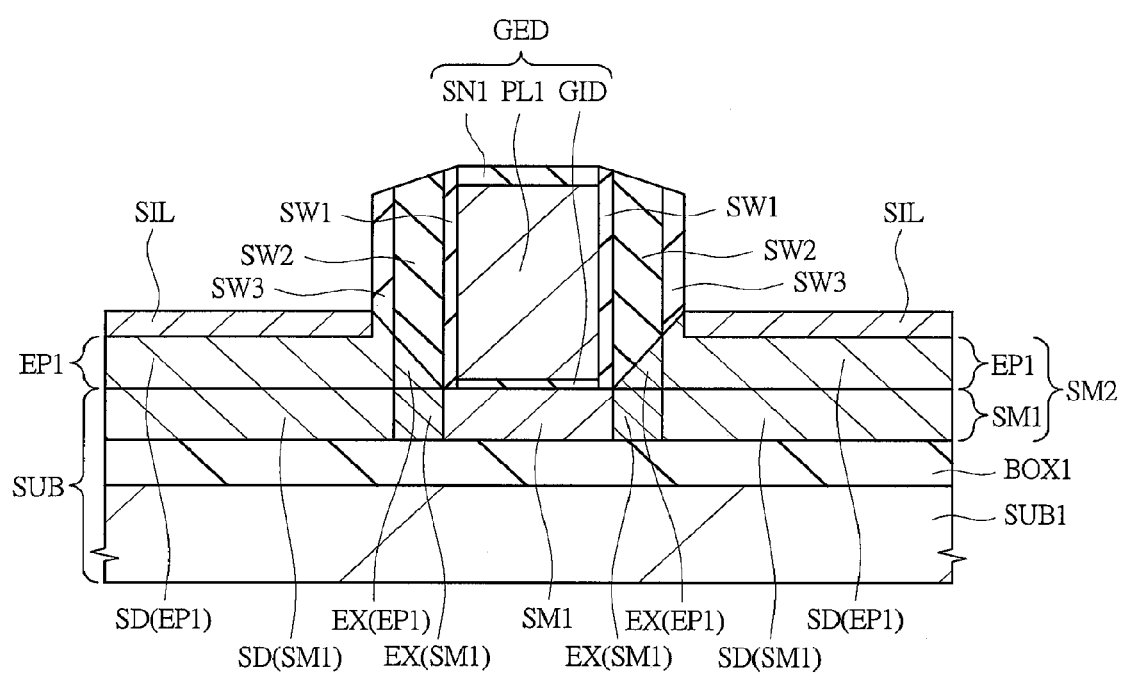
FIG. 17 is a cross-sectional view of main parts in the process of manufacturing the semiconductor device continued from FIG. 16.

The metal silicide layer SIL forming process at step S10 can be performed as follows. That is, first, the surface of the n$^+$-type semiconductor region SD (specifically, the surface of a portion of the semiconductor layer EP1 not covered with the dummy gate GED and the sidewall insulating films SW1, SW2, and SW3) is exposed, and then a metal film ME is formed (deposited) on the main surface (entire surface) of the SOI substrate SUB so as to cover the dummy gate GED, the sidewall insulating films SW1, SW2, and SW3, and the n$^+$-type semiconductor region SD, as depicted in FIG. 16. The metal film ME is formed of, for example, a cobalt (Co) film, a nickel (Ni) film, or a nickel-platinum alloy film, and can be formed by using a sputtering method or the like. Then, with a heat treatment, the metal film ME and (silicon forming) the n$^+$-type semiconductor region SD are reacted with each other. With this, as depicted in FIG. 17, the metal silicide layer SIL is formed on the surface of the n$^+$-type semiconductor region SD. Then, an unreacted portion of the metal film ME is removed, and this stage is depicted in FIG. 17.

When the metal film ME is a cobalt film, the metal silicide layer SIL is a cobalt silicide layer. When the metal film ME is a nickel film, the metal silicide layer SIL is a nickel silicide layer. When the metal film ME is a nickel-platinum alloy film, the metal silicide layer SIL is a nickel-platinum silicide layer. By forming the metal silicide layer SIL, diffusion resistance, contact resistance of the n$^+$-type semiconductor region SD, and so forth can be lowered.

The metal silicide layer SIL is formed on the surface (upper layer part) of the n$^+$-type semiconductor region SD. The metal silicide layer SIL is formed mainly on the semiconductor layer EP1.

Note that since the sidewall insulating films SW1 and SW2 are formed on the sidewall of the dummy gate GED and the silicon nitride film SN1 is formed on the polysilicon film PL1 of the dummy gate GED, the polysilicon film PL1 of the dummy gate GED is not in contact with the metal film ME, and the polysilicon film PL1 does not react with the metal film ME. Thus, no metal silicide layer is formed on the surface of the polysilicon film PL1 of the dummy gate GED.

Figure 18:
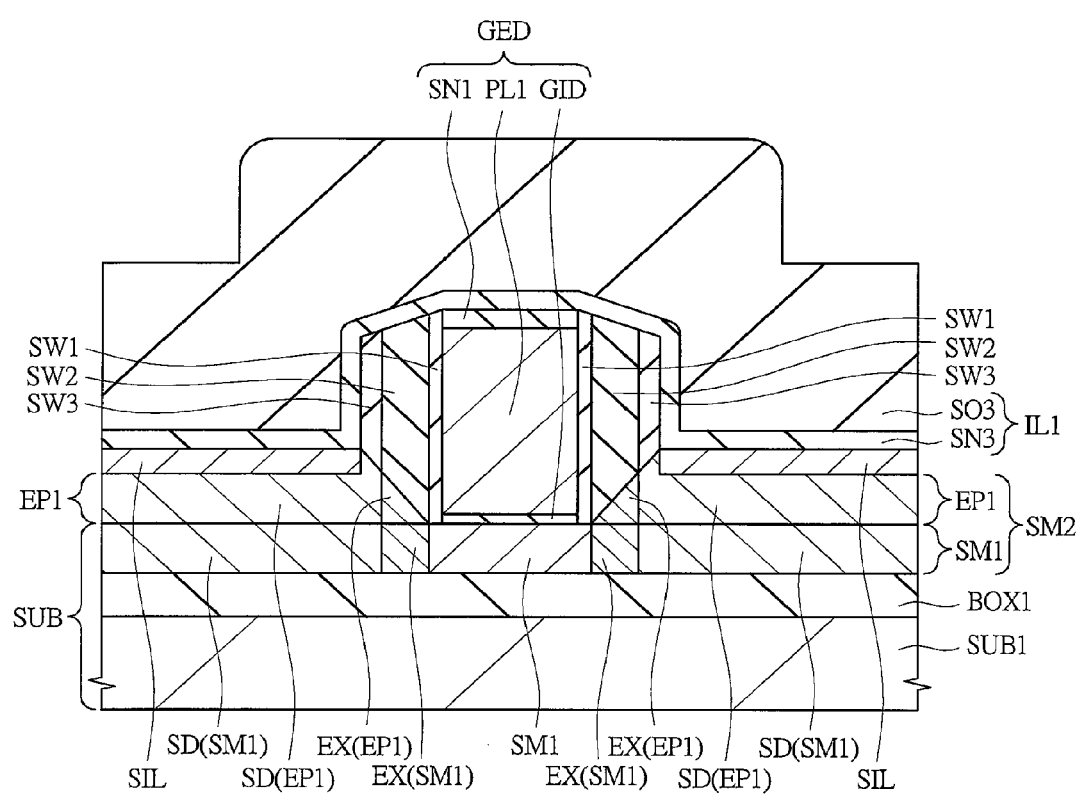
FIG. 18 is a cross-sectional view of main parts in the process of manufacturing the semiconductor device continued from FIG. 17.

Next, as depicted in FIG. 18, an insulating film (interlayer insulating film) IL1 is formed on the main surface (entire surface of the main surface) of the SOI substrate SUB (step S11 of FIG. 4). That is, the insulating film IL1 is formed on the main surface of the SOI substrate SUB so as to cover the dummy gate GED and the sidewall insulating films SW1, SW2, and SW3. The insulating film IL1 is preferably a laminated film of the silicon nitride film (liner film) SN3 and the insulting film (interlayer insulating film) SO3 on the silicon nitride film SN3. The film thickness of the insulating film SO3 is thicker than the film thickness of the silicon nitride film SN3. As the insulating film SO3, a silicon-oxide-based insulating film can be used. Here, the silicon-oxide-based insulating film is an insulating film made predominantly of silicon oxide, but can further contain one or more of carbon (C), fluorine (F), nitrogen (N), boron (B), and phosphorus (P).

Also, while the silicon nitride film SN3, which is an insulating film, is taken as an example of the liner film SN3 in the present embodiment, a silicon oxynitride film may be used alternatively. That is, any insulating film can be used as long as the insulating film functions as an etching stopper when the trench TR and the contact hole CNT, which will be described further below, are formed.

Figure 19:
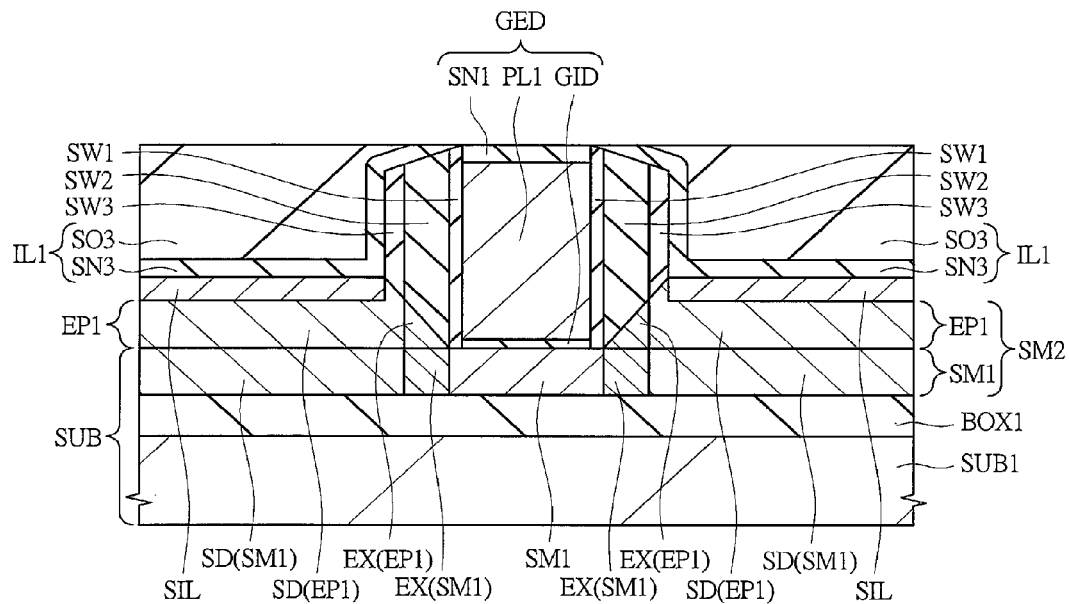
FIG. 19 is a cross-sectional view of main parts in the process of manufacturing the semiconductor device continued from FIG. 18.

Next, as depicted in FIG. 19, by polishing the surface (upper surface) of the insulating film IL1 with a CMP (Chemical Mechanical Polishing) technique or the like, the upper surface of the dummy gate GED (that is, the upper surface of the silicon nitride film SN1) is exposed (step S12 of FIG. 4). That is, the insulating film ELI is polished by the CMP technique until the upper surface of the silicon nitride film SN1 of the dummy gate GED is exposed. Step S12 is a process of removing part of the insulating film IL (at least a portion of the insulating film IL1 which covers the dummy gate GED) to expose the upper surface of the dummy gate GED.

Figure 20:
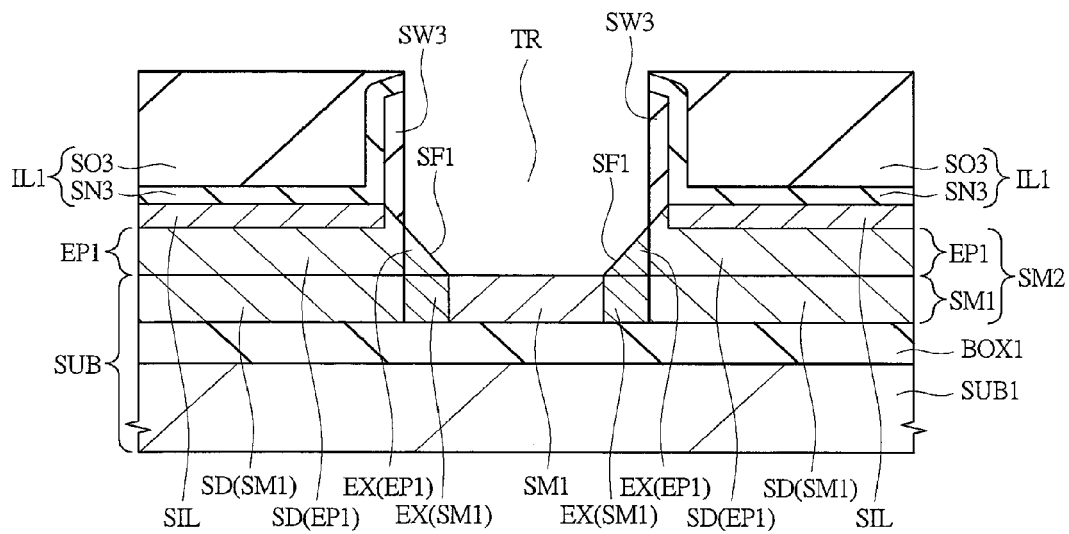
FIG. 20 is a cross-sectional view of main parts in the process of manufacturing the semiconductor device continued from FIG. 19.

Next, as depicted in FIG. 20, the dummy gate GED and the sidewall insulating films SW1 and SW2 are removed by etching (step S13 of FIG. 4).

By removing the dummy gate GED and the sidewall insulating films SW1 and SW2 at this step S13, the trench (recessed part, opening, or depressed part) TR is formed, as depicted in FIG. 20. The trench TR is formed of a region (space) where the dummy gate GED and the sidewall insulating films SW1 and SW2 used to be present before removal of the dummy gate GED and the sidewall insulating films SW1 and SW2. The upper surface of the semiconductor layer SM1, the tilted side surface SF1 of the semiconductor layer EP1, and the inner wall of the sidewall insulating film SW3 are exposed from the trench TR.

The bottom surface of the trench TR is formed of the upper surface of the semiconductor layer SM1 and the tilted side surface SF1 of the semiconductor layer EP1. The side surface (sidewall) of the trench IR is formed of the inner wall of the sidewall insulating film SW3. That is, a portion from the upper surface of the semiconductor layer SM1 exposed from the trench TR to the tilted side surface SF1 of the semiconductor layer EP1 can be regarded as the bottom surface of the trench TR. An upper part of the trench TR is open. Here, the inner wall of the sidewall insulating film SW3 corresponds to the side surface (sidewall) of the sidewall insulating film SW3 which used to be in contact with the sidewall insulating film SW2 until the sidewall insulating film SW2 is removed.

The etching process at step S13 is specifically described below.

Etching at step S13 is preferably performed by the following three stages (a first stage, a second stage, and a third stage, refer to FIG. 21 to FIG. 23) of etching.

Figure 21:
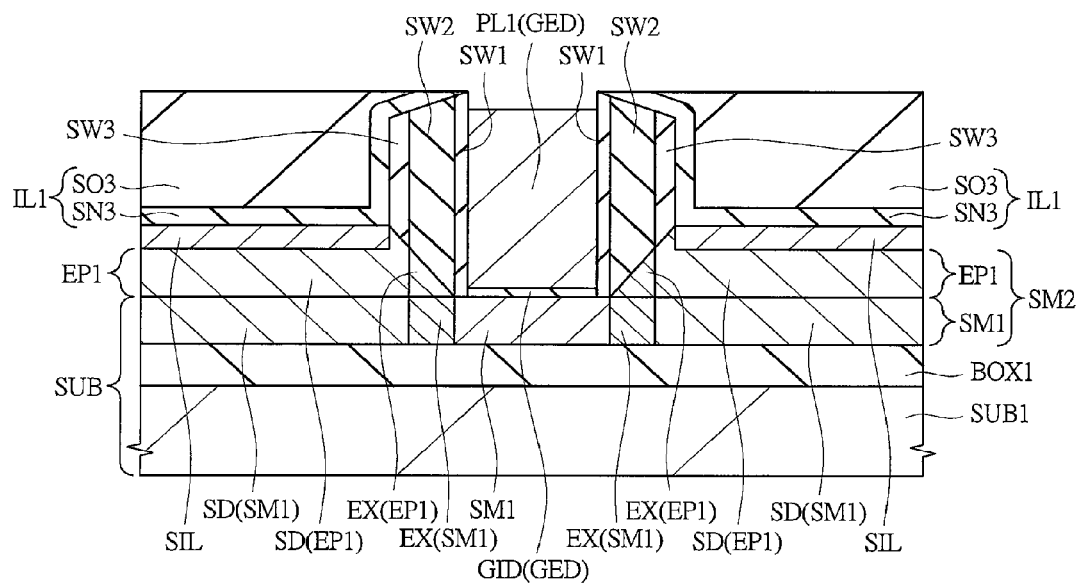
FIG. 21 is a cross-sectional view of main parts in the process of manufacturing the semiconductor device continued from FIG. 20.

That is, after the structure of FIG. 19 is obtained by CMP processing at step S12, the silicon nitride SN1 of the dummy gate GED is removed by the first stage of etching at step S13, as depicted in FIG. 21. In this first stage of etching, the silicon nitride film SN1 is preferably etched selectively with etching conditions in which the etching speed of the silicon nitride film SN1 is faster than the etching speed of the polysilicon film PL1. By the first stage of etching, the silicon nitride film SN1 is removed, and the polysilicon film PL1 is exposed.

Figure 22:
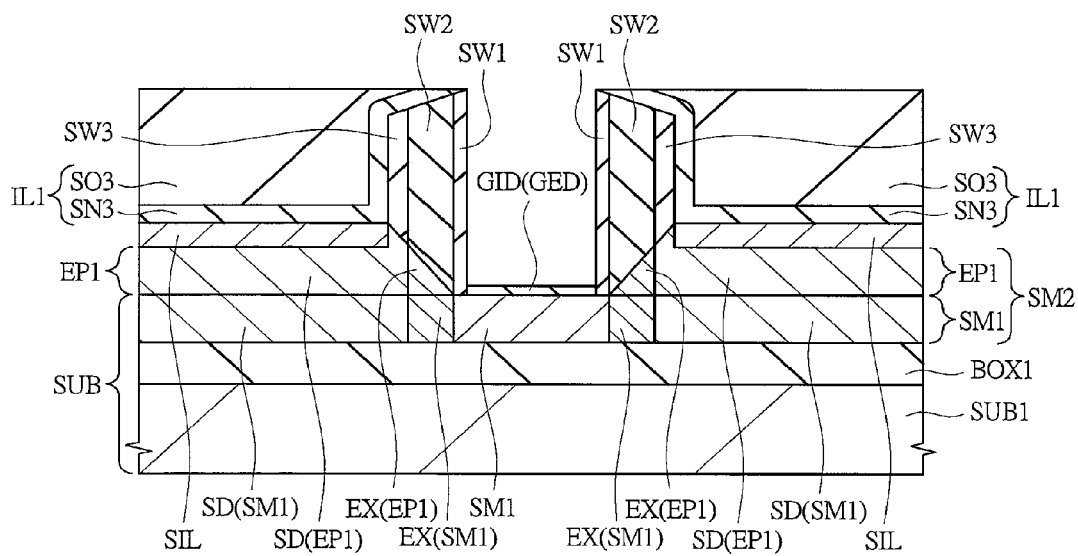
FIG. 22 is a cross-sectional view of main parts in the process of manufacturing the semiconductor device continued from FIG. 21.

After the silicon nitride film SN1 is removed in the first stage of etching, the etching conditions are changed, and the polysilicon film PL1 of the dummy gate GED is removed by the second stage of etching at step S13, as depicted in FIG. 22. In this second stage of etching, the polysilicon film PL1 is preferably etched with etching conditions in which the etching speed of the polysilicon film PL1 is faster than the etching speed of the sidewall insulating films SW1 and SW2 and the insulating film GID (specifically, the silicon oxide). By the second stage of etching, the polysilicon film PL1 is removed, and the sidewall insulating film SW1 and the insulating film GID are exposed. That is, in the second stage of etching, polysilicon film PL1 is etched, and the sidewall insulating film SW1 and the insulating film GID can function as an etching stopper. Here, since the sidewall insulating films SW1 and SW2 and the insulating film GID are formed of silicon oxide, it is easy to ensure a high etching selection ratio between the polysilicon film PL1 and the sidewall insulating films SW1 and SW2 and the insulating film GID. Also, since the insulating film GID is provided between the semiconductor layer SM1 and the polysilicon film PL1, it is possible to prevent the semiconductor layer SM1 from being etched when the polysilicon film PL1 is removed in the second stage of etching.

Figure 23:
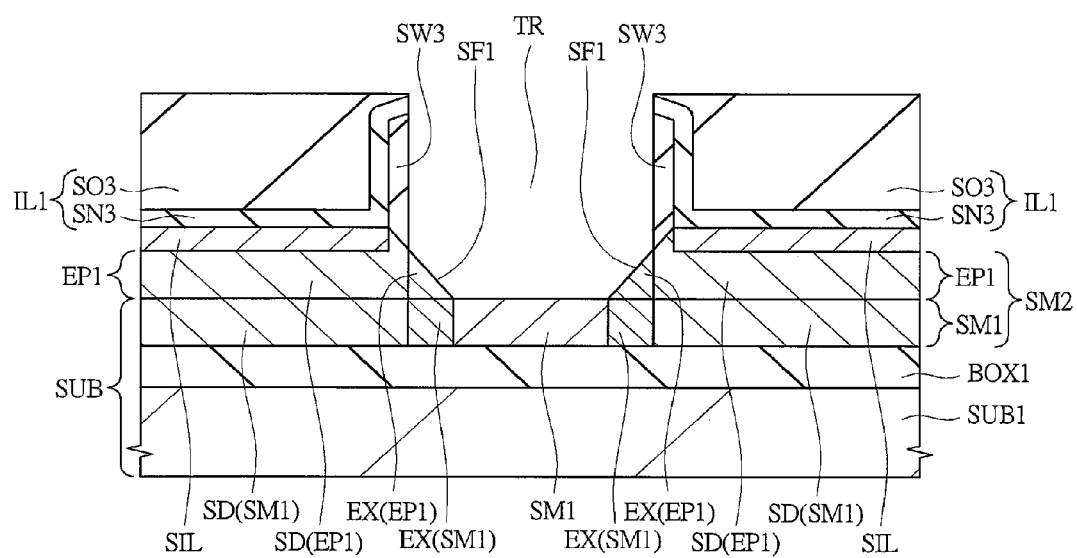
FIG. 23 is a cross-sectional view of main parts in the process of manufacturing the semiconductor device continued from FIG. 22.

After the polysilicon film PL1 is removed in the second stage of etching, the etching conditions are changed, and the sidewall insulating films SW1 and SW2 and the insulating film GID are removed by the third stage of etching at step S13, as depicted in FIG. 23. In this third stage of etching, the insulating films SW1 and SW2 and the insulating film GID are preferably etched selectively with etching conditions in which the etching speed of the insulating films SW1 and SW2 and the insulating film GID is faster than the etching speed of the semiconductor layers SM1 and EP1. With this, in the third stage of etching, the semiconductor layers SM1 and EP1 can be inhibited or prevented from being etched by the third stage of etching. If the sidewall insulating film SW1 and the sidewall insulating film SW2 are formed of the same material (here, silicon oxide), the sidewall insulating film SW1 and the sidewall insulating film SW2 can be continuously etched with the same etching processing. Also, if the insulating film GID and the sidewall insulating films SW1 and SW2 are formed of the same material (here, silicon oxide), the insulating film GID can be removed in the same etching processing for removing the sidewall insulating films SW1 and SW2.

Also in the third stage of etching, while the sidewall insulating films SW1 and SW2 are removed, the sidewall insulating film SW3 is preferably left. Thus, in the present embodiment, the sidewall insulating film SW3 is formed of a material different from that of the sidewall insulating films SW1 and SW2, and the third stage of etching is performed with etching conditions in which the etching speed of the sidewall insulating film SW1, SW2 (specifically, silicon oxide) is faster than the etching speed of the sidewall insulating film SW3 (specifically, silicon nitride) and the semiconductor layers SM1 and EP1. Here, since the sidewall insulating films SW1 and SW2 are formed of the silicon oxide films SO1 and SO2 and the sidewall insulating film SW3 is formed of the silicon nitride film SN2, it is easy to ensure a high etching selection ratio between the sidewall insulating films SW1 and SW2 and the sidewall insulating film SW3. That is, in the third stage of etching, the sidewall insulating films SW1 and SW2 can be etched, and the sidewall insulating film SW3 can function as an etching stopper. Also, since the sidewall insulating films SW1 and SW2 are formed of the silicon oxide films SO1 and SO2, it is also easy to ensure a high etching selection ratio between the sidewall insulating films SW1 and SW2 and the semiconductor layers SM1 and EP1.

Furthermore, when formation of the sidewall insulating film SW3 is omitted, if the sidewall insulating films SW1 and SW2 are removed in the third stage of etching, the insulating film IL1 (more specifically, the silicon nitride film SN3 of the insulating film IL1) is exposed. In this case, the silicon nitride film SN3 of the insulating film IL1 can function as an etching stopper. That is, the sidewall insulating film SW3 is not necessarily required to be formed. Note that a silicon oxynitride film may be used as the material of the liner film SN3 in place of the silicon nitride film.

Also, when the insulating film GID is formed of a material different from that of the sidewall insulating films SW1 and SW2, after the sidewall insulating films SW1 and SW2 are removed by etching, the insulating film GID can be selectively removed, with the etching conditions changed.

Furthermore, when the sidewall insulating films SW1 and SW2 are removed, part of the insulating film SO3 of the insulating film IL1 may be etched. This can be allowed because the thickness of the insulating film SO3 is thick and the silicon nitride film SN3 is present below the insulating film SO3.

By removing the dummy gate GED and the sidewall insulating films SW1 and SW2 with the above-described three stages (the first stage, the second stage, and the third stage) of etching, the trench TR is formed as depicted in FIG. 20 and FIG. 23.

Next, processes after step S13 are described.

Figure 24:
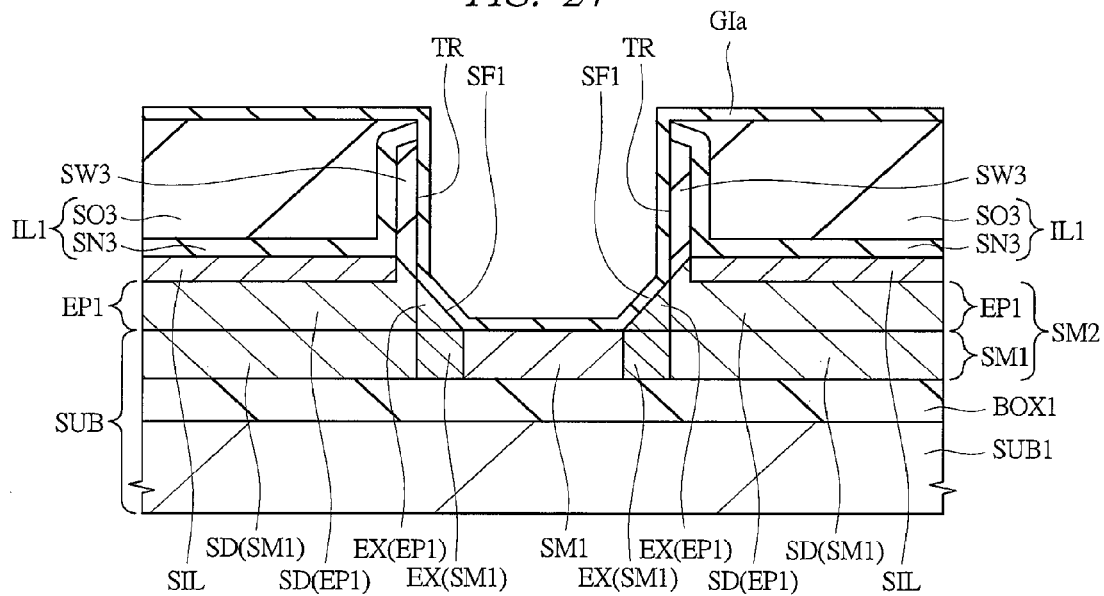
FIG. 24 is a cross-sectional view of main parts in the process of manufacturing the semiconductor device continued from FIG. 23.

After step S13, as depicted in FIG. 24, an insulating film GIa for the gate insulating film is formed on the main surface (entire surface of the main surface) of the SOI substrate SUB including the bottom surface and the side surface (sidewall) of the trench TR (step S14 of FIG. 4).

The insulating film GIa is formed by, for example, an ALD (Atomic Layer Deposition) technique or CVD technique. As the insulating film GIa, for example, a metal oxide film can be used, such as a hafnium oxide film, a zirconium oxide film, an aluminum oxide film, a tantalum oxide film, or a lanthanum oxide film. Still further, these metal oxide films can also contain either one or both of nitrogen (N) and silicon (Si). In this case, the gate insulating film GIa is a high-dielectric-constant film (so-called High-k film) with a dielectric constant (relative permittivity) higher than that of a silicon nitride film. Also, as the insulating film GIa, a silicon oxide or silicon oxynitride film can be used. However, when a high-dielectric-constant film is used for the gate insulating film GIa, the silicon-oxide-converted film thickness of the gate insulating film (GI) can be increased compared with the case of using a silicon oxide film having the same physical film thickness, and therefore a leak current can be advantageously reduced. Note that the physical film thickness of the insulating film GIa is on the order of 2 nm to 5 nm.

Also, when a high-dielectric-constant film is used as the insulating film GIa, prior to formation of the insulating film GIa, a silicon oxide film equal to or smaller than 1 nm may be formed as an interface layer. The physical film thickness of this interface layer is formed thinner than the physical film thickness of the above-described metal oxide film (high-dielectric-constant film). Note that the interface layer can be formed on the semiconductor layer SM1 by a thermal oxidation method.

The insulating film GIa is required to be formed at least on a portion of the semiconductor layers SM1 and EP1 exposed from the trench TR. In practice, the insulating film GIa is formed not only on the portion of the semiconductor layers SM1 and EP1 exposed from the trench TR but also on the inner wall of the sidewall insulating film SW3 exposed from the trench TR and on the insulating film IL1. That is, the insulating film GIa is formed on the insulating film IL1 including the bottom part and the sidewall of the trench TR.

Figure 25:
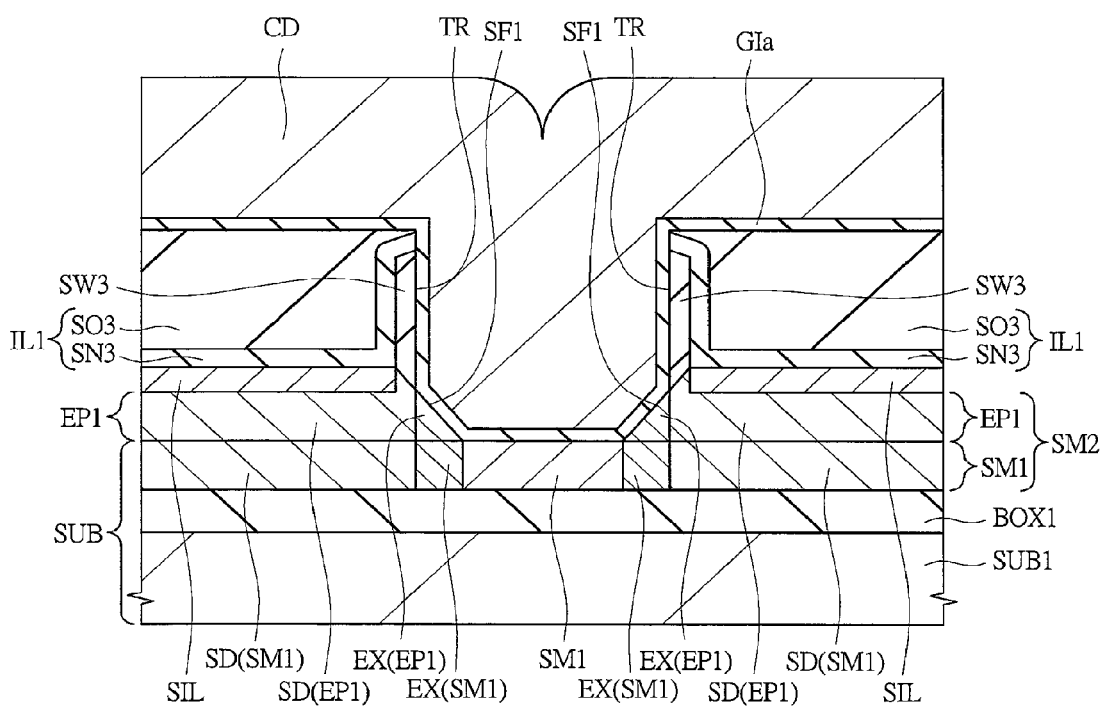
FIG. 25 is a cross-sectional view of main parts in the process of manufacturing the semiconductor device continued from FIG. 24.

Next, as depicted in FIG. 25, a gate-electrode conductive film (conductive material film) CD is faulted on the main surface of the SOI substrate SUB, that is, on the insulating film GIa (step S15 of FIG. 4). This conductive film CD is formed on the insulating film GIa so as to fill the trench TR.

As the conductive film CD, for example, a metal film can be used, such as a titanium nitride (TiN) film, a tantalum nitride (TaN) film, a tungsten nitride (WN) film, a titanium carbide (TiC) film, a tantalum carbide (TaC) film, a tungsten carbide (WC) film, or a tantalum nitride-carbide (TaCN) film. Note that the metal film herein refers to a conductive film assuming metallic conduction and includes not only a simple metal film (pure metal film) and an alloy film but also a metal compound film assuming metallic conduction (such as a metal nitride film and metal carbide film). In the case of a metal film, the conductive film CD can be formed by, for example, a sputtering technique or the like. When a metal film is used as the conductive film CD, the gate electrode GE to be formed later can be a metal gate electrode, and therefore a depletion phenomenon of the gate electrode GE can be inhibited, and the parasitic capacitance can be advantageously eliminated. Also, the size of the MISFET element can also be advantageously decreased (the gate insulating film can be made thinner).

Also, as a modification example of the metal gate electrode, a lamination-type gate electrode formed of the above-described metal film and the polysilicon film (doped polysilicon film) can be used. In this case, the lamination-type gate electrode is obtained by first forming the above-described metal film in the trench TR and then forming a polysilicon film so as to fill the trench TR. In this case, the conductive film CD is configured of a laminated film of the above-described metal film and a polysilicon film (doped polysilicon film).

Furthermore, as another modification example of the metal gate electrode, different metal films may be laminated. In this case, for example, the lamination-type gate electrode can be obtained by, for example, forming a first metal film in the trench TR and then forming a second metal film so as to fill the trench TR. In this case, the conductive film CD is configured of a laminated film of the first metal film and the second metal film thereon. Here, the metals (metal films) to be laminated are not restricted to two layers, but may be a plurality of layers, that is, two or more layers.

Figure 26:
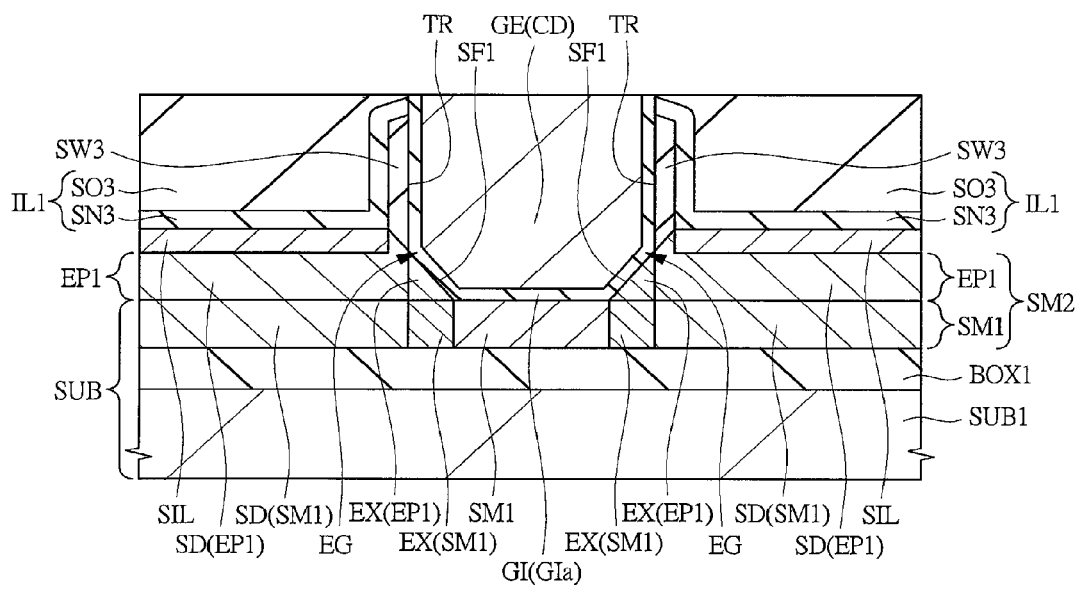
FIG. 26 is a cross-sectional view of main parts in the process of manufacturing the semiconductor device continued from FIG. 25.

Next, as depicted in FIG. 26, the gate electrode GE is formed by leaving the conductive film CD in the trench TR and removing a portion of the conductive film CD outside the trench TR by a CMP technique or the like (step S16 of FIG. 4). The gate electrode GE is formed of the conductive film CD left in the trench TR.

At step S16, when the conductive film CD outside the trench TR is removed by a CMP technique, the insulating film GIa outside the trench TR is also removed. That is, the conductive film CD and the insulating film GIa are polished until the upper surface of (the insulating film SO3 of) the insulating film IL1 is exposed, thereby removing the conductive film CD and the insulating film GIa outside the trench TR and leaving the conductive film CD and the insulating film GIa in the trench TR. With this, the conductive film CD and the insulating film GIa are left in the trench TR, and the conductive film CD left in the trench TR serves as the gate electrode GE, and the insulating film GIa left in the trench TR serves as the gate insulating film GI. That is, steps S14 to S16 represent a process of forming the gate electrode GE in the trench TR via the gate insulating film GI.

The gate insulating film GI (insulating film GIa) is interposed between the gate electrode GE and (the upper surface of) the semiconductor layer SM1, between the gate electrode GE and (the tilted side surface SF1 of) the semiconductor layer EP1, and between the gate electrode GE and (the inner wall of) the sidewall insulating film SW3. The gate electrode GE and the gate insulating film GI function as a gate electrode and a gate insulating film, respectively, of the MISFET. That is, the gate electrode GE is formed on the semiconductor layer SM2 via the gate insulating film GI.

A channel region of the MISFET is formed in the semiconductor layer SM1 positioned below the gate electrode GE via the gate insulating film GI (insulating film GIa). Also, a semiconductor region (impurity diffusion layer) which functions as a source or drain of the MISFET is formed of the $n^-$-type semiconductor region EX and the $n^+$-type semiconductor region SD with an impurity concentration higher than that of the former region, both regions provided in the semiconductor layer SM2 (SM1, EP1), and has an LDD (Lightly Doped Drain) structure.

Note that the length of an upper part of the gate electrode GE in the gate length direction is on the order of 48 nm and the length of a lower part (the length of a channel region) of the gate electrode GE therein is on the order of 28 nm. That is, the minimum length of the gate electrode GE in the gate length direction is used as a substantial channel region.

In this manner, an n-channel-type MISFET is formed.

In the present embodiment, the sidewall insulating film SW2 formed on the sidewall of the dummy gate GED and positioned on the semiconductor layer EP1 is removed at step S13 together with the dummy gate GED, and the gate electrode GE is formed in that removed region (trench TR). Thus, the gate electrode GE can be formed not only in the region where the dummy gate GED used to be present but also in the region where the sidewall insulating film SW2 used to be present. Thus, the dimension of the gate electrode GE in the gate length direction can be made longer than the dimension of the dummy gate GED, and part of the gate electrode GE (on both end sides in the gate length direction) are positioned on the semiconductor layer EP1, that is, ride onto the semiconductor layer EP1. Therefore, the end parts of the gate electrode GE in the gate length direction are positioned on the semiconductor layer EP1. And, at least part of the $n^-$-type semiconductor region EX is positioned straight below the gate electrode GE.

Figure 27:
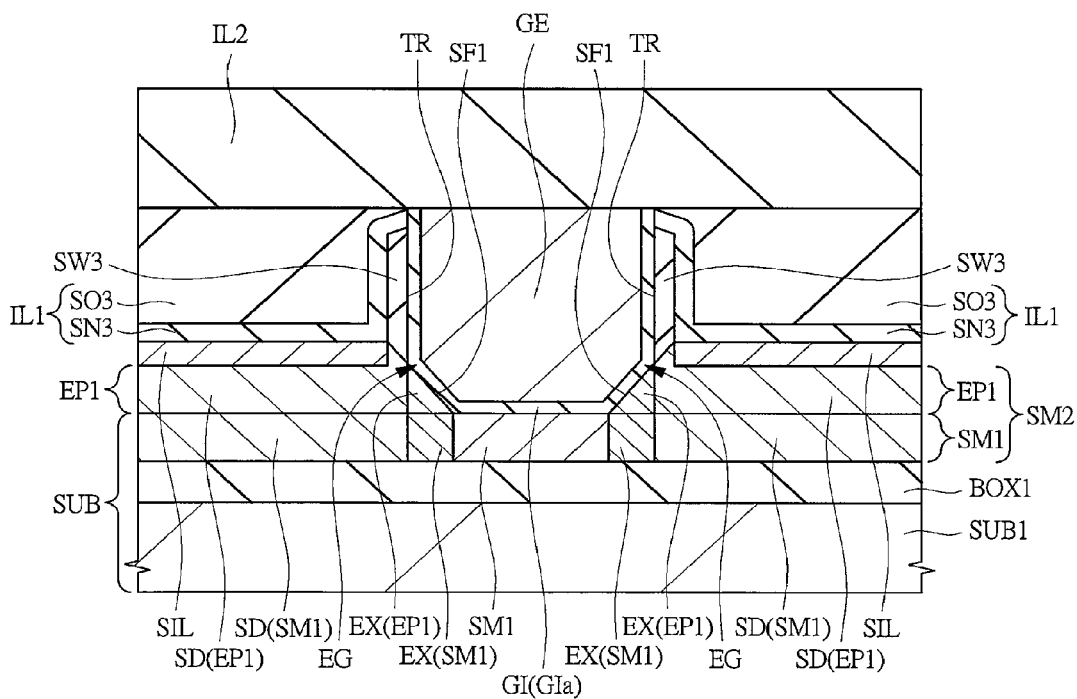
FIG. 27 is a cross-sectional view of main parts in the process of manufacturing the semiconductor device continued from FIG. 26.

Next, as depicted in FIG. 27, the insulating film (interlayer insulating film) IL2 is formed on the entire surface of the main surface of the SOI substrate SUB, that is, on the insulating film IL1 in which the gate electrode GE is buried. As the insulating film SO3, a silicon-oxide-based insulating film can be used. The insulating film IL2 is formed on the insulating film IL1 so as to cover the upper surface of the gate electrode GE.

After the insulating film IL2 is formed, for example, by polishing the surface (upper surface) of the insulating film IL2 by a CMP technique, flatness of the upper surface of the insulating film IL2 can be increased.

Figure 28:
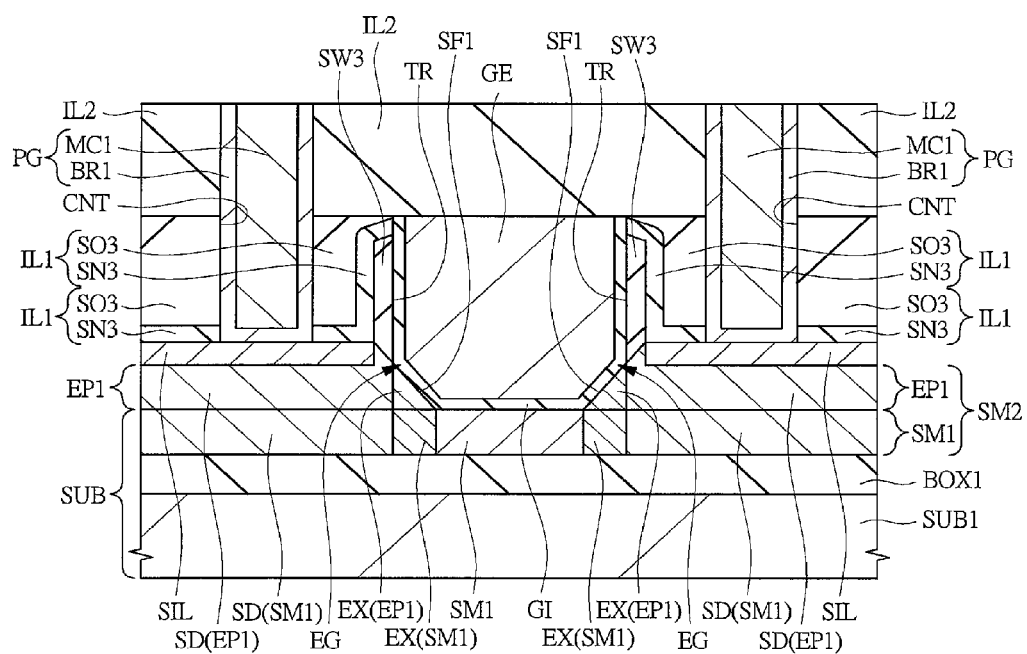
FIG. 28 is a cross-sectional view of main parts in the process of manufacturing the semiconductor device continued from FIG. 27.

Next, as depicted in FIG. 28, the insulating film IL2 and the insulating film IL1 are subjected to dry etching by using a photoresist pattern (not depicted) formed on the insulating film IL2 as an etching mask, thereby forming the contact hole (through hole or hole) CNT in the insulating films 111 and IL2. The contact hole CNT is formed so as to penetrate through the laminated film (laminated insulating film) formed of the insulating film IL1 and the insulating film IL2.

To form the contact hole CNT, first, the insulating film IL2 and the insulating film SO3 are subjected to dry etching with conditions in which the insulating film SO3 and the insulating film IL2 are easily etched compared with those for the silicon nitride film SN3, and with the silicon nitride film SN3 functioning as an etching stopper film, the contact hole CNT is formed in the insulating film IL2 and the insulating film SO3. Then, the silicon nitride film SN3 on the bottom of the contact hole CNT is subjected to dry etching with conditions in which the silicon nitride film SN3 is easily etched compared with those for the insulating film IL2 and the insulating film SO3 and is removed, thereby forming the contact hole CNT as a through hole.

The contact hole CNT is formed in, for example, an upper part of the $n^+$-type semiconductor region SD or an upper part of the gate electrode GE. At the bottom of the contact hole CNT formed in the upper part of the $n^+$-type semiconductor region SD, the metal silicide layer SIL on the $n^+$-type semiconductor region SD is exposed. With the silicon nitride film SN3 functioning as an etching stopper film at the time of formation of the contact hole CNT, excessive digging of the contact hole CNT and damage on the semiconductor layer SM2 can be inhibited or prevented.

Next, the conductive plug PG made of tungsten (W) or the like is formed (buried) in the contact hole CNT as a connection conductive body. The plug PG can be formed as follows.

That is, first, a barrier conductive film BR1 (for example, a titanium film, a titanium nitride film, or a laminated film thereof) is formed on the insulating film IL2 including the inside (bottom and sidewall) of the contact hole CNT by a sputtering technique, plasma CVD technique, or the like. Then, a main conductive film MC1 made of a tungsten film or the like is formed on the barrier conductive film BR1 by a CVD technique or the like so as to fill the contact hole CNT. Then, unwanted portions of the main conductive film MC1 and the barrier conductive film BR1 outside the contact hole CNT (on the insulating film IL2) are removed by a CMP technique, etching-back method, or the like. With this, the upper surface of the insulating film IL2 is exposed, and the barrier conductive film BR1 and the main conductive film MC1 buried and left in the contact hole CNT of the insulating films 111 and IL2 form the plug PG. The plug PG formed on the upper part of the $n^+$-type semiconductor region SD is in contact, at the bottom, with the metal silicide layer SIL on the surface of the $n^+$-type semiconductor region SD to be electrically connected thereto. Although not depicted, when the plug PG is formed on an upper part of the gate electrode GE, that plug PG is in contact, at the bottom of the plug PG, with the gate electrode GE to be electrically connected thereto.

Figure 29:
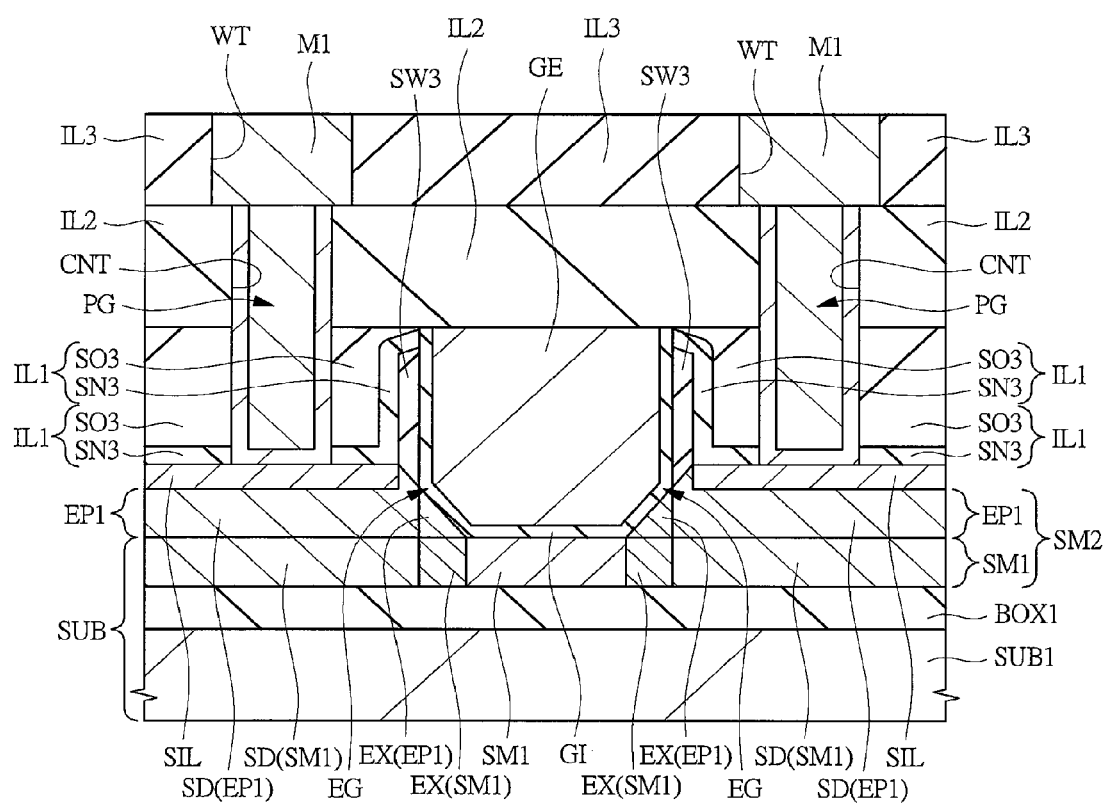
FIG. 29 is a cross-sectional view of main parts in the process of manufacturing the semiconductor device continued from FIG. 28.

Next, as depicted in FIG. 29, the insulating film IL3 for wiring formation is formed on the insulating film IL2 in which the plug PG is buried. The insulating film IL3 can be a single film (single insulating film) or laminated film (laminated insulating film).

Next, a wiring of the first layer is formed by a single damascene technique. First, by dry etching with a photoresist pattern (not depicted) as a mask, a wiring trench WT is formed in a predetermined region of the insulating film IL3, and then a barrier conductive film (barrier metal film) is formed on the main surface of the SOI substrate SUB (that is, on the insulating film IL3 including the bottom and the sidewall of the wiring trench WT). As the barrier conductive film, for example, a titanium nitride film, a tantalum film, or a tantalum nitride film, can be used. Next, a copper seed layer is formed on the barrier conductive film by a CVD technique, sputtering technique, or the like and a copper plating film (main conductive film) is formed on the seed layer by using an electrolytic plating technique or the like. With the copper plating film, the inside of the wiring trench WT is filled. Then, the copper plating film, the seed layer, and the barrier metal film in regions other than the wiring trench WT are removed by a CMP technique, and a wiring M1 of the first layer is formed with copper as a main conductive material. Note that, for simplification of the drawings, the copper plating film, the seed layer, the barrier metal film configuring the wiring M1 are integrally depicted in FIG. 29. The wiring M1 is connected to the plug PG, and is electrically connected via the plug PG to the $n^+$-type semiconductor region SD, the gate electrode GE, or the like.

Then, wirings of the second layer onward are formed by a dual damascene technique, drawings and description of which are omitted herein. Also, the wiring M1 and the wirings of the second layer onward are not restricted to damascene wirings, and can be formed by patterning a wiring conductive film. For example, tungsten wirings, aluminum wirings, or the like are possible.

Also in the present embodiment, the case has been described in which an n-channel-type MISFET is formed as a MISFE. However, the conduction type can be reversed to form a p-channel-type MISFET. Furthermore, both of an n-channel-type MISFET and a p-channel-type MISFET can be formed on the same SOI substrate SUB. The same goes for the following second to fourth embodiments.

<Regarding Study Examples>

When a semiconductor device is manufactured by using a SOI substrate, a source/drain silicon layer is epitaxially grown on the semiconductor layer of the SOI substrate. With this, for example, resistance can be reduced while the depth of the source/drain diffusion layer is made shallow. Also, a silicon film thickness suitable for forming a metal silicide layer in a Salicide process can be ensured. Such a semiconductor device has been studied.

Figure 30:
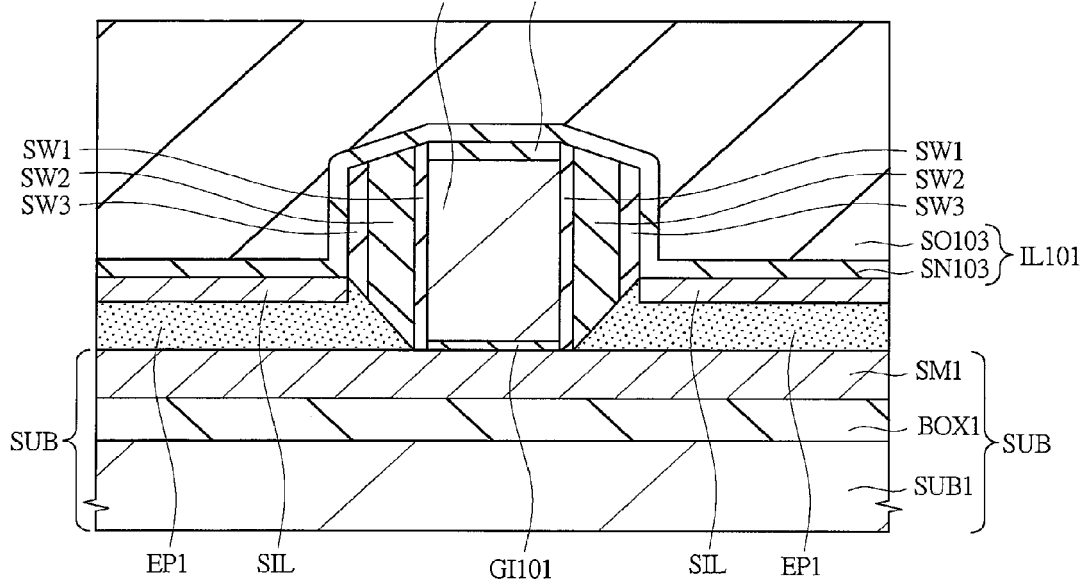
FIG. 30 is a cross-sectional view of main parts of a semiconductor device of a first study example.
Figure 31:
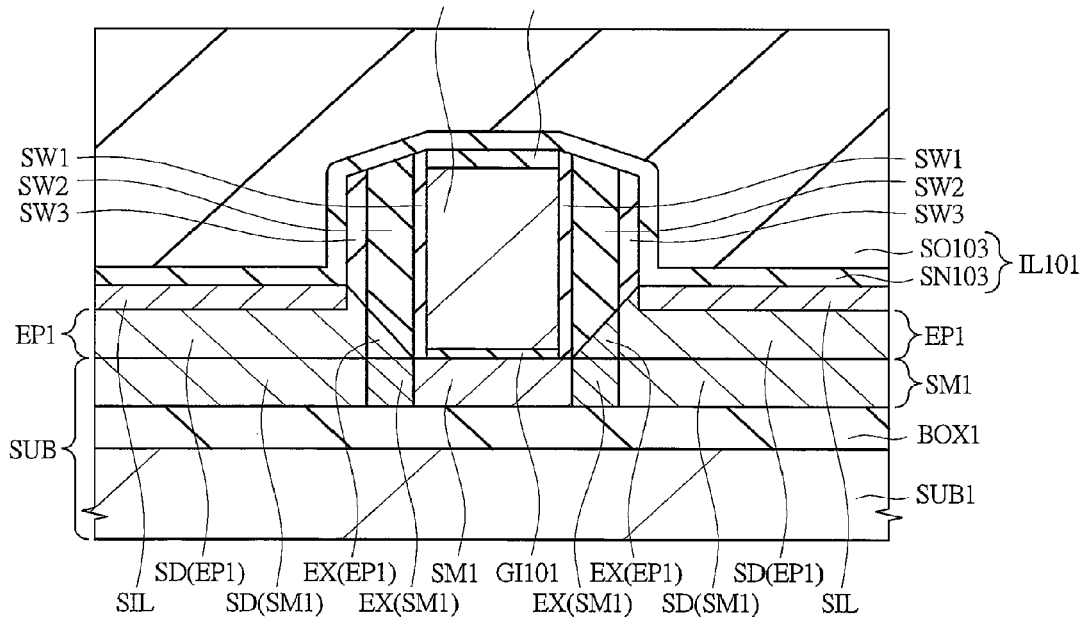
FIG. 31 is a cross-sectional view of main parts of the semiconductor device of the first study example.

FIG. 30 and FIG. 31 are cross-sectional views of main parts of a semiconductor device of a first study example. FIG. 30 corresponds to the above-described FIG. 1 of the present embodiment, and FIG. 31 corresponds to the above-described FIG. 2 of the present embodiment.

For the semiconductor device of the first study example depicted in FIG. 30 and FIG. 31, processes similar to those in the present embodiment are preformed up to the above-described step S10 (metal silicide layer SIL forming process), but processes thereafter are different. That is, to manufacture the semiconductor device of the first study example, after the processes up to step S10 (metal silicide layer SIL forming process) are performed to obtain the structure of the above-described FIG. 17, an interlayer insulating film IL101 made of a laminated film of a silicon nitride film SN103 corresponding to the above-described silicon nitride film SN3 and a silicon oxide film SO103 corresponding to the above-described insulating film SO3 is formed on the main surface (entire surface of the main surface) of the SOI substrate SUB. Then, the upper surface of the interlayer insulating film IL101 is planarized by a CMP technique. At that time, unlike the present embodiment, the above-described dummy gate GED is not exposed. Then, a contact hole (not depicted) corresponding to the above-described contact hole CNT is formed in the interlayer insulating film IL101 without performing the above-described steps S13 to S16. In that contact hole, a plug (not depicted) corresponding to the above-described plug PG is formed and, furthermore, those (not depicted) corresponding to the above-described insulating film IL3 and the above-described wiring M1 are formed.

Thus, in the semiconductor device of the first study example depicted in FIG. 30 and FIG. 31, the above-described insulating film GID, the above-described polysilicon film PL1, and the above-described silicon nitride film SN1 are left unremoved, and serve as a gate insulating film GI101, a gate electrode GE101, and a silicon nitride film SN101, respectively. That is, a laminated structure of the gate insulating film GI101, the gate electrode GE101, and the silicon nitride film SN101 is formed at the above-described step S2, and is left as it is in the semiconductor device after manufacture, which corresponds to the semiconductor device of the first study example.

Figure 32:
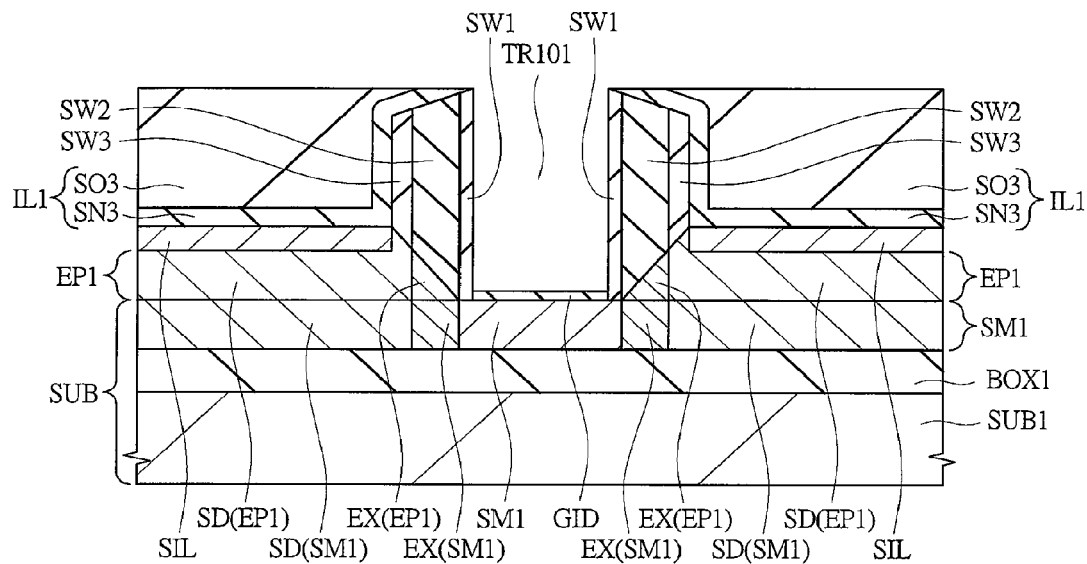
FIG. 32 is a cross-sectional view of main parts in a process of manufacturing a semiconductor device of a second study example.
Figure 33:
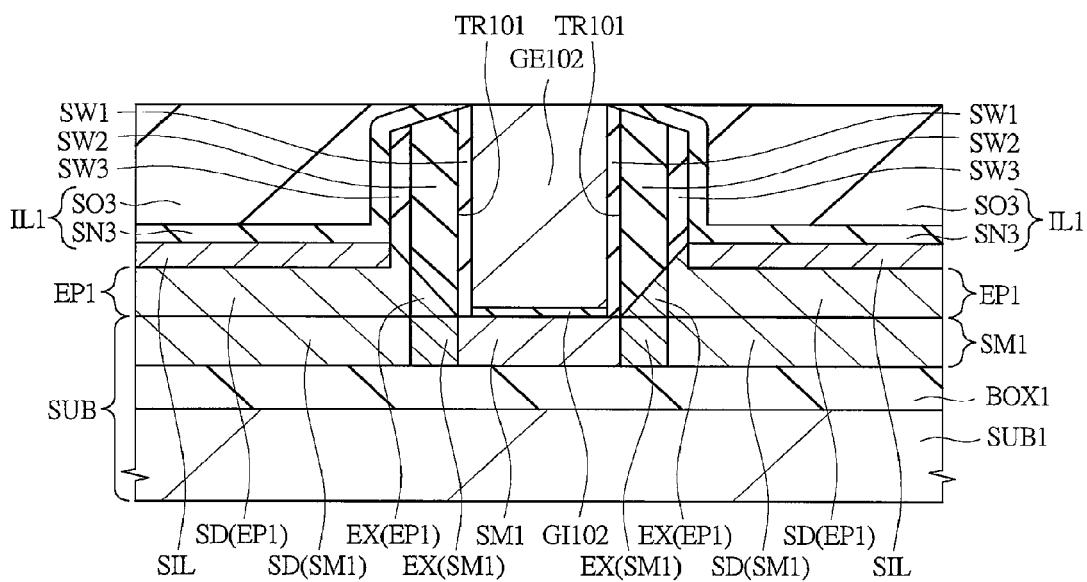
FIG. 33 is a cross-sectional view of main parts in the process of manufacturing the semiconductor device of the second study example continued from FIG. 32.
Figure 34:
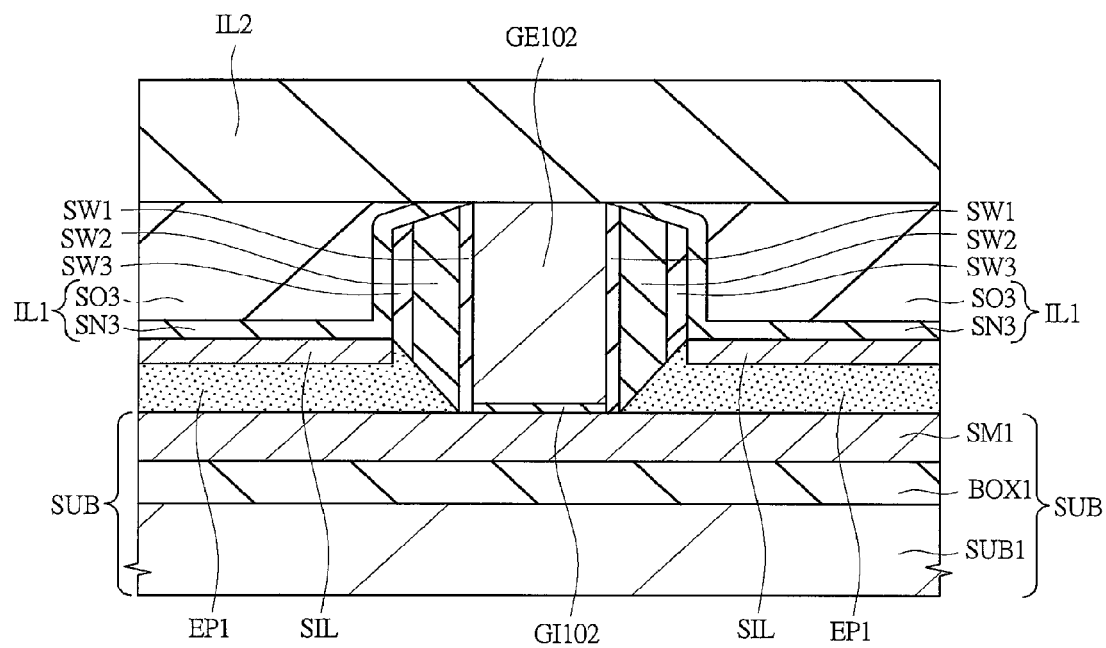
FIG. 34 is a cross-sectional view of main parts of the semiconductor device of the second study example.
Figure 35:
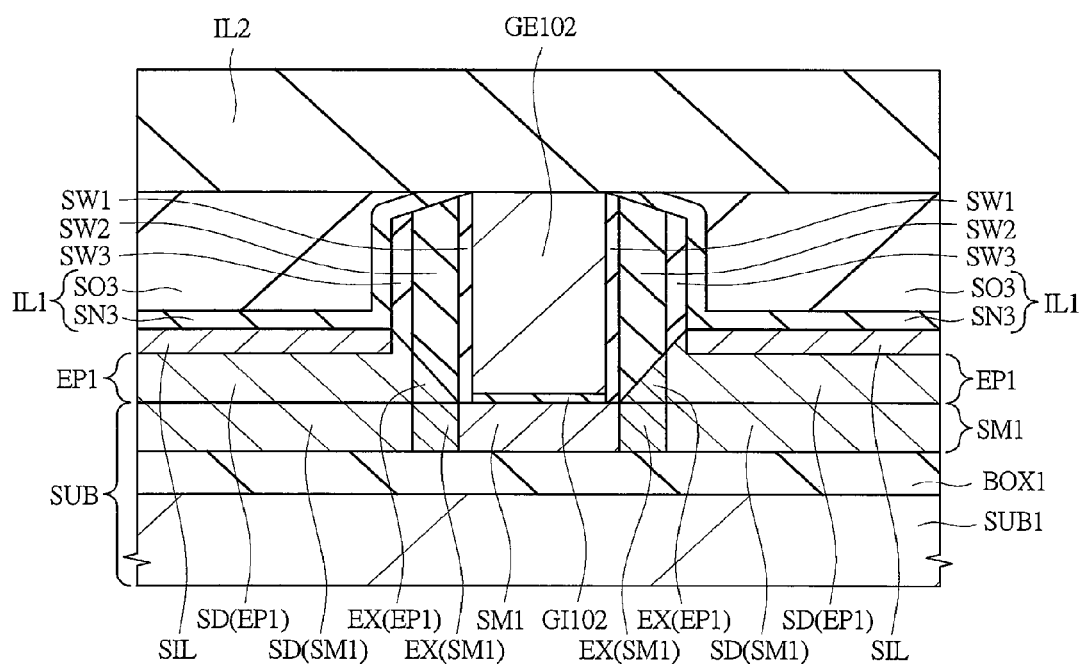
FIG. 35 is a cross-sectional view of main parts of the semiconductor device of the second study example.

FIG. 32 and FIG. 33 are cross-sectional views of main parts in a process of manufacturing a semiconductor device of a second study example. FIG. 34 and FIG. 35 are cross-sectional views of main parts of the semiconductor device of the second study example. FIG. 34 corresponds to the above-described FIG. 1 of the present embodiment, and FIG. 35 corresponds to the above-described FIG. 2 of the present embodiment.

To manufacture the semiconductor device of the second study example, processes similar to those of the present embodiment are performed up to the above-described step S12 (CMP process on the insulating film IL1), but processes thereafter are different. That is, to manufacture the semiconductor device of the second study example, after the processes up to step S12 (CMP process on the insulating film IL1) are performed to obtain the structure of the above-described FIG. 19, the silicon nitride film SN1 and the polysilicon film PL1 of the above-described dummy gate GED are removed by etching, but the insulating film GID and the sidewall insulating films SW1, SW2, and SW3 are left unremoved, as depicted in FIG. 32. Then, after a conductive film is formed on the insulating film IL1 so as to fill a trench TR101 formed by removing the nitride film SN1 and the polysilicon film PL1, a portion of the conductive film outside the trench TR101 is removed by a CMP technique, thereby forming a gate electrode GE102 in the trench TR101. The insulating film GID left below the gate electrode GE102 serves as a gate insulating film GI102. Thereafter, as with the present embodiment, the above-described insulating film IL2 is formed, the above-described contact hole CNT is formed, the above-described plug PG is formed, the above-described insulating film IL3 is formed, and the above-described wiring M1 is formed, although not depicted herein.

In the semiconductor device of the first study example depicted in FIG. 30 and FIG. 31, since the semiconductor layer EP1 is formed, which is an epitaxial layer, after the gate electrode GI01 is formed. Therefore, end parts (both ends in the gate length direction) of the gate electrode GE101 do not ride onto the semiconductor layer EP1, which is a source/drain epitaxial layer.

Also, in the semiconductor device of the second study example depicted in FIG. 34 and FIG. 35, the silicon nitride film SN1 and the polysilicon film PL1 of the dummy gate GED are removed by etching and the gate electrode GE102 is formed there. However, since the sidewall insulating films SW1, SW2, and SW3 (in particular, the sidewall insulating film SW2) is left in the semiconductor device of the second study example, end parts (both ends in the gate length direction) of the gate electrode GE102 do not ride onto the semiconductor layer EP1, which is a source/drain epitaxial layer.

As the semiconductor device of the first study example depicted in FIG. 30 and FIG. 31 and the semiconductor device of the second study example depicted in FIG. 34 and FIG. 35, the structure in which the end parts (both ends in the gate length direction) of the gate electrode GE102 do not ride onto the semiconductor layer EP1 has the following problems.

As a first problem, in the semiconductor device having a MISFET, if the source or drain semiconductor region has a parasitic resistance between that region and the channel region, degradation in characteristics (electrical characteristics) may be invited. For example, if the parasitic resistance between the source or drain semiconductor region and the channel region is large, on-resistance increases to decrease on-current, and therefore the electrical characteristics of the MISFET are degraded. Also, with fluctuations of the value of parasitic resistance between the source or drain semiconductor region and the channel region, fluctuations in characteristics for each MISFET may increase. "Parasitic resistance" hereinafter refers to parasitic resistance between the source or drain semiconductor region and the channel region. Note that the source or drain semiconductor region corresponds to a combination of the $n^-$-type semiconductor region EX and the $n^+$-type semiconductor region SD.

To inhibit parasitic resistance between the source or drain semiconductor region and the channel region, it is effective to make the end parts (both ends in the gate length direction) of the gate electrode overlap with the source or drain semiconductor region.

However, in the semiconductor device of the first study example depicted in FIG. 30 and FIG. 31 and the semiconductor device of the second study example depicted in FIG. 34 and FIG. 35, the end parts (both ends in the gate length direction) of the gate electrodes GE101 and GE102 do not ride onto the semiconductor layer EP1, which is a source/drain epitaxial layer. Therefore, it is difficult to make the gate electrodes GE101 and GE102 overlap with the source or drain semiconductor region, and parasitic resistance tends to increase.

Also, even when it is considered that the source/drain semiconductor region is simply diffused below the gate electrodes GE101 and GE102, the gate length is already considerably short due to microfabrication. Therefore, if the source or drain semiconductor region is diffused too much, punchthrough tends to occur.

Furthermore, in the second study example, when the insulating film GIa as depicted in FIG. 24 of the present application is formed as the gate insulating film in the trench TR101, the thickness of the gate insulating film GI (GIa) is also added, and therefore it is more difficult to make the gate electrode GE101 overlap with the source or drain semiconductor region.

Furthermore, as a second problem, in the case of using a SOI substrate, even when the end parts (both ends in the gate length direction) of the gate electrode overlap with the source or drain semiconductor region, parasitic resistance is large if the thickness of the semiconductor layer at that overlapping portion is thin.

In the semiconductor device of the first study example and the semiconductor device of the second study example, it is assumed that the source or drain semiconductor region is diffused below the gate electrodes GE101 and GE102 and overlapping of the gate electrodes GE101 and GE102 with the source or drain semiconductor region is completed. However, even in this case, the gate electrodes GE101 and GE102 do not ride onto the semiconductor layer EP1, and therefore the thickness of the semiconductor layer in the overlapping portion is equal to the thickness of the semiconductor layer SM1. Thus, there is a limit to inhibit parasitic resistance. The thickness of the semiconductor layer of the SOI substrate (semiconductor layer corresponding to the semiconductor layer SM1) is thin. Thus, when the SOI substrate is used, compared with the case of using a semiconductor substrate in a bulk state, it is difficult to make the thickness of the semiconductor layer at the overlapping portion between the source or drain semiconductor region and the gate electrode, and parasitic resistance tends to increase.

Thus, in the semiconductor device of the first study example and the semiconductor device of the second study example, parasitic resistance between the source or drain semiconductor region and the channel region is large, thereby possibly inviting degradation in electrical characteristics.

Note that overlapping of the gate electrodes with the source or drain semiconductor region corresponds to superposition of the gate electrodes on part of the source or drain semiconductor region in a thickness direction (direction substantially perpendicular to the main surface of the substrate). In this case, part of the source or drain semiconductor region is positioned straight below the gate electrodes.

Still further, as a third problem, when the insulating film GIa as depicted in FIG. 24 of the present application is formed as the gate insulating film in the trench TR101 in the second study example, the bottom surface and the side surface of the trench TR101 are approximately perpendicular to each other. Thus, if the insulating film GIa is formed by a CVD technique or ALD technique, the film thickness of the insulating film GIa tends to be thin at a corner of the trench TR101. In that case, since the film thickness of the insulating film GIa is thin at the end parts of the gate electrode GE102, electric field concentration tends to occur, leading to a decrease in withstand voltage of the MISFET.

Still further, as a fourth problem, when the gate length of the gate electrode GE102 is shortened due to microfabrication, it is difficult to completely bury the gate electrode GE102 in the trench TR101 in the second study example. That is, when the diameter of the trench TR101 is decreased, the aspect ratio naturally becomes strict (increased). Therefore, the conductive film serving as the gate electrode GE102 is not completely buried in the trench TR101, and vacancy may occur. Thus, reliability of the MISFET is degraded. In particular, when the insulating film GIa as the gate insulating film in the trench TR101 is formed by a CVD technique or ALD technique, the insulating film GIa is formed also in the side surface of the trench TR101. By that film thickness, the diameter of the trench TR101 is decreased. Therefore, burying the gate electrode GE102 becomes stricter.

The present embodiment and other embodiments were devised based on the plurality of problems as described above. That is, the above-described first and second problems are to improve performance of a semiconductor device. Also, the above-described third and fourth problems are to improve reliability of a semiconductor device.

<Regarding Main Features of Present Embodiment>

For the above-described plurality of problems, in the present embodiment, the end parts (both ends in the gate length direction) of the gate electrode GE ride onto the semiconductor layer EP1, which is a source/drain epitaxial layer. That is, the end parts of the gate electrode GE in the gate length direction are positioned on the semiconductor layer EP1, which is a source/drain epitaxial layer. In other words, in the gate length direction of the MISFET (MISFET with the gate electrode GE as a gate electrode), the end parts of the gate electrode GE are positioned on the semiconductor layer EP1, which is a source/drain epitaxial layer. Note that the end parts of the gate electrode in the gate length direction (that is, the end parts of the gate electrode GE in the gate length direction) are provided with a character EG in FIG. 1 and denoted as the end parts EG.

Thus, the gate electrode GE can be reliably made overlap with the source or drain semiconductor region (combination of the n⁻-type semiconductor region EX and the n⁺-type semiconductor region SD). With this overlapping, parasitic resistance between the source or drain semiconductor region and the channel region can be inhibited. That is, since at least part of the n⁻-type semiconductor region EX is positioned straight below the gate electrode GE, parasitic resistance can be inhibited. Therefore, the above-described first problem can be solved.

Also, the semiconductor layer EP1 is formed on the upper surface of the semiconductor layer SM1, and the upper surface of the semiconductor layer EP1 is positioned higher than the upper surface of the semiconductor layer SM1 straight below the gate electrode GE. And, the end parts of the gate electrode GE in the gate length direction are positioned on the semiconductor layer EP1, which is a source/drain epitaxial layer. As described above, the upper surface of the semiconductor layer SM1 straight below the gate electrode GE corresponds to the surface (upper surface) of a portion of the semiconductor layer SM1 in contact with the gate insulating film GI below the gate electrode GE.

Thus, in the present embodiment, the thickness of the semiconductor layer (SM2) at the overlapping portion between the source or drain semiconductor region (combination of the n⁻-type semiconductor region EX and the n⁺-type semiconductor region SD) and the gate electrode GE can be made further thicker than the thickness of the semiconductor layer SM1 by the thickness of the semiconductor layer EP1 at that overlapping portion. Therefore, in the present embodiment, the thickness of the semiconductor layer (SM2) at the overlapping portion between the source or drain semiconductor region and the gate electrode GE can be made thicker, and parasitic resistance can be inhibited. Therefore, the above-described second problem can be solved.

Thus, since parasitic resistance between the source or drain semiconductor region and the channel region can be inhibited in the present embodiment, the characteristics (electrical characteristics) of the semiconductor device including a MISFET can be improved. For example, by inhibiting parasitic resistance between the source or drain semiconductor region and the channel region, on-resistance can be decreased to increase on-current. Therefore, the electrical characteristics of the MISFET can be improved. Also, since parasitic resistance between the source or drain semiconductor region and the channel region can be inhibited, fluctuations in characteristics for each MISFET due to fluctuations of the value of parasitic resistance can also be inhibited. Thus, the performance of the semiconductor device can be improved.

Also, when a SOI substrate is used, the gate electrode is formed on a thin semiconductor layer of the SOI substrate. Therefore, compared with the case of using a semiconductor substrate in a bulk state, it is difficult to increase the thickness of the semiconductor layer at the overlapping portion between the source or drain semiconductor region and the gate electrode. By contrast, in the present embodiment, the end parts of the gate electrode GE in the gate length direction are positioned on the semiconductor layer EP1 (that is, the end portions of the gate electrode GE ride onto the semiconductor layer EP1). Thus, even if the thickness of the semiconductor layer SM1 of the SOI substrate SUB is not increased, the thickness of the semiconductor layer (SM2) at the overlapping portion between the source or drain semiconductor region and the gate electrode GE can be increased by the thickness of the semiconductor layer EP1 at the portion where the gate electrode GE rides, and parasitic resistance can be inhibited. Thus, the performance of the semiconductor device manufactured by using a SOI board can be improved.

Furthermore, the n⁻-type semiconductor region EX and the n⁺-type semiconductor region SD are formed in the semiconductor layers SM1 and EP1. That is, the n⁻-type semiconductor region EX and the n⁺-type semiconductor region SD are formed from the semiconductor layer EP1 over the semiconductor layer SM1 when viewed in the thickness direction (direction substantially perpendicular to the main surface of the SOI substrate SUB). That is, the source or drain semiconductor region (combination of the n⁻-type semiconductor region EX and the n⁺-type semiconductor region SD) is formed in the semiconductor layer EP1 and the semiconductor layer SM1 therebelow. Thus, when the end parts of the gate electrode GE in the gate length direction are positioned on the semiconductor layer EP1, the n⁻-type semiconductor region EX (or the n⁺-type semiconductor region SD may be possible) is present below the end parts of the gate electrode GE in the gate length direction. Therefore, the source or drain semiconductor region and the gate electrode GE can be reliably made overlap each other.

Still further, as depicted in FIG. 24 and others, the insulating film GIa for the gate insulating film (therefore, the gate insulating film GI) is formed along the shape of the semiconductor layer EP1. In the present embodiment, the semiconductor layer EP1 has a tilted part (tilted side surface SF1), and the gate insulating film GI (insulating film GIa) and the gate electrode GE are formed along the tilted part (tilted side surface SF1). Therefore, in the trench TR, the film thickness of the gate insulating film GI (insulating film GIa) can be uniformly formed with ease. Therefore, inconvenience such as a decrease in withstand voltage of the MISFET as described in the above-described third problem can be solved.

Still further, as depicted in FIG. 22 and FIG. 23, the diameter of the trench TR can be made larger than the length of the dummy gate GED. Thus, as depicted in FIG. 25, the aspect ratio can be ensured (the aspect ratio of the trench TR can be decreased), and therefore vacancy is less prone to occur even if the conductive film CD serving as the gate electrode GE is deposited in the trench TR. Therefore, inconvenience as described in the above-described fourth problem can be solved. This is particularly effective at manufacturing a MISFET with a gate length equal to or smaller than 30 nm with the advancement of microfabrication.

Still further, while the upper part and the lower part of the gate electrode have substantially the same length in the above-described first and second study examples, the length of the upper part of the gate electrode GE is longer (than the length of the lower part of the gate electrode GE) in the MISFET of the present embodiment. Thus, the volume of the entire gate electrode GE can be increased, and therefore the resistance of the gate electrode GE can be decreased.

<Modification Example of First Embodiment>

Figure 36:
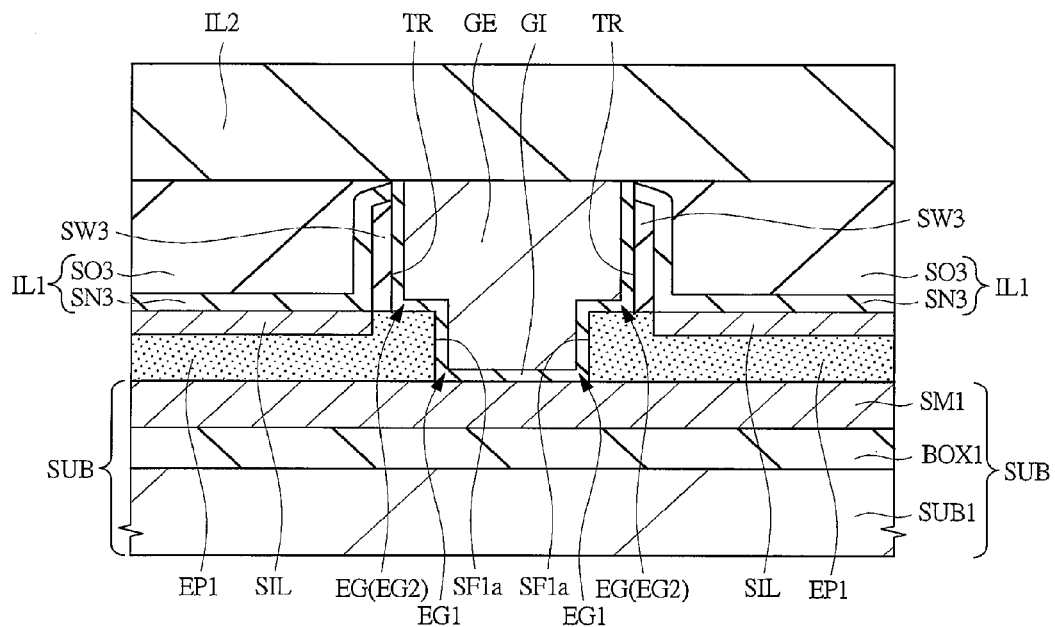
FIG. 36 is a cross-sectional view of main parts of a semiconductor device of a modification example of the first embodiment.
Figure 37:
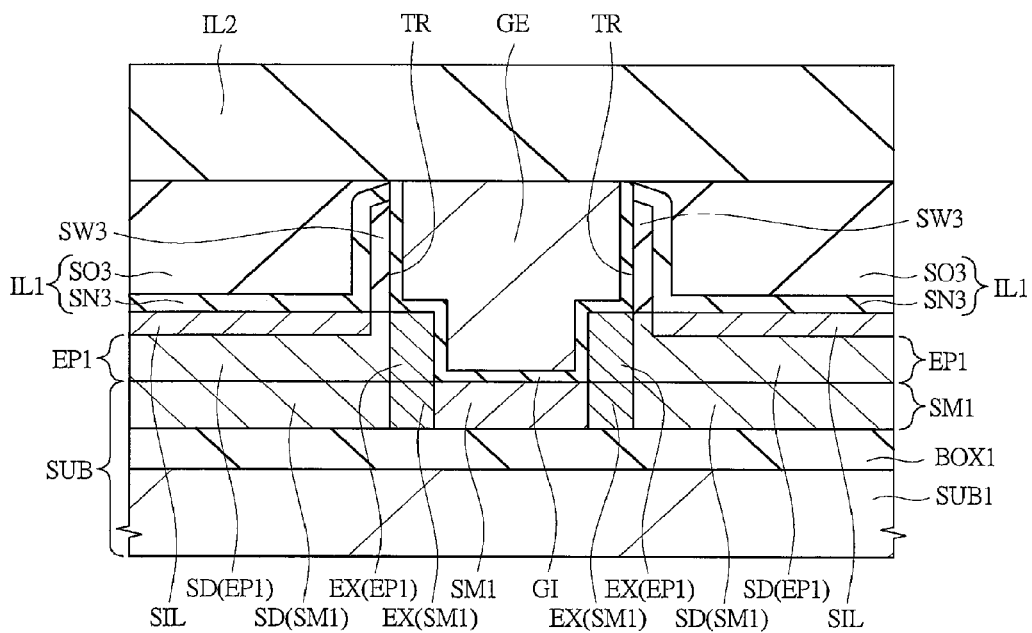
FIG. 37 is a cross-sectional view of main parts of the semiconductor device of the modification example of the first embodiment.
Figure 38:
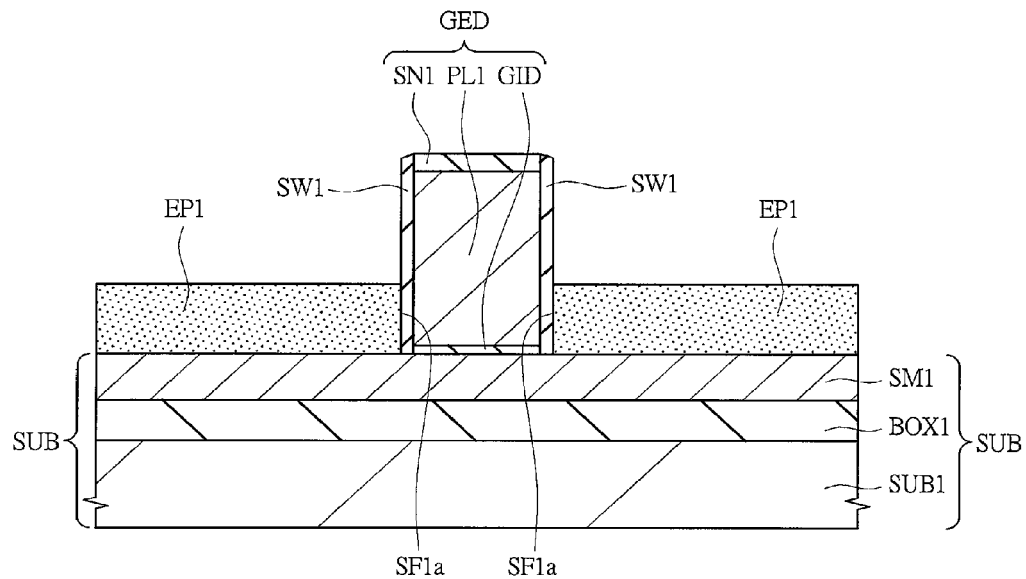
FIG. 38 is a cross-sectional view of main parts in the process of manufacturing the semiconductor device of a modification example of the first embodiment.

FIG. 36 and FIG. 37 are cross-sectional views of main parts of a semiconductor device of a modification example of the present embodiment. FIG. 36 corresponds to the above-described FIG. 1, and FIG. 37 corresponds to the above-described FIG. 2. FIG. 38 is a cross-sectional view of main part(s) in a process of manufacturing the semiconductor device of the modification example depicted in FIG. 36 and FIG. 37. FIG. 38 corresponds to the above-described FIG. 9, depicting a stage after step S4 (semiconductor layer EP1 epitaxial growth process) is performed.

The semiconductor device of the modification example depicted in FIG. 36 and FIG. 37 is a semiconductor device manufactured when the semiconductor layer EP1 is epitaxially grown so that a side surface SF1a of the semiconductor layer EP1 does not have a taper in epitaxial growth of the semiconductor layer EP1 at the above-described step S4, as depicted in FIG. 38. That is, in the case of the modification example, as depicted in FIG. 38, the semiconductor layer EP1 is epitaxially grown so that the side surface SF1a of the semiconductor layer EP1 is approximately perpendicular to the main surface of the SOI substrate SUB (that is, the main surface of the semiconductor layer SM1). The presence or absence of a taper on the side surface of the semiconductor layer EP1 can be controlled by adjusting the composition of film-formation gas of the semiconductor layer EP1, film-formation temperature, or the like.

Also in the semiconductor device of the modification example depicted in FIG. 36 and FIG. 37, the end parts (both ends in the gate length direction) of the gate electrode GE ride onto the semiconductor layer EP1, which is a source/drain epitaxial layer. That is, the end parts of the gate electrode GE in the gate length direction are positioned on the semiconductor layer EP1, which is a source/drain epitaxial layer. In other words, in the gate length direction of the MISFET (MISFET with the gate electrode GE as a gate electrode), the end parts of the gate electrode GE are positioned on the semiconductor layer EP1, which is a source/drain epitaxial layer. And, the semiconductor layer EP1 is formed on the upper surface of the semiconductor layer SM1, and the upper surface of the semiconductor layer EP1 is positioned higher than the upper surface of the semiconductor layer SM1 straight below the gate electrode GE. Thus, as described above, parasitic resistance between the source or drain semiconductor region and the channel region can be inhibited. That is, the above-described first and second problems can be solved.

However, compared with the semiconductor device of the modification example depicted in FIG. 36 and FIG. 37, the semiconductor device of the present embodiment in FIG. 1 and FIG. 2 described above has the following advantages.

That is, in the semiconductor device of the present embodiment in FIG. 1 and FIG. 2 described above, while the end parts of the gate electrode GE in the gate length direction are positioned on the semiconductor layer EP1, the side surface SF1 of the semiconductor layer EP1 is tilted, and the end parts of the gate electrode GE in the gate length direction are positioned on the tilted side surface SF1 of this semiconductor layer EP1. In other words, the side surface (side surface on the gate electrode GE side) SF1 of the semiconductor layer EP1 is tilted in the gate length direction of the MISFET (MISFET with the gate electrode GE as a gate electrode), and the end parts of the gate electrode GE are positioned on the tilted side surface SF1 of this semiconductor layer EP1 in the gate length direction of the MISFET (MISFET with the gate electrode GE as a gate electrode). That is, the end parts of the gate electrode GE (end parts in the gate length direction) ride onto the tilted side surface SF1 of the semiconductor layer EP1.

In the case of the semiconductor device of the modification example depicted in FIG. 36 and FIG. 37, since corner parts EG1 and EG2 facing the semiconductor layers SM1 and EP1 in the gate electrode GE depicted in FIG. 36 are approximately at right angles, the electric field may concentrate on this corner parts EG1 and EG2 to invite a gate leak. By contrast, in the semiconductor device of the present embodiment depicted in the above-described FIG. 1 and FIG. 2, with the side surface SF1 of the semiconductor layer EP1 being tilted, the corner parts EG3 and EG4 facing the semiconductor layers SM1 and EP1 in the gate electrode GE depicted in FIG. 1 are at obtuse angles, and therefore electric field concentration at these corner parts EG3 and EG4 can be mitigated. Thus, compared with the semiconductor device of the modification example depicted in FIG. 36 and FIG. 37, gate leak current (current leaking from the gate insulating film GI) can be inhibited more in the semiconductor device of the present embodiment depicted in the above-described FIG. 1 and FIG. 2.

Also, in forming the insulating film GIa and the conductive film CD at steps S14 and S15, the insulating film GIa and the conductive film CD can be formed in the trench TR when the side surface of the semiconductor layer EP1 exposed from the trench TR is the titled side surface SF1 (corresponding to the case of the present embodiment of FIG. 1 and FIG. 2) more easily than when the side surface is the vertical side surface SF1a (corresponding to the case of the modification example of FIG. 36 and FIG. 37). Thus, compared with the semiconductor device of the modification example depicted in FIG. 36 and FIG. 37, the gate electrode GE and the gate insulating film GI can be formed more easily and more appropriately in the semiconductor device of the present embodiment depicted in the above-described FIG. 1 and FIG. 2.

Therefore, more preferably, the side surface SF1 of the semiconductor layer EP1 is tilted, and the end parts of the gate electrode GE in the gate length direction are positioned on the tilted side surface SF1 of this semiconductor layer EP1. That is, more preferably, the end parts (end parts in the gate length direction) of the gate electrode GE ride onto the tilted side surface SF of the semiconductor layer EP1. That is, while both of the semiconductor devices have equivalent effects for the above-described fourth problem, the semiconductor device of the present embodiment depicted in FIG. 1 and FIG. 2 is superior in the above-described third problem (to the semiconductor device of the modification example depicted in FIG. 36 and FIG. 37).

Furthermore, in the present embodiment, the end parts of the gate electrode GE in the gate length direction are positioned on the semiconductor layer EP1. That is, the end parts (both ends in the gate length direction) of the gate electrode GE ride onto the semiconductor layer EP1. To obtain this structure, the following processes are adopted as a manufacturing process.

That is, in the present embodiment, after the dummy gate GED is formed at step S2, the semiconductor layer EP1, which is a source/drain epitaxial layer, is formed at step S4. Then, the sidewall insulating film SW2 is formed on the sidewall of the dummy gate GED at step S6. Then, after the insulating film IL1 is formed so as to cover the dummy gate GED at step S11, part of the insulating film IL1 is removed at step S12 to cause the upper surface of the dummy gate GED to be exposed. Thereafter, the dummy gate and the sidewall insulating film SW2 are removed at step S13 to form the trench TR, and then the gate electrode GE is formed in the trench TR via the gate insulating film GI at steps S14 to S16.

Here, what is particularly important is that the semiconductor layer EP1, which is a source/drain epitaxial layer, is formed and then the sidewall insulating film SW2 is formed on the sidewall of the dummy gate GED and that not only the dummy gate GED but also the sidewall insulating film SW2 is removed at step S13 and then the gate electrode GE is formed in the trench TR formed by removing the dummy gate GED and the sidewall insulating film SW2. Unlike the present embodiment, as in the above-described second study example (FIG. 32 to FIG. 35), when the dummy gate GED is removed at step S13 but the sidewall insulating film SW2 is left unremoved, the end parts of the gate electrode GE 102 (both ends in the gate length direction) do not ride onto the semiconductor layer EP1.

That is, by removing the sidewall insulating film SW2 formed on the sidewall of the dummy gate GED at step S13 together with the dummy gate GED, the dimension of the gate electrode GE to be formed later in the gate length direction can be made larger than the dimension of the dummy gate GED. And, since the sidewall insulating film SW2 is formed after the semiconductor layer EP1 is formed, the sidewall insulating film SW2 is formed on the semiconductor layer EP1. After the sidewall insulating film SW2 is removed at step S13 together with the dummy gate GED, the gate electrode GE is formed. In this case, the gate electrode GE occupies the region where the sidewall insulating film SW2 used to be present before removal. Thus, part of the gate electrode GE is positioned on the semiconductor layer EP1, that is, rides onto the semiconductor layer EP1.

When the sidewall insulating films SW1, SW2, and SW3 are formed on the sidewall of the dummy gate GED, the sidewall insulating film SW1 formed before formation of the semiconductor layer EP1 is removed at step S13, but the sidewall insulating films SW2 and SW3 formed after formation of the semiconductor layer EP1 are left unremoved. In this case, the end parts (both ends in the gate length direction) of the gate electrode GE do not ride onto the semiconductor layer EP1. Thus, when the sidewall insulating films SW1, SW2, and SW3 are formed on the sidewall of the dummy gate GED, it is required at step S13 that not only the sidewall insulating film SW1 formed before formation of the semiconductor layer EP1 but also the sidewall insulating film SW2 formed after formation of the semiconductor layer EP1 be removed or the thickness of the sidewall insulating film SW2 be made thinner by etching. That is, by removing, at step S13, the sidewall insulating film SW2 formed on the sidewall of the dummy gate GED after formation of the semiconductor layer EP1 together with the dummy gate GED (or by making the thickness of the sidewall insulating film SW2 thin), it is possible to obtain the structure in which the end parts (both ends in the gate length direction) of the gate electrode GE ride onto the semiconductor layer EP1.

Furthermore, in the present embodiment, the structure in which the gate electrode GE rides onto the semiconductor layer EP1 can be formed in a self-aligned manner while the use of the photolithography process is inhibited. Thus, inconvenience due to positional shift of the photo mask pattern can be prevented. Also, the size of the semiconductor element can be decreased. Therefore, the size of the semiconductor device can be decreased.

Still further, a so-called gate last process is used in the present embodiment, in which the gate insulating film GI and the gate electrode GE are formed after the dummy gate GED is removed. Thus, a metal gate electrode and a high-dielectric-constant gate insulating film can be easily applied as the gate electrode GE and the gate insulating film GI. Also, by using the gate last process, the structure in which the gate electrode GE rides onto the semiconductor layer EP1 can be formed in a self-aligned manner, while an increase in the number of manufacturing processes is inhibited.

(Second Embodiment)

The second embodiment corresponds to a modification example of the process of manufacturing the semiconductor device of the above-described first embodiment. FIG. 39 to FIG. 45 are cross-sectional views of main parts in the process of manufacturing the semiconductor device of the second embodiment.

In the above-described first embodiment, the case has been described in which the sidewall insulating films SW1 and SW2 are formed of silicon oxide and the sidewall insulating film SW3 is formed of silicon nitride. In the second embodiment, the case is described in which the sidewall insulating films SW1, SW2, and SW3 are formed of silicon nitride.

In the second embodiment, at the above-described step S3, by using a silicon nitride film in place of the above-described silicon oxide film SO1, a sidewall insulating film SW1a made of silicon nitride is formed in place of the above-described sidewall insulating film SW1 made of silicon oxide. The sidewall insulating film SW1a is basically identical to the above-described sidewall insulating film SW1 except that the film is made of not silicon oxide but silicon nitride. That is, the sidewall insulating film SW1 when formed of silicon nitride is referred to as the sidewall insulating film SW1a.

Also in the second embodiment, at the above-described step S6, by using a silicon nitride film in place of the above-described silicon oxide film SO2, a sidewall insulating film SW2a made of silicon nitride is formed in place of the above-described sidewall insulating film SW2 made of silicon oxide. The sidewall insulating film SW2a is basically identical to the above-described sidewall insulating film SW2 except that the film is made of not silicon oxide but silicon nitride. That is, the sidewall insulating film SW2 when formed of silicon nitride is referred to as the sidewall insulating film SW2a.

Furthermore, also in the above-described second embodiment, as with the first embodiment, the sidewall insulating film SW3 made of silicon nitride is formed at the above-described step S9.

Figure 39:
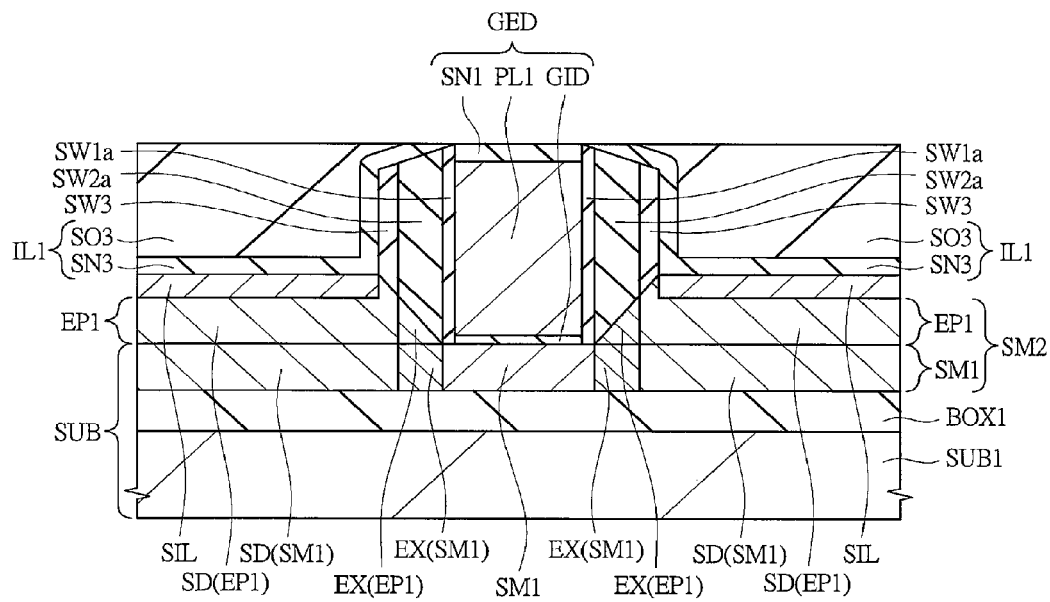
FIG. 39 is a cross-sectional view of main parts in the process of manufacturing the semiconductor device of the second embodiment.

Other than the above, the processes up to the CMP process at the above-described step S12 are performed in a similar manner to that of the above-described first embodiment, thereby obtaining the structure of FIG. 39 corresponding to the above-described FIG. 19.

In the stage of FIG. 39, what is different from the stage of the above-described FIG. 19 of the above-described first embodiment is that the sidewall insulating films SW1 and SW2 made of silicon oxide are replaced by the sidewall insulating films SW1a and SW2a made of silicon nitride. Other than that, these stages are basically the same.

After the processes up to the CMP process at the above-described step S12 are performed in a similar manner to that of the above-described first embodiment to obtain the structure of FIG. 39, even in the second embodiment, the dummy gate GED and the sidewall insulating films SW1 and SW2 are removed by etching at the above-described step S13. The etching conditions at this step S13 are partially different from those described in the above-described first embodiment because the sidewall insulating films SW1 and SW2 made of silicon oxide are replaced by the sidewall insulating films SW1a and SW2a made of silicon nitride. Step S13 in the case of the second embodiment is specifically described below.

Figure 40:
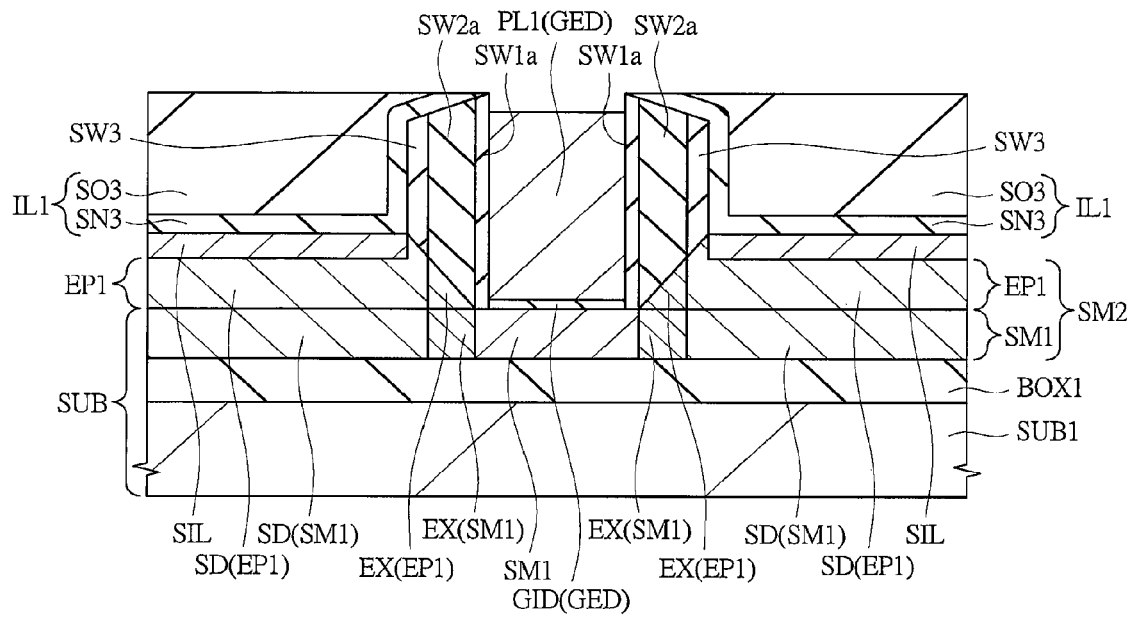
FIG. 40 is a cross-sectional view of main parts in the process of manufacturing the semiconductor device continued from FIG. 39.

First, as a first stage of etching at step S13, the silicon nitride film SN1 of the dummy gate GED is removed, as depicted in FIG. 40. This first stage of etching in the second embodiment is also similar to that of the above-described first embodiment. By the first stage of etching, the silicon nitride film SN1 is removed, and polysilicon film PL1 is exposed.

Figure 41:
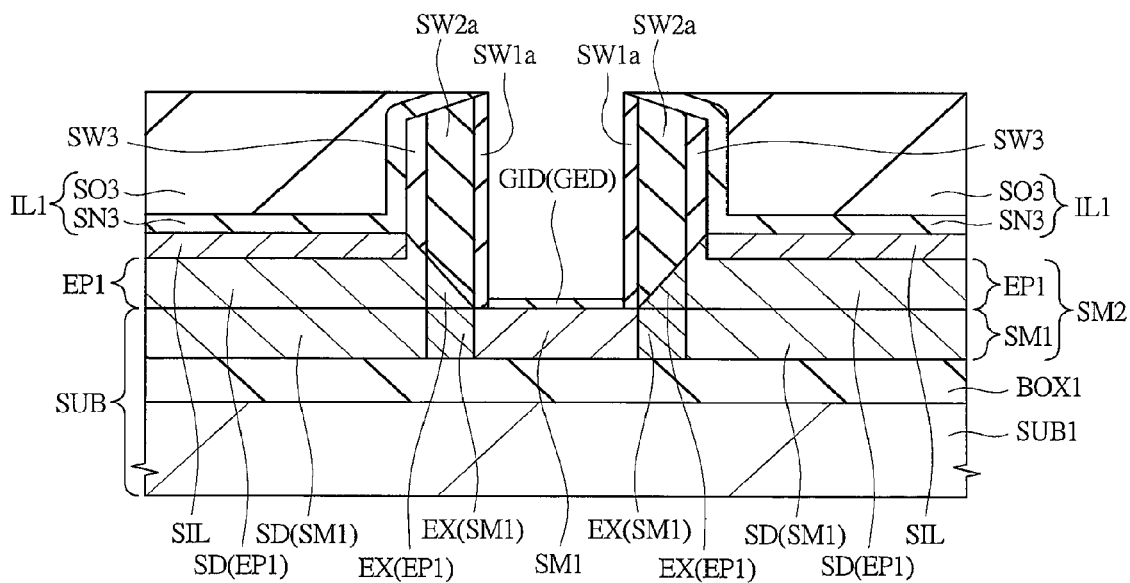
FIG. 41 is a cross-sectional view of main parts in the process of manufacturing the semiconductor device continued from FIG. 40.

Next, as a second stage of etching at step S13, the polysilicon film PL1 of the dummy gate GED is removed, as depicted in FIG. 41. This second stage of etching in the second embodiment is also similar to that of the above-described first embodiment. By the second stage of etching, the polysilicon film PL1 is removed, and the sidewall insulating film SW1 and the insulating film GID are exposed.

Figure 42:
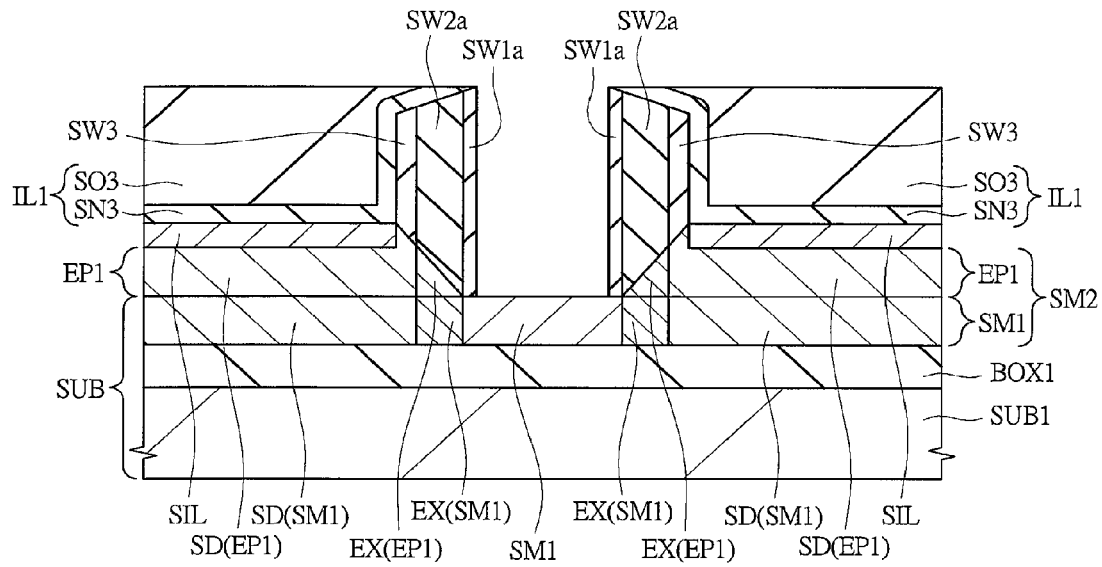
FIG. 42 is a cross-sectional view of main parts in the process of manufacturing the semiconductor device continued from FIG. 41.

A third stage of etching at step S13 onward is different from that of the above-described first embodiment. That is, in the second embodiment, after the polysilicon film PL1 is removed in the second stage of etching, the insulating film GID is removed by the third stage of etching, as depicted in FIG. 42. In this third stage of etching, preferably, the insulating film GID is selectively etched with an etching condition in which the etching speed of the insulating film GID (silicon oxide) is faster than the etching speed of the sidewall insulating films SW1a and SW2a (silicon nitride) and the semiconductor layers SM1 and EP1 (silicon). With this, the semiconductor layers SM1 and EP1 can be inhibited or prevented from being etched in the third stage of etching.

When the insulating film GID is formed of a material film (specifically, such as a silicon oxide film) different from that of the sidewall insulating films SW1a and SW2a, the insulating film GID can be removed by this third stage of etching. On the other hand, when the insulating film GID is formed of the same material (specifically, a silicon nitride film) as that of the sidewall insulating films SW1a and SW2a, this third stage of etching is not performed and it is enough to perform the following fourth stage of etching. At the fourth stage of etching, the insulating film GID is also removed.

Still further, in the second embodiment, this third stage of etching (etching of removing the insulating film GID) can be performed after the fourth stage of etching (etching of removing the sidewall insulating film SW and SW2a) described next.

Figure 43:
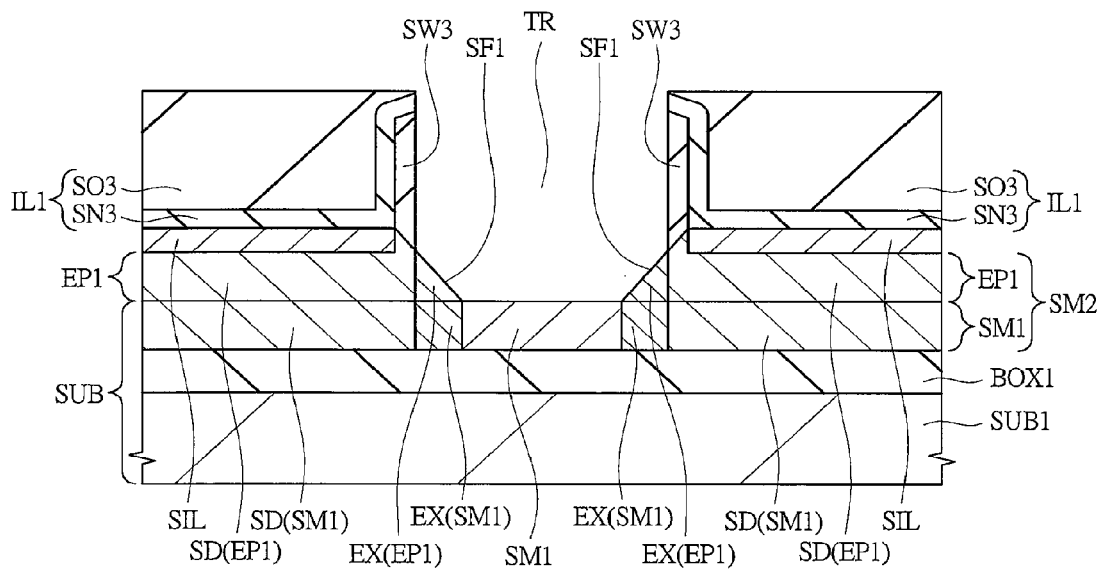
FIG. 43 is a cross-sectional view of main parts in the process of manufacturing the semiconductor device continued from FIG. 42.

Next, as a fourth stage of etching at step S13, the sidewall insulating films SW1a and SW2a made of silicon nitride are removed, as depicted in FIG. 43. This fourth stage of etching is performed with an etching condition in which the etching speed of the sidewall insulating films SW1a and SW2a (silicon nitride) is faster than the etching speed of the semiconductor layers SM1 and EP1. With this, it is possible to suppress and prevent the semiconductor layers SM1 and EP1 from being etched at the fourth stage of etching. Also, a high etching selection ratio between the sidewall insulating films SW1a, SW2a, and SW3 and the semiconductor layers SM1 and EP1 can be easily ensured, because the sidewall insulating films SW1a, SW2a, and SW3 are made of silicon nitride.

In the fourth stage of etching, not only the sidewall insulating films SW and SW2a but also the sidewall insulating film SW3 is formed of silicon nitride. Thus, in the fourth stage of etching, etching time is controlled so that the sidewall insulating films SW1a and SW2a are removed by etching and the sidewall insulating film SW3 is left. That is, in the fourth stage of etching, etching time is set so that a total thickness of the sidewall insulating films SW1a and SW2a can be just etched. With this, the sidewall insulating films SW1a and SW2a can be removed by etching, and the sidewall insulating film SW3 can be left.

Note that it is required to fully remove (the entire thickness of) the sidewall insulating film SW1a in the fourth stage of etching in etching at step S13.

Also, in the fourth stage of etching at step S13, it is desirable to fully remove (the entire thickness of) the sidewall insulating film SW1a. However, the case can be allowed in which part of the sidewall insulating film SW2a is left in a layer shape on the inner wall of the sidewall insulating film SW3. Also in this case, the thickness of the sidewall insulating film SW2a left on the inner wall of the sidewall insulating film SW3 is required to be thinner than the thickness of the sidewall insulating film SW2a in the state before the fourth stage of etching.

Furthermore, in the fourth stage of etching in etching at step S13, while it is desirable to leave approximately an entire (entire thickness) of the sidewall insulating film SW3, the case can be allowed in which the sidewall insulating film SW3 is slightly etched (part of the thickness of the sidewall insulating film SW3 is etched) and part of the sidewall insulating film SW3 is left in a layer shape. Thus, the thickness of the sidewall insulating film SW3 may be thinner than the thickness of the sidewall insulating film SW3 in the state before the fourth stage of etching, but the fourth stage of etching in etching at step S13 is set to end at a stage in which at least part of the sidewall insulating film SW3 is left in a layer shape.

That is, while the sidewall insulating film SW1a, the sidewall insulating film SW2a, and the sidewall insulating film SW3 are formed of silicon nitride, etching time is set at the fourth stage of etching in etching at step S13 so that the etching thickness is thicker than the thickness of the sidewall insulating film SW1a and the etching thickness is thinner than a total thickness of the sidewall insulating film SW1a, the sidewall insulating film SW2a, and the sidewall insulating film SW3. That is, at the fourth stage of etching in etching at step S13, etching time is set so that etching continues even after the sidewall insulating film SW1a is removed and the sidewall insulating film SW2a is exposed and etching stops at a stage before the entire thickness of the sidewall insulating film SW3 is etched. In other words, the end point of the fourth stage of etching in etching at step S13 is set between a stage in which etching proceeds midway through the thickness of the sidewall insulating film SW2a and a stage in which etching proceeds midway through the thickness of the sidewall insulating film SW3.

Also, when formation of the sidewall insulating film SW3 is omitted, in the fourth stage at step S13, etching ends at a stage in which the sidewall insulating films SW1a and SW2a are removed and the insulating film IL1 (more specifically, the silicon nitride film SN3 of the insulating film EL1) is exposed.

By the above-described four stages (the first stage, the second stage, the third stage, and the fourth stage) of etching at step S13, the dummy gate GED, the insulating film GID, and the sidewall insulating films SW1a and SW2a are removed to form the above-described trench TR, as depicted in FIG. 43.

Figure 44:
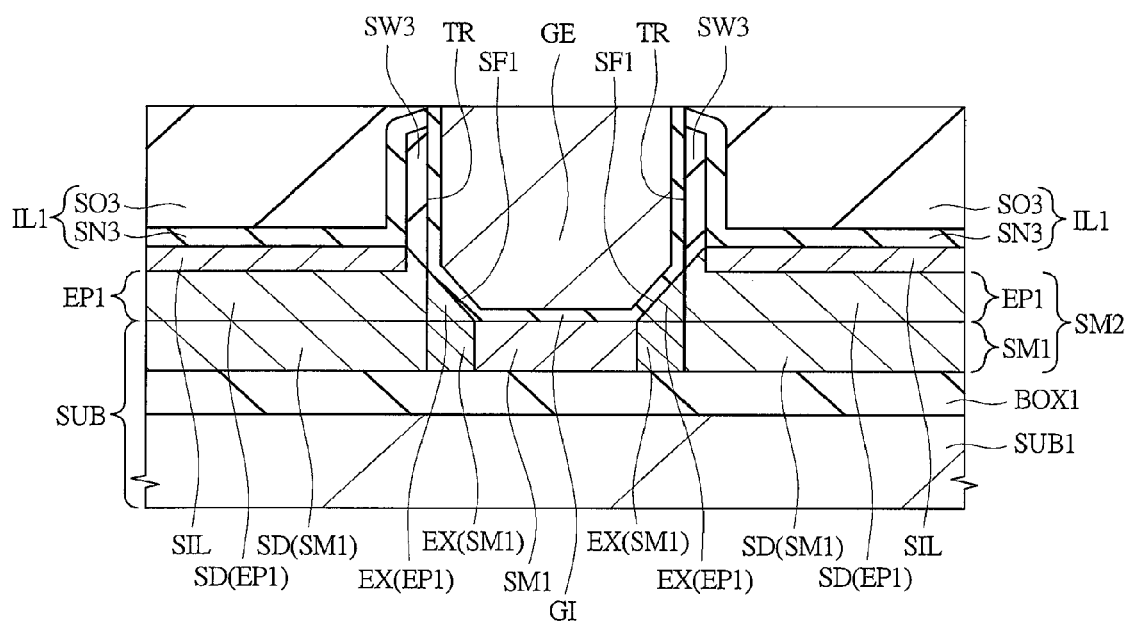
FIG. 44 is a cross-sectional view of main parts in the process of manufacturing the semiconductor device continued from FIG. 43.
Figure 45:
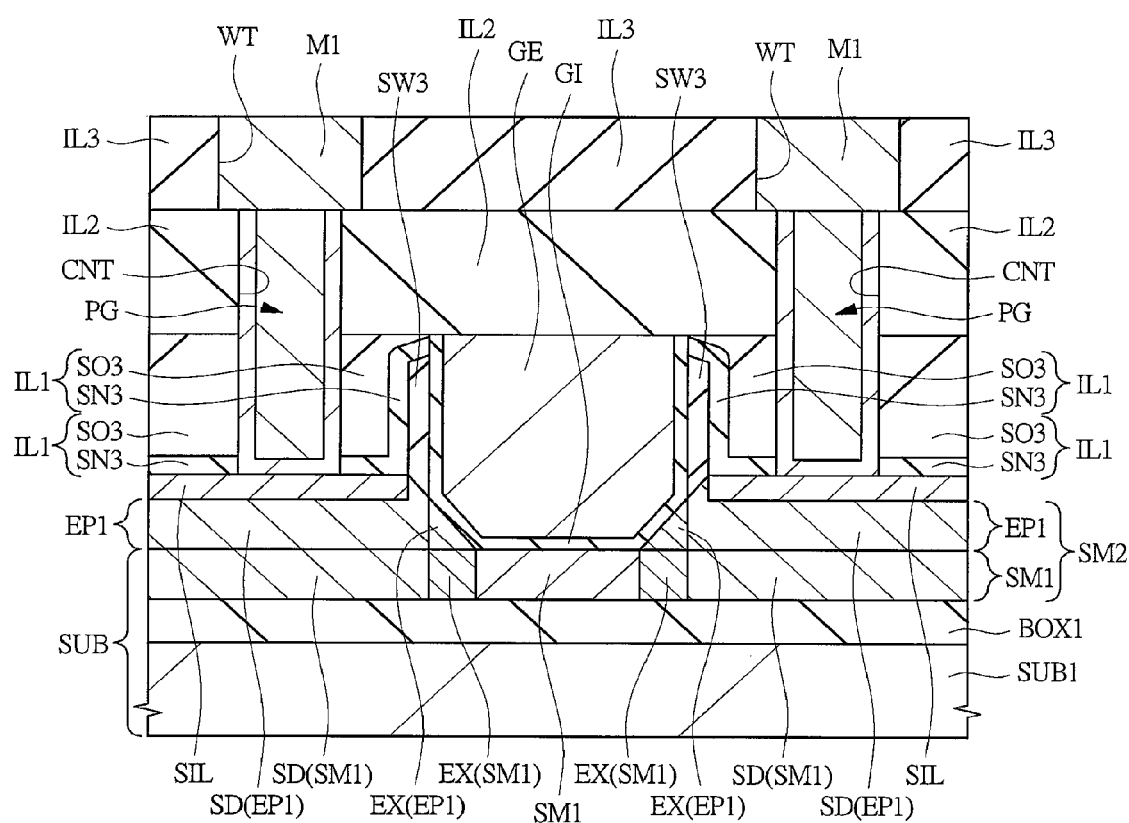
FIG. 45 is a cross-sectional view of main parts in the process of manufacturing the semiconductor device continued from FIG. 44.

Subsequent processes are substantially similar to those of the above-described first embodiment. That is, the above-described insulating film GIa for the gate insulating film is formed at the above-described step S14, the above-described conductive film CD for the gate electrode is formed at the above-described step S15, and the conductive film CD and the insulating film GIa outside the trench TR are removed by a CMP technique or the like at the above-described step S16. With this, the gate electrode GE is formed in the trench TR via the gate insulating film GI, as depicted in FIG. 44. Then, as depicted in FIG. 45, as with the above-described first embodiment, the above-described insulating film IL2 is formed, the above-described contact hole CNT is formed, the above-described plug PG is formed in the contact hole CNT, the above-described insulating film IL3 is formed, and the above-described wiring M1 is formed.

As such, also in the second embodiment, a semiconductor device substantially similar to that of the above-described first embodiment can be manufactured. That is, the above-described first to fourth problems can be solved.

In the above-described first embodiment, the sidewall insulating films SW1 and SW2 are silicon oxide films, and therefore the sidewall insulating film SW3 or the silicon nitride film SN3 can be used as an etching stopper, thereby facilitating control of etching at step S13.

On the other hand, in the second embodiment, the sidewall insulating films SW1a and SW2a are silicon nitride films, and therefore a selection ratio with the interlayer insulating film SO3 can be advantageously taken with ease. That is, in the above-described first embodiment, when the sidewall insulating films SW1a and SW2a and the interlayer insulating film SO3 are formed of the same material, a silicon oxide film, the surface of the interlayer insulating film SO3 tends to recede. However, in the second embodiment, since the sidewall insulating films SW1a and SW2a and the interlayer insulating film SO3 are formed of different materials, the surface of the interlayer insulating film SO3 is less prone to recede. Therefore, an effect of easily controlling the height of the interlayer insulating film SO3 can be obtained.

Note that a silicon oxynitride film may be used as the material of the liner film SN3 in place of the silicon nitride film. In this case, the silicon oxynitride film (liner film SN3) is different from the material of the sidewall insulating films SW1, SW2, and SW3 and the material of the insulating film SO3. Therefore, it is possible to address a problem in which the surface of the interlayer insulating film SO3 recedes at the time of forming the trench TR.

(Third Embodiment)

Figure 46:
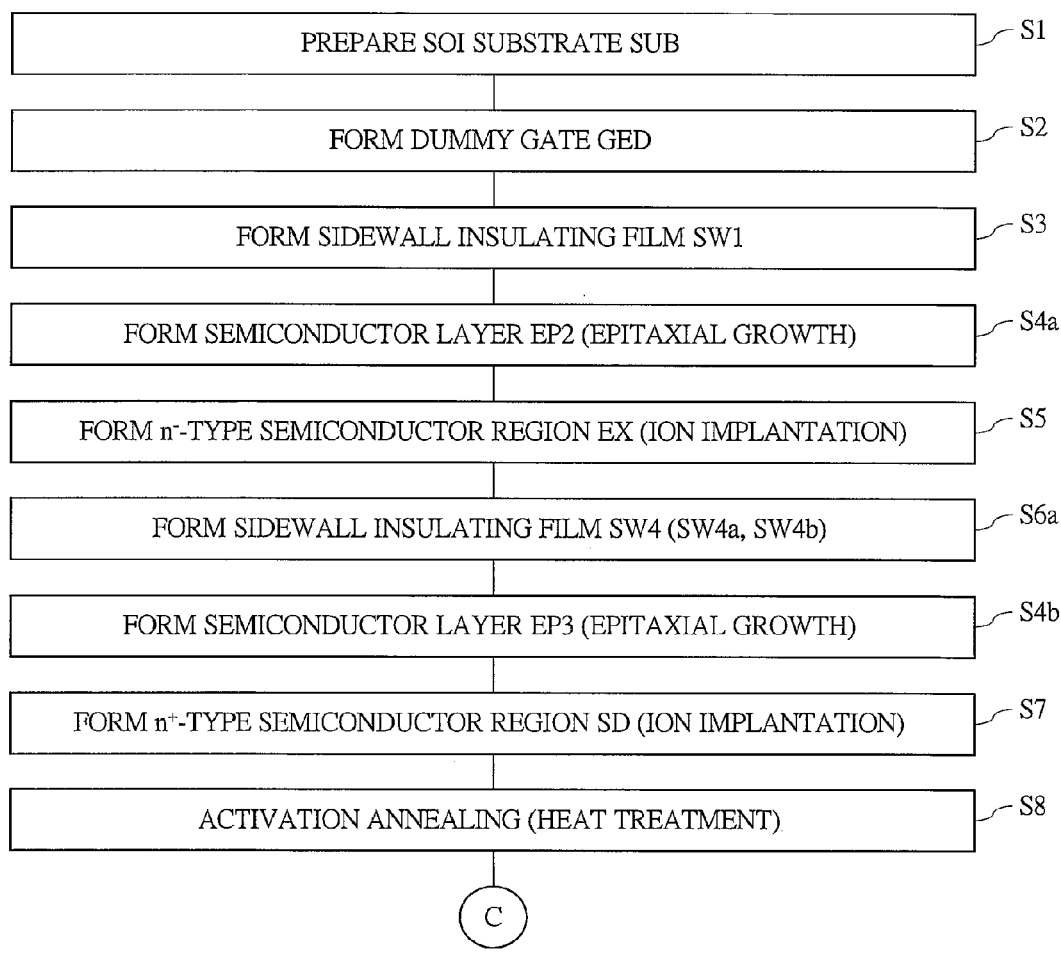
FIG. 46 is a cross-sectional view of main parts in the process of manufacturing the semiconductor device continued from FIG. 45.
Figure 47:
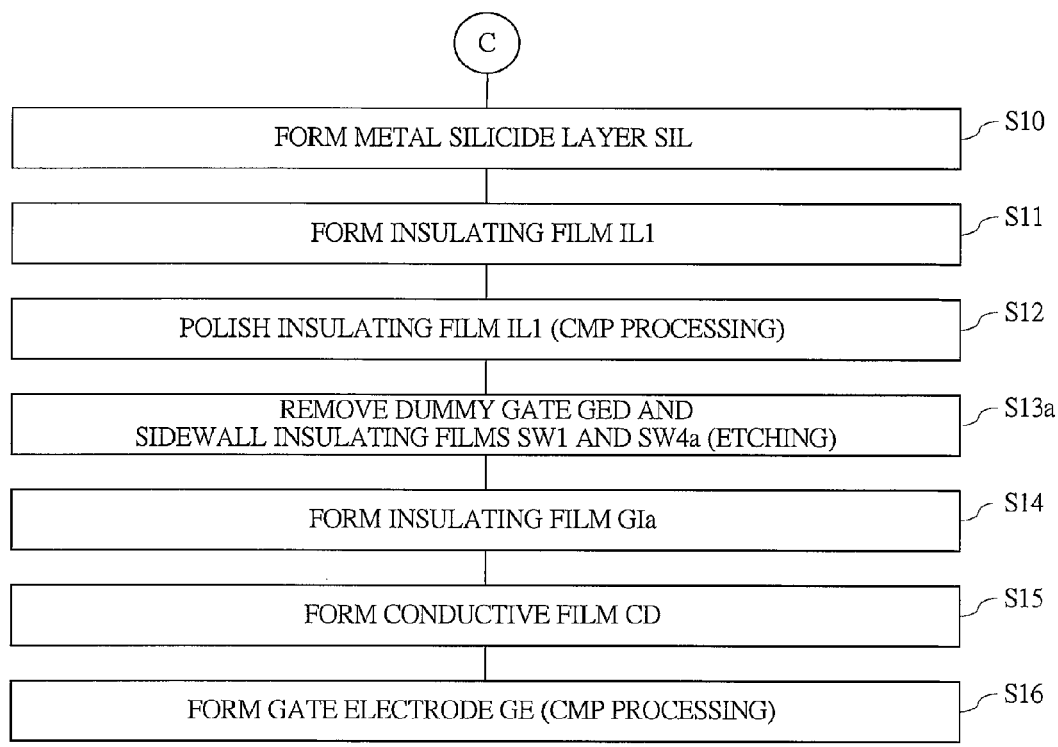
FIG. 47 is a cross-sectional view of main parts in the process of manufacturing the semiconductor device continued from FIG. 46.

FIG. 46 and FIG. 47 are process flow diagrams of a process of manufacturing a semiconductor device according to the third embodiment. FIG. 48 to FIG. 63 are cross-sectional views of main parts in the process of manufacturing the semiconductor device of the third embodiment.

In the above-described first embodiment, only one source/drain epitaxial layer (corresponding to the above-described semiconductor layer EP1) is formed on the semiconductor layer SM1 of the SOI substrate SUB. By contrast, in the third embodiment, two source/drain epitaxial layers (corresponding to semiconductor layers EP2 and EP3, which will be described further below) are formed on the semiconductor layer SM1 of the SOI substrate SUB. In the third embodiment, the above-described first, second, and fourth problems can be solved.

Specific description is made below with reference to the drawings.

Figure 48:
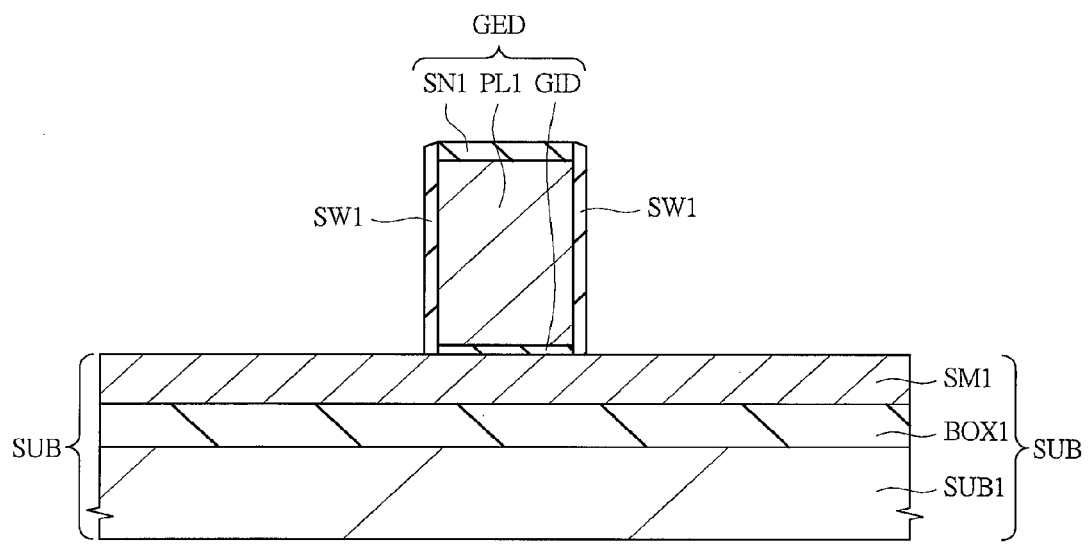
FIG. 48 is a cross-sectional view of main parts in the process of manufacturing the semiconductor device continued from FIG. 47.

Also in the third embodiment, as with the above-described first embodiment, processes up to the process of forming the sidewall insulating film SW1 at the above-described step S3 are preformed to obtain the structure of FIG. 48 corresponding to the above-described FIG. 7.

Figure 49:
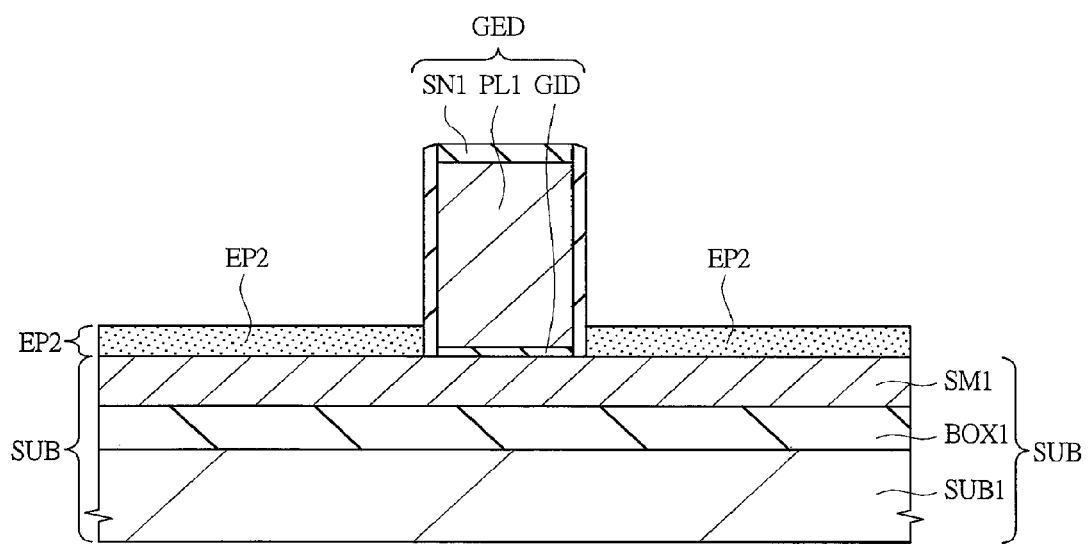
FIG. 49 is a cross-sectional view of main parts in the process of manufacturing the semiconductor device continued from FIG. 48.

Next, as depicted in FIG. 49, the semiconductor layer EP2 is epitaxially grown on the semiconductor layer SM1 (step S4a of FIG. 46).

As with the above-described semiconductor layer EP1, the semiconductor layer EP2 is also formed on the semiconductor layer SM1 in both side regions of the dummy gate GED (more specifically, a structure formed of the dummy gate GED and the sidewall insulating film SW1). That is, on the semiconductor layer SM1, the semiconductor layer EP2 is formed on both sides of the dummy gate GED (more specifically, the structure formed of the dummy gate GED and the sidewall insulating film SW1) so as to be adjacent to the dummy gate GED (more specifically, the structure formed of the dummy gate GED and the sidewall insulating film SW1).

As with the above-described semiconductor layer EP1, the semiconductor layer EP2 is an epitaxial layer (epitaxial semiconductor layer) formed by epitaxial growth, and is made of silicon (monocrystalline silicon). The semiconductor layer EP2 epitaxially grows selectively on the semiconductor layer SM1, and is not formed on the sidewall insulating film SW1 or the silicon nitride film SN1. Also, as described in the above-described first embodiment, the polysilicon film PL1 of the dummy gate GED is covered with the silicon nitride film SN1 and the sidewall insulating film SW1, and therefore an epitaxial layer is not formed on the polysilicon film PL1.

Also in the above-described first embodiment, the semiconductor layer EP1 is epitaxially grown so that the side surface of the semiconductor layer EP1 is tapered. In the third embodiment, the semiconductor layer EP2 can be epitaxially grown so that the side surface of the semiconductor layer EP2 is not tapered. That is, the semiconductor layer EP2 is epitaxially grown so that the side surface of the semiconductor layer EP2 is substantially perpendicular to the main surface of the SOI substrate SUB (that is, the main surface of the semiconductor layer SM1). The presence or absence of the taper of the side surface of the semiconductor layer EP2 (therefore, an angle formed by the main surface of the semiconductor layer SM1 and the side surface of the semiconductor layer EP2) can be controlled by adjusting the composition of film-formation gas of the semiconductor layer EP2, film-formation temperature, and so forth.

Since the semiconductor layer EP2 is formed on a substantially flat upper surface of the semiconductor layer SM1, the upper surface of the semiconductor layer EP2 is positioned higher than the upper surface of the semiconductor layer SM2. Thus, the upper surface of the semiconductor layer EP1 formed at step S4a is positioned higher than the upper surface of the semiconductor layer SM1 straight below the dummy gate GED.

Figure 50:
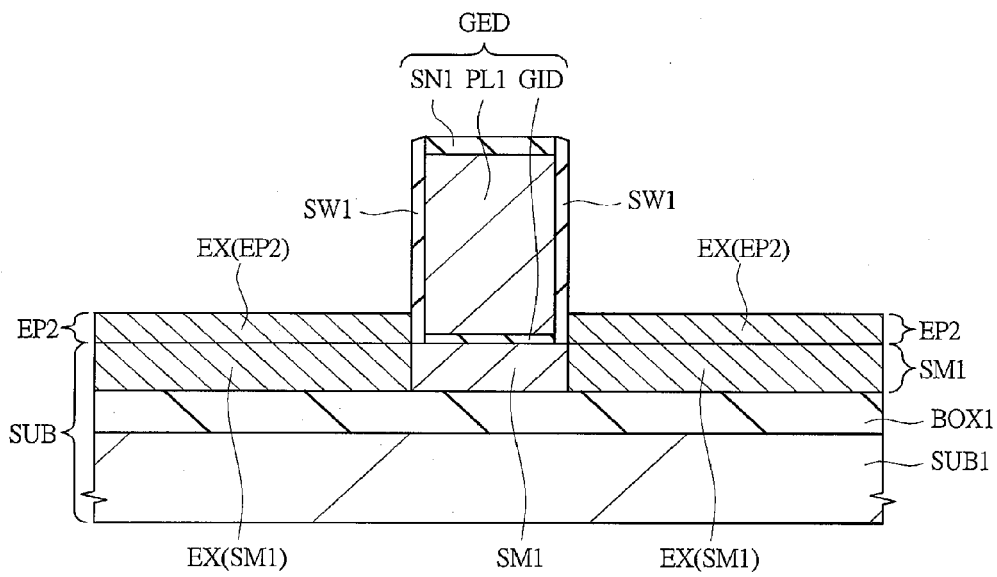
FIG. 50 is a cross-sectional view of main parts in the process of manufacturing the semiconductor device continued from FIG. 49.

Next, as depicted in FIG. 50, n$^+$-type impurities such as phosphorus (P) or arsenic (As) are ion-implanted in both side regions of the dummy gate GED and the sidewall insulating film SW1 in the semiconductor layers SM1 and EP2 to form the n$^-$-type semiconductor region EX (step S5 of FIG. 46).

The ion implanting process at step S5 in the third embodiment is basically identical to that of the above-described first embodiment. However, while n-type impurities are implanted in the laminated body of the semiconductor layer SM1 and the semiconductor layer EP1 to form the n$^-$-type semiconductor region EX in the above-described first embodiment, n-type impurities are implanted in the laminated body of the semiconductor layer SM1 and the semiconductor layer EP2 in the third embodiment to form the n$^-$-type semiconductor region EX.

Figure 51:
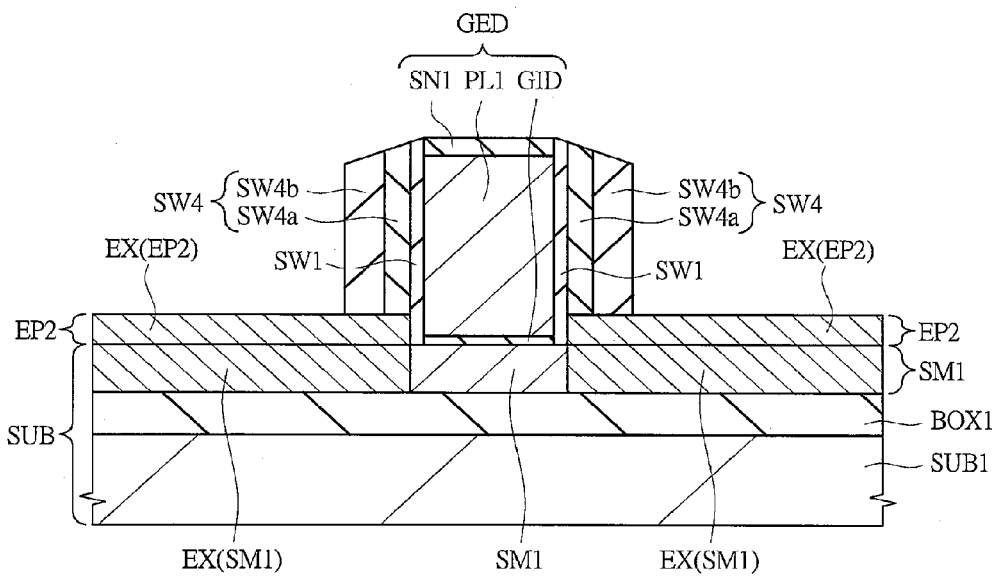
FIG. 51 is a cross-sectional view of main parts in the process of manufacturing the semiconductor device continued from FIG. 50.

In the ion implanting process for forming the n$^-$-type semiconductor region EX, the dummy gate GED and the sidewall insulating film SW1 can function as a mask (ion implantation inhibiting mask). Thus, the n$^-$-type semiconductor region EX is formed in (the laminated body of) the semiconductor layer SM1 and the semiconductor layer EP2 so as to be self-aligned to the sidewall insulating film SW1 on the sidewall of the dummy gate GED. Next, as depicted in FIG. 51, a sidewall insulating film (sidewall spacer) SW4 is formed as a sidewall film on the sidewall of the dummy gate GED (step S6a of FIG. 46). The sidewall insulating film SW4 is formed on the sidewall of the dummy gate GED via the sidewall insulating film SW1.

The sidewall insulating film SW4 is formed of a laminated layer of a sidewall insulating film SW4a, which is a sidewall film, and a sidewall insulating film SW4b, which is a sidewall film. The sidewall insulating film SW4a and the sidewall insulating film SW4b are formed of different materials. Preferably, the sidewall insulating film SW4a is formed of silicon oxide (silicon oxide film), and the sidewall insulating film SW4b is formed of silicon nitride (silicon nitride film).

Since the sidewall insulating film SW4a is removed later, the sidewall insulating film SW4a may not necessarily have insulating properties. However, an insulating film is preferable in view of easy formation as a sidewall film, preventability of inconvenience when an etching residue occurs at the time of removal, and so forth. Also, the sidewall insulating film SW4b has insulating properties because the sidewall insulating film SW4b is left in the semiconductor device after manufacture.

To form the sidewall insulating film SW4, the sidewall insulating film SW4a is first formed. To form the sidewall insulating film SW4a, a silicon oxide film is first formed on the entire main surface of the SOI substrate SUB by a CVD technique or the like so as to cover the dummy gate GED and the sidewall insulating film SW1. Then, this silicon oxide film is etched back (anisotropic etching), thereby leaving the silicon oxide film on the sidewall of the dummy gate GED as the sidewall insulating film SW4a and removing the silicon oxide film of another region. With this, the sidewall insulating film SW4a is formed on the sidewall of the dummy gate GED via the sidewall insulating film SW1. After the sidewall insulating film SW4a is formed, the sidewall insulating film SW4b is formed. To form the sidewall insulating film SW4b, a silicon nitride film is first formed on the entire main surface of the SOI substrate SUB by a CVD technique or the like so as to cover the dummy gate GED and the sidewall insulating films SW1 and SW4a. Then, this silicon nitride film is etched back (anisotropic etching), thereby leaving the silicon nitride film on the sidewall of the dummy gate GED as the sidewall insulating film SW4b and removing the silicon nitride film of another region. With this, the sidewall insulating film SW4b is formed on the sidewall of the dummy gate GED via the sidewall insulating films SW1 and SW4a. In this manner, the sidewall insulating film SW4 formed of a lamination of the sidewall insulating film SW4a and the sidewall insulating film SW4b is formed on the sidewall of the dummy gate GED via the sidewall insulating film SW1.

The sidewall insulating film SW4a can have a thickness (thickness in a direction substantially perpendicular to the sidewall of the dummy gate GED), for example, on the order of 5 nm to 10 nm. The sidewall insulating film SW4b can have a thickness (thickness in a direction substantially perpendicular to the sidewall of the dummy gate GED), for example, on the order of 10 nm to 30 nm.

The sidewall insulating film SW4 is adjacent to the sidewall of the dummy gate GED via the sidewall insulating film SW1, and is formed on the semiconductor layer EP2. That is, the bottom surface of the sidewall insulating film SW4 is in contact with the semiconductor layer EP2 (specifically, the upper surface of the semiconductor layer EP2), and the inner wall of the sidewall insulating film SW4 (side surface facing the dummy gate GED) is in contact with the sidewall insulating film SW1 on the sidewall of the dummy gate GED.

Figure 52:
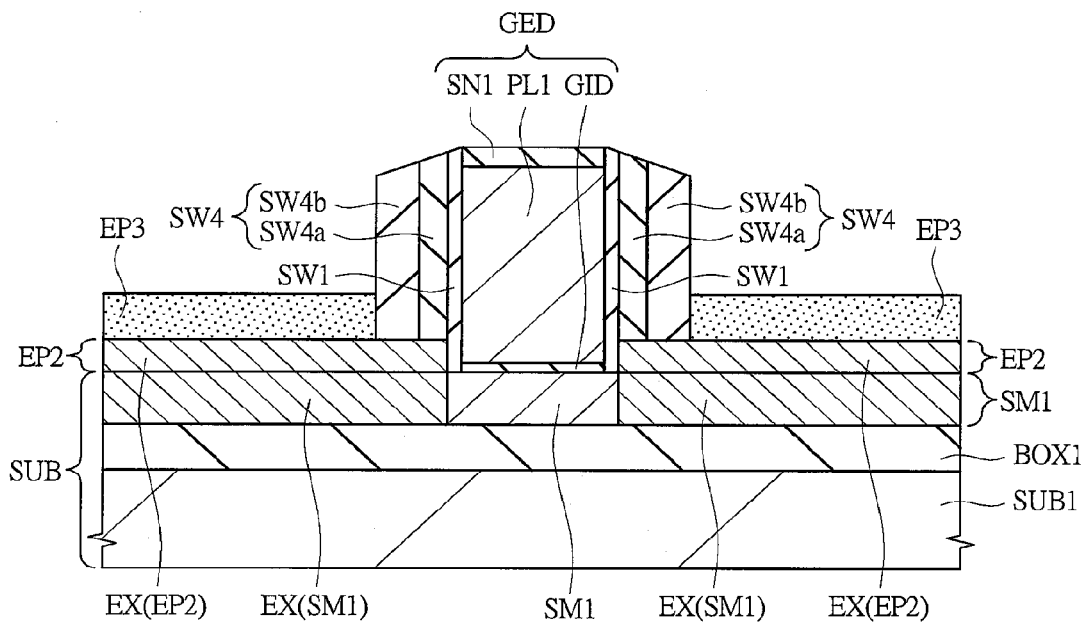
FIG. 52 is a cross-sectional view of main parts in the process of manufacturing the semiconductor device continued from FIG. 51.

Next, as depicted in FIG. 52, the semiconductor layer EP3 is epitaxially grown on the semiconductor layer EP2 (step S4b of FIG. 46).

The semiconductor layer EP3 is formed on the semiconductor layer SM1 in both side regions of the dummy gate GED (more specifically, a structure formed of the dummy gate GED and the sidewall insulating films SW1 and SW4). That is, on the semiconductor layer SM1, the semiconductor layer EP3 is formed on both sides of the dummy gate GED (more specifically, the structure formed of the dummy gate GED and the sidewall insulating films SW1 and SW4) so as to be adjacent to the dummy gate GED (more specifically, the structure formed of the dummy gate GED and the sidewall insulating films SW1 and SW4).

As with the above-described semiconductor layers EP1 and EP2, the semiconductor layer EP3 is an epitaxial layer (epitaxial semiconductor layer) formed by epitaxial growth, and made of silicon (monocrystalline silicon). The semiconductor layer EP3 epitaxially grows selectively on the semiconductor layer EP2, and is not formed on the sidewall insulating films SW1 and SW4 and the silicon nitride film SN1. As described above, since the polysilicon film PL1 of the dummy gate GED is covered with the silicon nitride film SN1 and the sidewall insulating films SW1 and SW4, no epitaxial layer is formed on the polysilicon film PL1. Also, while the semiconductor layer EP3 is formed on the semiconductor layer EP2, the semiconductor layer EP3 is not formed on a portion of the semiconductor layer EP2 covered with the sidewall insulating film SW4. Thus, while the side surface of the semiconductor layer EP2 is adjacent to the sidewall insulating film SW1, the side surface of the semiconductor layer EP3 is adjacent to the sidewall insulating film SW4b.

Also, as with the semiconductor layer EP2, the semiconductor layer EP3 can be epitaxially grown so that the side surface of the semiconductor layer EP3 is not tapered. That is, the semiconductor layer EP3 is epitaxially grown so that the side surface of the semiconductor layer EP3 is substantially perpendicular to the main surface of the SOI substrate SUB (that is, the main surface of the semiconductor layer SM1). The presence or absence of the taper of the side surface of the semiconductor layer EP3 (therefore, an angle formed by the main surface of the semiconductor layer SM1 and the side surface of the semiconductor layer EP3) can be controlled by adjusting the composition of film-formation gas of the semiconductor layer EP3, film-formation temperature, and so forth.

Also, the formation thickness of the semiconductor layer EP3 at step S4b is preferably thicker than the formation thickness of the semiconductor layer EP2 at step S4a. With this, the occurrence of a region where a silicon region disappears in a thickness direction with later formation of the metal silicide layer SIL can be easily prevented.

Figure 53:
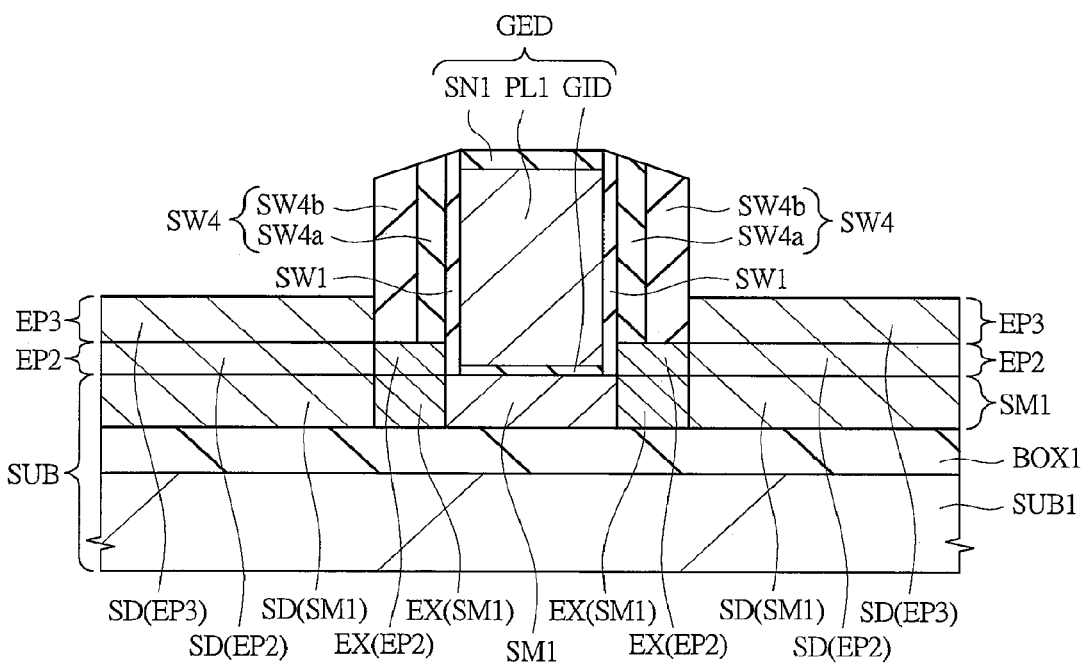
FIG. 53 is a cross-sectional view of main parts in the process of manufacturing the semiconductor device continued from FIG. 52.

Next, as depicted in FIG. 53, $n^+$-type impurities such as phosphorus (P) or arsenic (As) are ion-implanted in both side regions of the dummy gate GED and the sidewall insulating films SW1 and SW4 in the semiconductor layers SM1, EP2, and EP3 to form the $n^+$-type semiconductor region SD (step S7 of FIG. 46).

The ion implanting process at step S7 in the third embodiment is basically identical to that of the above-described first embodiment. However, while $n^+$-type impurities are implanted in the laminated body of the semiconductor layer SM1 and the semiconductor layer EP1 to form the $n^+$-type semiconductor region SD in the above-described first embodiment, $n^+$-type impurities are implanted in the laminated body of the semiconductor layer SM1, the semiconductor layer EP2, and the semiconductor layer EP3 in the third embodiment to form the n$^+$-type semiconductor region SD.

In the ion implanting process for forming the n$^+$-type semiconductor region SD, the dummy gate GED and the sidewall insulating films SW1 and SW4 can function as a mask (ion implantation inhibiting mask). Thus, the n$^+$-type semiconductor region SD is formed so as to be self-aligned to the sidewall insulating film SW4 formed on the sidewall of the dummy gate GED via the sidewall insulating film SW1. The n$^+$-type semiconductor region SD has an impurity concentration higher than that of the n$^-$-type semiconductor region EX.

Before the sidewall insulating film SW4 is formed at step S6a, ion implantation for forming the n$^-$-type semiconductor region EX (step S5) is performed, and after the sidewall insulating film SW4 is formed at step S6a, ion implantation for forming the n$^+$-type semiconductor region SD (step S7) is preformed. Thus, when the process is performed up to step S7, the n$^-$-type semiconductor region EX is in a state of being formed in the semiconductor layers SM1 and EP2 at a portion straight below the sidewall insulating film SW4 (4a, 4b). At step S13a which will be described later, since the gate electrode GE is formed after the dummy gate GED and also the sidewall insulating film SW4a are removed, the gate electrode GE is formed also in a region where the sidewall insulating film SW4a used to be present. Thus, when the gate electrode GE is formed later, the n$^-$-type semiconductor region EX is in a state of being substantially formed straight below part of the gate electrode GE (both end sides in the gate length direction) and straight below the sidewall insulating film SW4b.

Next, activation annealing is performed, which is a heat treatment for activating the impurities introduced to the n$^-$-type semiconductor region SD, the n$^-$-type semiconductor region EX, and so forth (step S8 of FIG. 46). Also, when the ion implanted region is amorphized, crystallization can be made at the time of this activation annealing at step S8.

Figure 54:
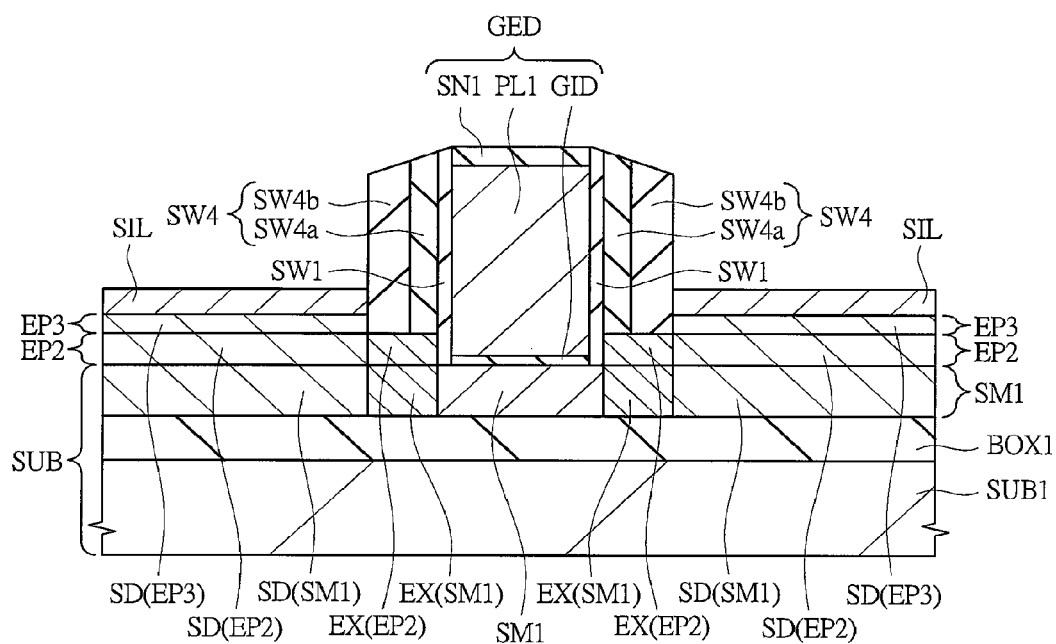
FIG. 54 is a cross-sectional view of main parts in the process of manufacturing the semiconductor device continued from FIG. 53.

Next, as depicted in FIG. 54, as with the above-described first embodiment, the low-resistant metal silicide layer SIL is formed on the surface (upper layer part) of the n$^+$-type semiconductor region SD (step S10 of FIG. 47).

The metal silicide layer SIL forming process at step S10 in the third embodiment is basically identical to that of the above-described first embodiment. However, while the metal silicide layer SIL is formed mainly in the semiconductor layer EP1 in the above-described first embodiment, the metal silicide layer SIL is formed mainly in the semiconductor layer EP3 (or the semiconductor layers EP3 and EP2) in the third embodiment. Also, as with the above-described first embodiment, since the silicon nitride film SN1 is formed on the polysilicon film PL1 of the dummy gate GED, no metal silicide layer is formed on the surface of the polysilicon film PL1 of the dummy gate GED.

Figure 55:
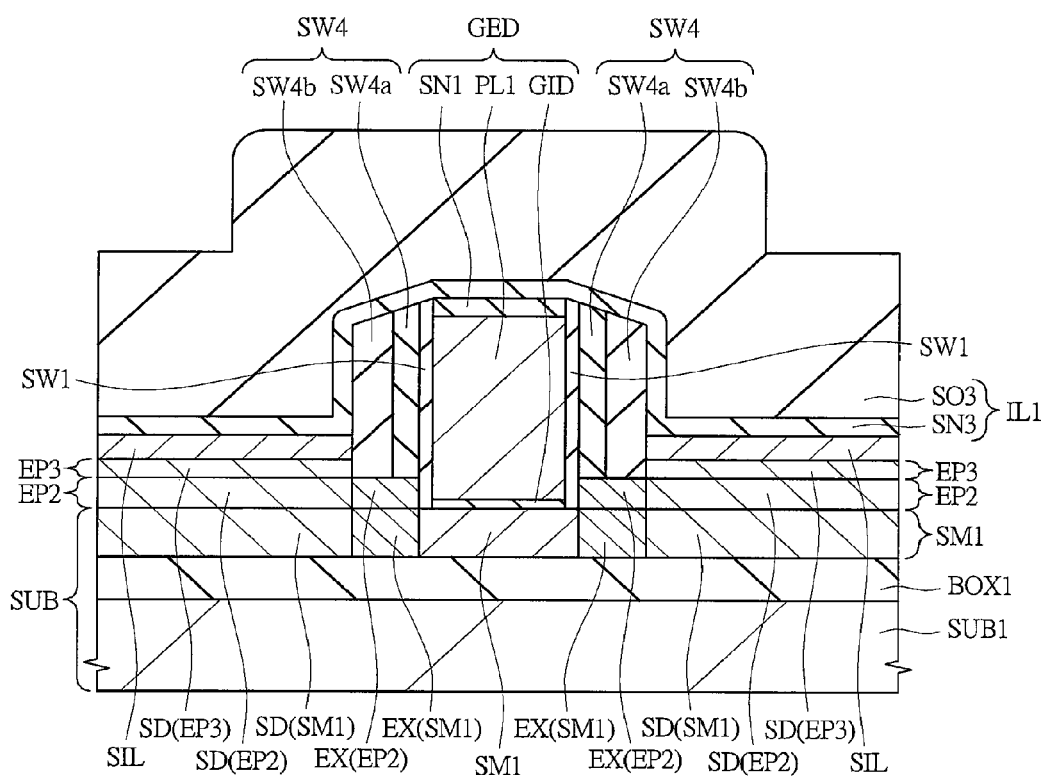
FIG. 55 is a cross-sectional view of main parts in the process of manufacturing the semiconductor device continued from FIG. 54.

Next, as depicted in FIG. 55, as with the above-described first embodiment, the insulating film ELI is formed on the main surface (entire surface of the main surface) of the SOI substrate SUB (step S11 of FIG. 47). That is, the insulating film IL1 is formed on the main surface of the SOI substrate SUB so as to cover the dummy gate GED and the sidewall insulating films SW1 and SW4. Since the insulating film IL1 has been described in the above-described first embodiment, its repeated description is omitted herein.

Figure 56:
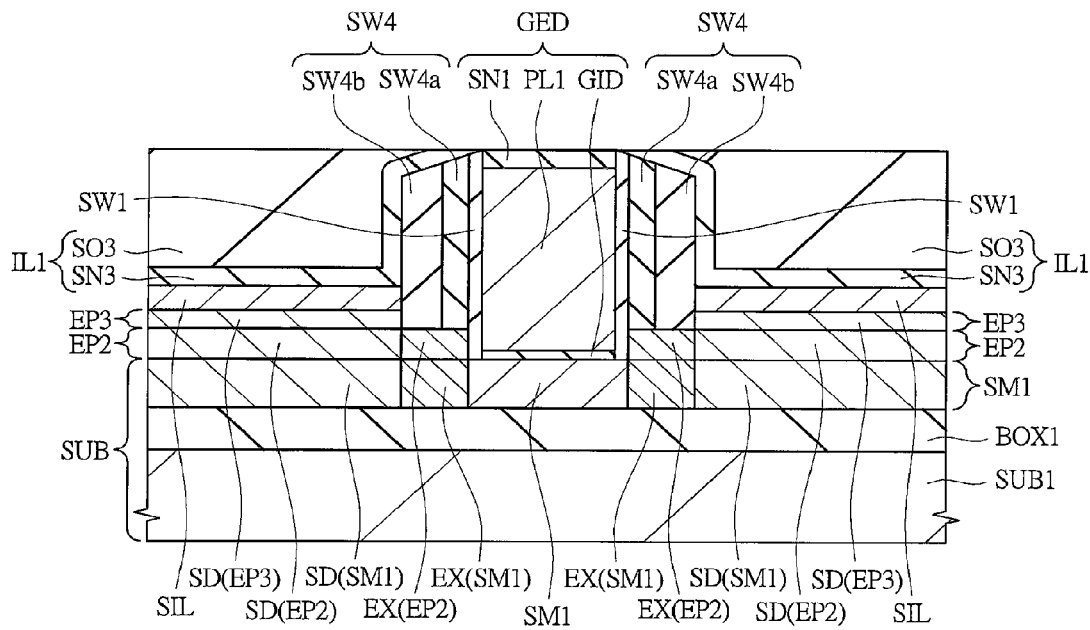
FIG. 56 is a cross-sectional view of main parts in the process of manufacturing the semiconductor device continued from FIG. 55.

Next, as depicted in the above-described FIG. 56, as with the above-described first embodiment, by polishing the surface (upper surface) of the insulating film IL1 with a CMP technique, the upper surface of the dummy gate GED (that is, the upper surface of the silicon nitride film SN1) is exposed (step S12 of FIG. 47).

Figure 57:
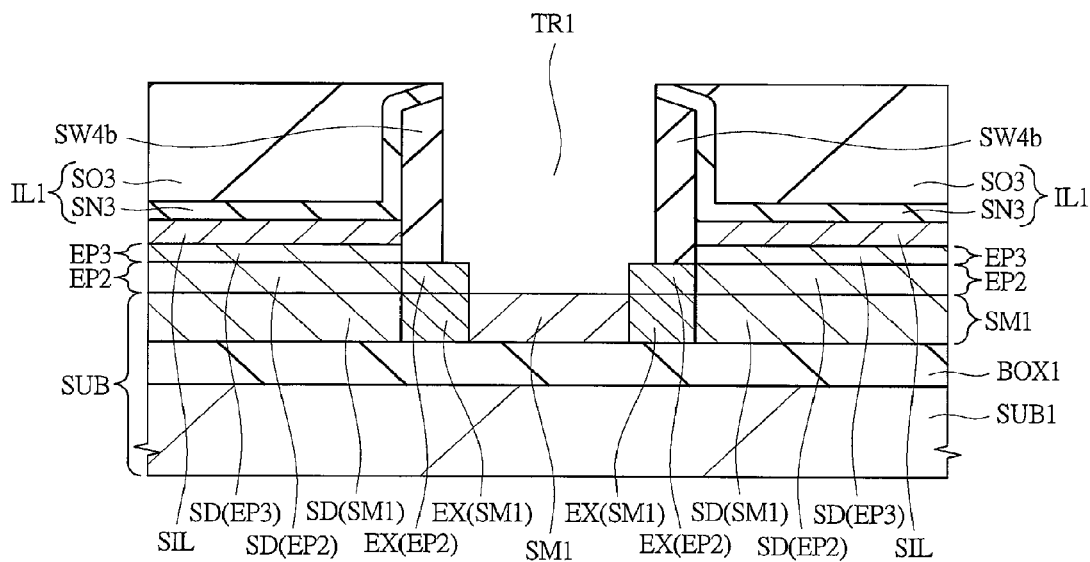
FIG. 57 is a cross-sectional view of main parts in the process of manufacturing the semiconductor device continued from FIG. 56.

Next, as depicted in FIG. 57, the dummy gate GED and the sidewall insulating films SW1 and SW4a are removed by etching (step S13a of FIG. 47).

By removing the dummy gate GED and the sidewall insulating films SW1 and SW4a at this step S13a, a trench (recessed part, opening, or depressed part) TR1 is formed. The trench TR1 is formed of a region (space) where the dummy gate GED and the sidewall insulating films SW1 and SW4a used to be present before removal of the dummy gate GED and the sidewall insulating films SW1 and SW4a. From the trench TR1, the upper surface of the semiconductor layer SM1, the side surface and the upper surface of the semiconductor layer EP2, and the inner wall of the sidewall insulating film SW4b are exposed.

The bottom surface of the trench TR1 is formed of the upper surface of the semiconductor layer SM1 and the side surface and the upper surface of the semiconductor layer EP2. The side surface (sidewall) of the trench TR1 is formed of the inner wall of the sidewall insulating film SW4a. On the bottom surface of the trench TR1, a step part is formed of the side surface and the upper surface of the semiconductor layer EP2. Here, the inner wall of the sidewall insulating film SW4b corresponds to the side surface (sidewall) of the sidewall insulating film SW4b which used to be in contact with the sidewall insulating film SW4a until the sidewall insulating film SW4a is removed.

The etching process at step S13a is specifically described below.

Etching at step S13a is preferably performed by the following three stages (a first stage, a second stage, and a third stage, refer to FIG. 58 to FIG. 60) of etching.

Figure 58:
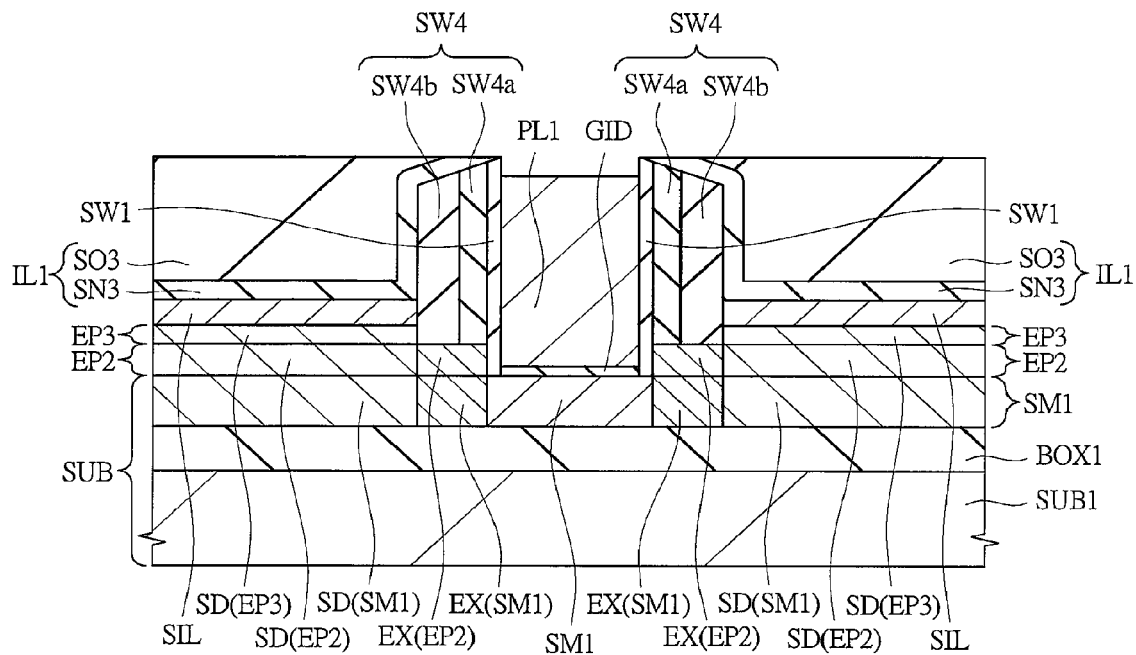
FIG. 58 is a cross-sectional view of main parts in the process of manufacturing the semiconductor device continued from FIG. 57.

First, as the first stage of etching at step S13a, the silicon nitride film SN1 of the dummy gate GED is removed, as depicted in FIG. 58. This first stage of etching in the third embodiment is also similar to that (the first stage of etching at the above-described step S13) of the above-described first embodiment. By the first stage of etching, the silicon nitride film SN1 is removed, and the polysilicon film PL1 is exposed.

Figure 59:
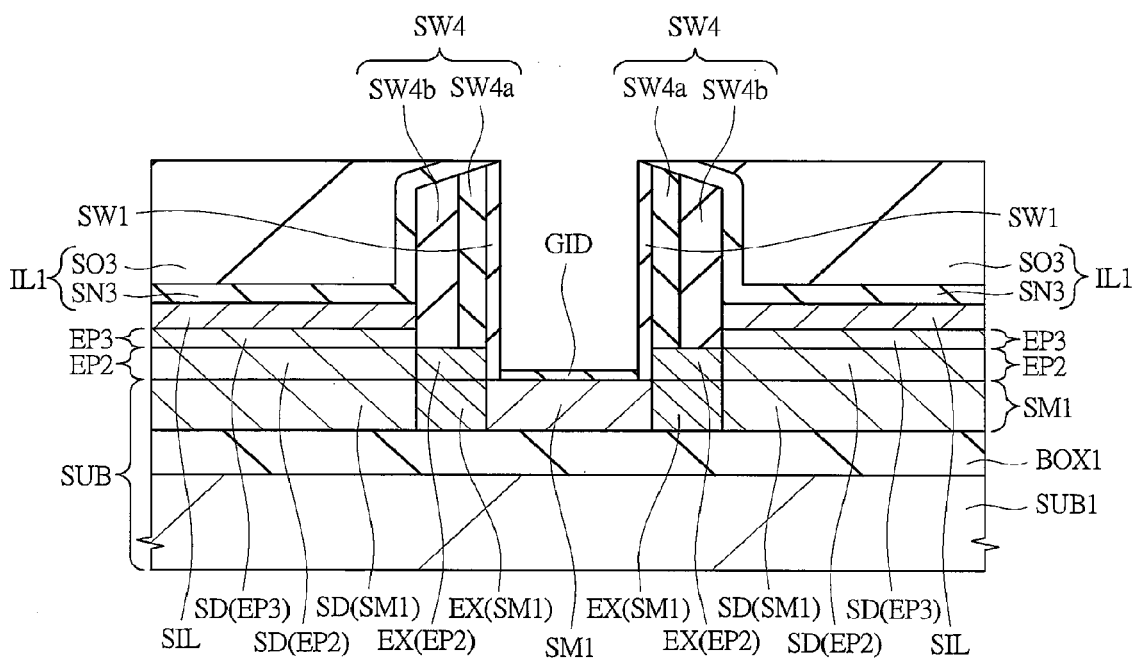
FIG. 59 is a cross-sectional view of main parts in the process of manufacturing the semiconductor device continued from FIG. 58.

Next, as the second stage of etching at step S13a, the polysilicon film PL1 of the dummy gate GED is removed, as depicted in FIG. 59. This second stage of etching in the third embodiment is also similar to that (the second stage of etching at the above-described step S13) of the above-described first embodiment. By the second stage of etching, the polysilicon film PL1 is removed, and the sidewall insulating film SW1 and the insulating film GID are exposed.

Figure 60:
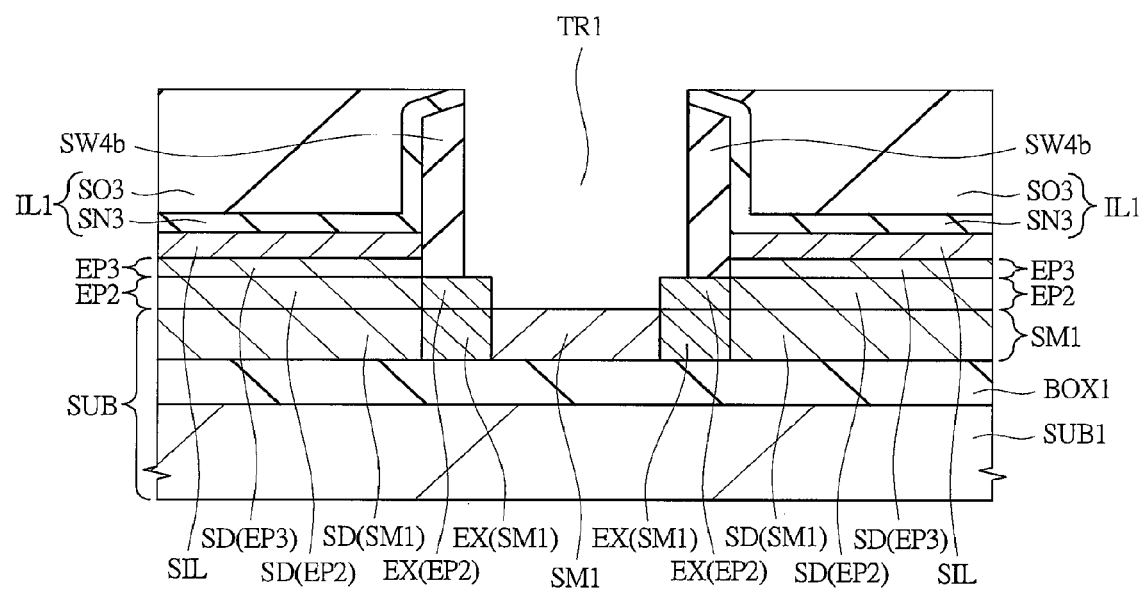
FIG. 60 is a cross-sectional view of main parts in the process of manufacturing the semiconductor device continued from FIG. 59.

The third stage of etching at step S13a is slightly different from the third stage at step S13 of the above-described first embodiment. In the etching process at step S13a, after the polysilicon film PL1 is removed in the second stage of etching, the etching conditions are changed, and the sidewall insulating films SW1 and SW4a and the insulating film GID are removed by the third stage of etching, as depicted in FIG. 60. In this third stage of etching, the insulating films SW1 and SW4a and the insulating film GID are preferably etched selectively with etching conditions in which the etching speed of the insulating films SW1 and SW4a and the insulating film GID is faster than the etching speed of the semiconductor layers SM1 and EP2. With this, the semiconductor layers SM1 and EP1 can be inhibited or prevented from being etched by the third stage of etching. If the sidewall insulating film SW1 and the sidewall insulating film SW4a are formed of the same material (here, silicon oxide), the sidewall insulating film SW1 and the sidewall insulating film SW4a can be continuously etched with the same etching processing. Also, if the insulating film GID and the sidewall insulating films SW1 and SW4a are formed of the same material (here, silicon oxide), the insulating film GID can be removed in the same etching processing for removing the sidewall insulating films SW1 and SW4a.

Also in the third stage of etching, while the sidewall insulating films SW1 and SW4a are removed, the sidewall insulating film SW4b is preferably left. Thus, in the third embodiment, the sidewall insulating film SW4b is formed of a material different from that of the sidewall insulating film SW4a, and the third stage of etching is performed with etching conditions in which the etching speed of the sidewall insulating films SW1, SW4a (specifically, silicon oxide) is faster than the etching speed of the sidewall insulating film SW4b (specifically, silicon nitride) and the semiconductor layers SM1 and EP2. Here, since the sidewall insulating films SW1 and SW4a are formed of silicon oxide and the sidewall insulating film SW4b is formed of silicon nitride, it is easy to ensure a high etching selection ratio between the sidewall insulating films SW1 and SW4a and the sidewall insulating film SW4b. That is, in the third stage of etching, the sidewall insulating films SW1 and SW4a can be etched, and the sidewall insulating film SW4b can function as an etching stopper. Also, since the sidewall insulating films SW1 and SW4a are formed of silicon oxide, it is also easy to ensure a high etching selection ratio between the sidewall insulating films SW1 and SW4a and the semiconductor layers SM1 and EP2.

By removing the dummy gate GED, the insulating film GID, and the sidewall insulating films SW1 and SW4a with the above-described three stages (the first stage, the second stage, and the third stage) of etching at step S13a, the trench TR1 is formed as depicted in FIG. 57 and FIG. 60.

Figure 61:
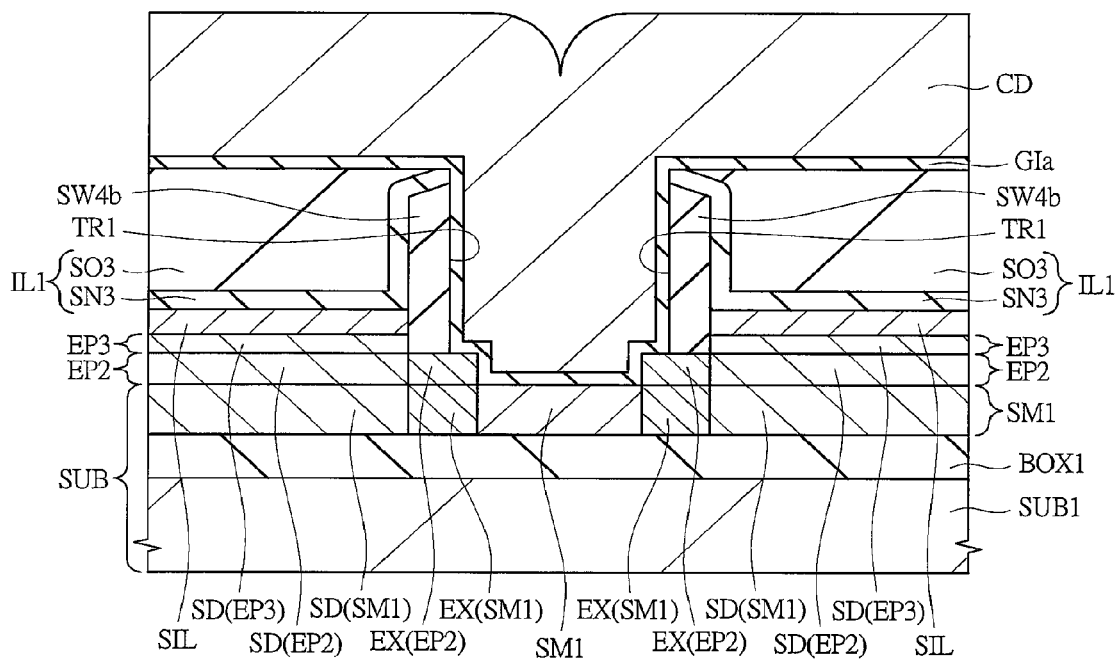
FIG. 61 is a cross-sectional view of main parts in the process of manufacturing the semiconductor device continued from FIG. 57 and FIG. 60.

Next, as with the above-described first embodiment, as depicted in FIG. 61, the insulating film GIa for the gate insulating film is formed on the main surface (entire surface of the main surface) of the SOI substrate SUB including the bottom surface and the side surface (sidewall) of the trench TR1, that is, on the insulating film IL1 including the bottom and the sidewall of the trench TR1 (step S14 of FIG. 47). Since the insulating film GIa has been described in the above-described first embodiment, its repeated description is omitted therein.

Next, as with the above-described first embodiment, the gate-electrode conductive film CD is formed on the main surface of the SOI substrate SUB, that is, on the insulating film GIa, so as to fill the trench TR1 (step S15 of FIG. 47). Since the conductive film CD has been described in the above-described first embodiment, its repeated description is omitted herein.

Figure 62:
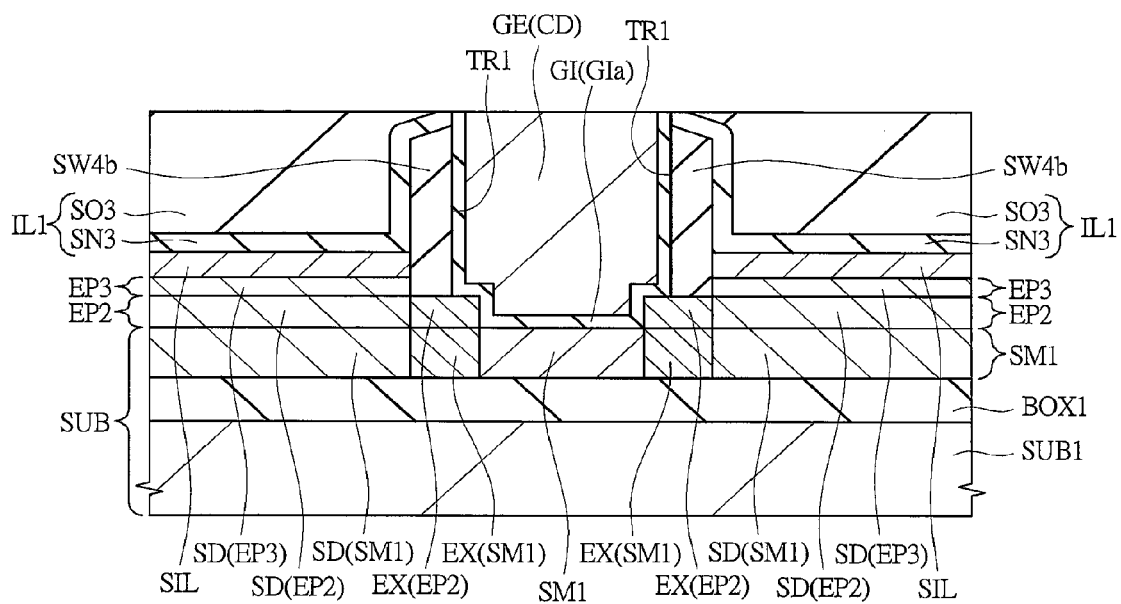
FIG. 62 is a cross-sectional view of main parts in the process of manufacturing the semiconductor device continued from FIG. 61.

Next, as depicted in FIG. 62, the gate electrode GE and the gate insulating film GI are formed by leaving the conductive film CD and the insulating film GIa in the trench TR1 and removing the conductive film CD and the insulating film GIa outside the trench TR1 by a CMP technique or the like (step S16 of FIG. 47). Since step S16 in the third embodiment is similar to that of the above-described first embodiment, its repeated description is omitted herein. Step S16 is a process of forming the gate electrode GE in the trench TR1 via the gate insulating film GI.

The conductive film CD left in the trench TR1 serves as the gate electrode GE, and the insulating film GIa left in the trench TR1 serves as the gate insulating film GI. And, the gate insulating film GI is in a state of being interposed between the gate electrode GE and (the upper surface of) the semiconductor layer SM1, between the gate electrode GE and (the side surface and the upper surface of) the semiconductor layer EP2, and between the gate electrode GE and (the inner wall of) the sidewall insulating film SW4b. The gate electrode GE and the gate insulating film GI function as a gate electrode and a gate insulating film, respectively, of the MISFET.

A channel region of the MISFET is formed in the semiconductor layer SM1 positioned below the gate electrode GE via the gate insulating film GI (insulating film GIa). Also, a semiconductor region (impurity diffusion layer) which functions as a source or drain of the MISFET is formed of the $n^-$-type semiconductor region EX and the $n^+$-type semiconductor region SD with an impurity concentration higher than that of the former region, and has an LDD structure.

In this manner, an n-channel-type MISFET is formed.

In the present embodiment, the sidewall insulating film SW4a formed on the sidewall of the dummy gate GED and positioned on the semiconductor layer EP2 is removed at step S13a together with the dummy gate GED, and the gate electrode GE is formed in that removed region (trench TR1). Thus, the gate electrode GE can be formed not only in the region where the dummy gate GED used to be present but also in the region where the sidewall insulating film SW4a used to be present. Thus, the dimension of the gate electrode GE in the gate length direction can be made longer than the dimension of the dummy gate GED, and part of the gate electrode GE (on both end sides in the gate length direction) is positioned on the semiconductor layer EP2, that is, rides onto the semiconductor layer EP2. Therefore, the end parts of the gate electrode GE in the gate length direction are positioned on the semiconductor layer EP1. And, at least part of the $n^-$-type semiconductor region EX is positioned straight below the gate electrode GE.

Figure 63:
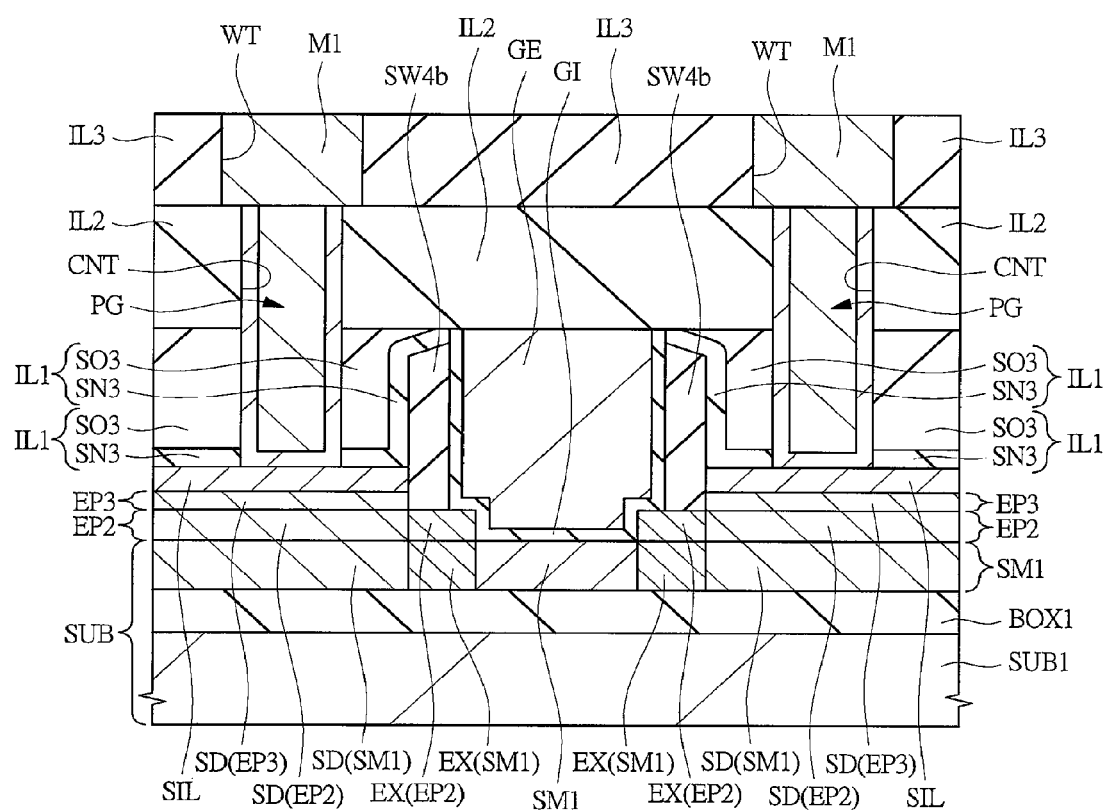
FIG. 63 is a cross-sectional view of main parts in the process of manufacturing the semiconductor device continued from FIG. 62.

Subsequent processes are substantially similar to those of the above-described first embodiment. That is, as depicted in FIG. 63, as with the above-described first embodiment, the above-described insulating film IL2 is formed, the above-described contact hole CNT is formed, the above-described plug PG is formed in the contact hole CNT, the above-described insulating film IL3 is formed, and the above-described wiring M1 is formed.

Figure 64:
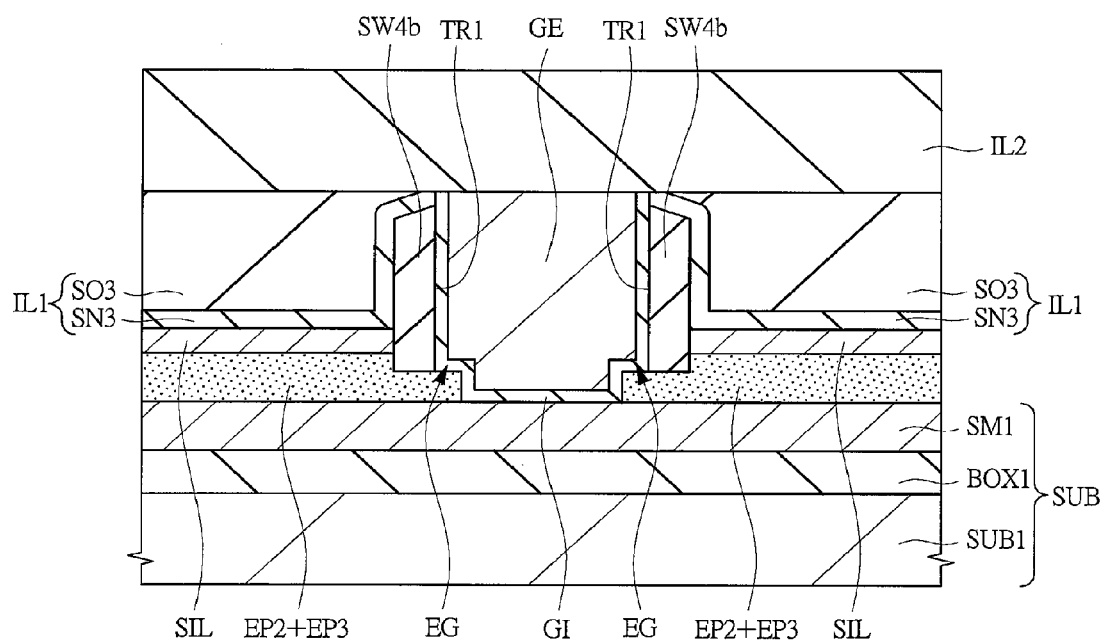
FIG. 64 is a cross-sectional view of main parts in the process of manufacturing the semiconductor device of the third embodiment.
Figure 65:
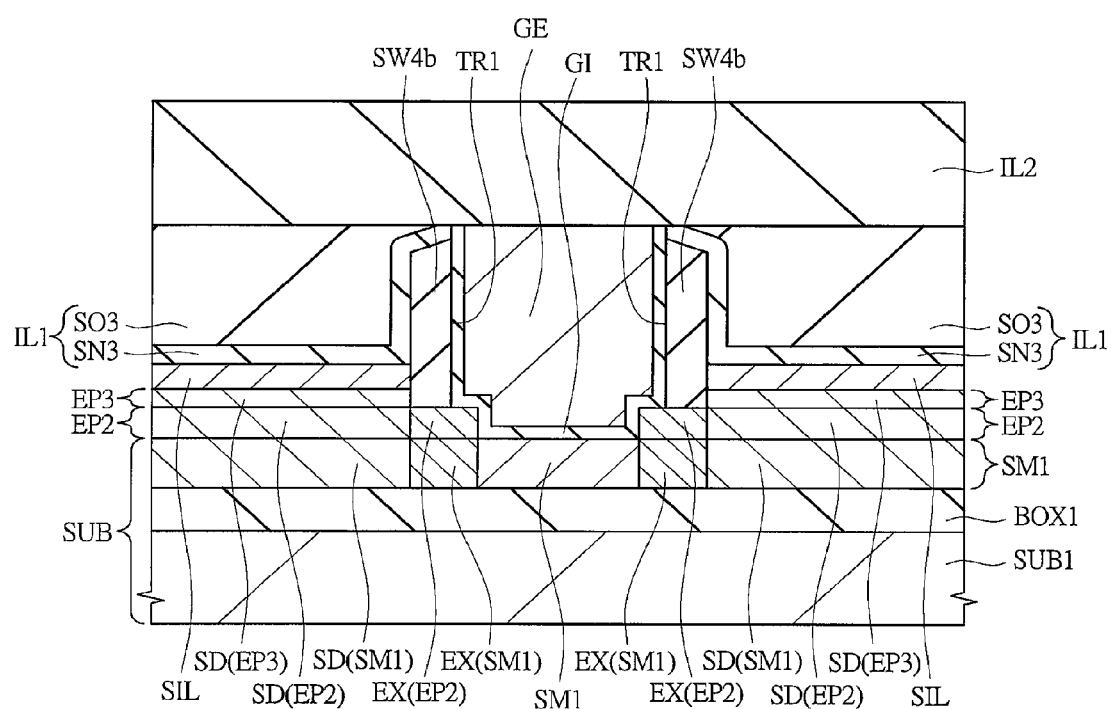
FIG. 65 is a cross-sectional view of main parts in the process of manufacturing the semiconductor device of the third embodiment.

FIG. 64 and FIG. 65 are cross-sectional views of main parts of the semiconductor device according to the third embodiment. FIG. 64 corresponds to the above-described FIG. 1, and FIG. 65 corresponds to the above-described FIG. 2.

However, in FIG. 64, in order to make respective regions of the semiconductor layer SM1 and the semiconductor layers EP2 and EP3 easily understood, an entire combination of the semiconductor layer EP2 and the semiconductor layer EP3 is hatched with dots, and the entire semiconductor layer SM1 is hatched with fine diagonal lines. Therefore, in FIG. 1, formation regions of the $n^-$-type semiconductor region EX and the $n^-$-type semiconductor region SD are not depicted. Also, in FIG. 65, in order to make respective regions of the $n^-$-type semiconductor region EX and the $n^-$-type semiconductor region SD easily understood, the entire $n^-$-type semiconductor region EX is hatched in a same manner, and the entire $n^+$-type semiconductor region SD is hatched in another same manner. Therefore, by viewing FIG. 64 and FIG. 65 together, the structures of the semiconductor layers SM1, EP2, and EP3 and the formation regions of the $n^-$-type semiconductor region EX and the $n^+$-type semiconductor region SD in the semiconductor layers SM1, EP2, and EP3 can be easily understood. Note in FIG. 64 and FIG.

64 that structures of the above-described insulating film IL3 and wiring M1 and thereabove are not depicted.

Main differences between the semiconductor device of the third embodiment depicted in FIG. 64 and FIG. 65 and the semiconductor device of the above-described first embodiment depicted in the above-described FIG. 1 and FIG. 2 are as follows. Note that common points are not described herein.

In the semiconductor device of the above-described first embodiment, as depicted in the above-described FIG. 1 and FIG. 2, the semiconductor layer EP1 is formed on the semiconductor layer SM1 of the SOI substrate SUB as a source/drain epitaxial layer. And, the end parts (both ends in the gate length direction) of the gate electrode GE ride onto the semiconductor layer EP1. That is, the end parts of the gate electrode GE in the gate length direction are positioned on the semiconductor layer EP1, which is a source/drain epitaxial layer.

On the other hand, in the semiconductor device of the third embodiment, as depicted in FIG. 64 and FIG. 65, two layers, that is, the semiconductor layer EP2 on the semiconductor layer SM1 and the semiconductor layer EP3 on the semiconductor layer EP2, are formed on the semiconductor layer SM1 of the SOI substrate SUB as a source/drain epitaxial layer. And, the end parts (both ends in the gate length direction) of the gate electrode GE ride onto the semiconductor layer EP2. That is, the end parts of the gate electrode GE in the gate length direction are positioned on the semiconductor layer EP2, which is a source/drain epitaxial layer. Note that the end parts of the gate electrode GE in the gate length direction are provided with a character EG in FIG. 64 and denoted as the end parts EG.

Also in the above-described first embodiment, as depicted in the above-described FIG. 1 and FIG. 2, part of the gate electrode GE, sidewall insulating film SW3, and a portion of the gate insulating film GI positioned between the gate electrode GE and the sidewall insulating film SW3 are present on the semiconductor layer EP1.

On the other hand, in the semiconductor device of the third embodiment, as depicted in FIG. 64 and FIG. 65, part of the gate electrode GE, sidewall insulating film SW4$b$, and a portion of the gate insulating film GI positioned between the gate electrode GE and the sidewall insulating film SW4$b$ are present on the semiconductor layer EP2.

Furthermore, in the above-described first embodiment, part (both ends) of the gate electrode GE rides onto the tilted side surface SF1 of the semiconductor layer EP1. On the other hand, in the third embodiment, the side surface of the semiconductor layer EP2 is not tilted, and part (both ends) of the gate electrode rides onto the upper surface of the semiconductor layer EP2.

Still further, in the above-described first embodiment, the insulating film IL1 is formed on the SOI substrate SUB so as to cover the semiconductor layer EP1, and the gate electrode GE is buried in the trench TR formed in the insulating film IL. On the other hand, in the third embodiment, the insulating film IL1 is formed on the SOI substrate SUB so as to cover the semiconductor layers EP2 and EP3, and the gate electrode GE is buried in the trench TR1 formed in the insulating film IL1. Also, in the above-described first embodiment, the gate insulating film GI is formed on the side surface and the bottom surface of the trench TR, and the gate electrode GE is buried in the trench TR via the insulating film GI. On the other hand, in the third embodiment, the gate insulating film GI is formed on the side surface and the bottom surface of the trench TR1, and the gate electrode GE is buried in the trench TR1 via the gate insulating film GI.

Also in the semiconductor device of the third embodiment as described above, from a reason substantially similar to that described in the above-described first embodiment, parasitic resistance between the source or drain semiconductor region and the channel region can be inhibited, and therefore the characteristics (electric characteristics) of the semiconductor device can be improved.

That is, also in the semiconductor device of the present embodiment, the end parts (both ends in the gate length direction) of the gate electrode GE ride onto the source/drain epitaxial layer (here, the semiconductor layer EP2). That is, the end parts of the gate electrode GE in the gate length direction are positioned on the source/drain epitaxial layer (here, the semiconductor layer EP2). In other words, in the gate length of the MISFET (MISFET with the gate electrode GE as a gate electrode), the end parts of the gate electrode GE are positioned on the source/drain epitaxial layer (here, the semiconductor layer EP2). And, this epitaxial layer (here, the semiconductor layer EP2) is formed on the upper surface of the semiconductor layer SM1, and the upper surface of this epitaxial layer (here, the semiconductor layer EP2) is positioned higher than the upper surface of the semiconductor layer SM1 straight below the gate electrode GE.

Thus, the gate electrode GE can be reliably made overlap with the source or drain semiconductor region (combination of the n$^-$-type semiconductor region EX and the n$^+$-type semiconductor region SD). With this overlapping, parasitic resistance between the source or drain semiconductor region and the channel region can be inhibited. Also, the thickness of the semiconductor layer at the overlapping portion between the source or drain semiconductor region (combination of the n$^-$-type semiconductor region EX and the n$^+$-type semiconductor region SD) and the gate electrode GE can be made thicker than the thickness of the semiconductor layer SM1 by the thickness of the semiconductor layer EP2 at that overlapping portion. Thus, parasitic resistance can be further inhibited. Therefore, the characteristics (electrical characteristics) of the semiconductor device including a MISFET can be improved. Furthermore, fluctuations in characteristics for each MISFET due to fluctuations of the value of parasitic resistance can also be inhibited. Therefore, the performance of the semiconductor device can be improved. Still further, also in the third embodiment, the structure in which the gate electrode GE rides onto the semiconductor layer EP2 can be formed in a self-aligned manner.

Also, after the semiconductor layer EP2 is formed, the sidewall insulating film SW4 is formed on the sidewall of the dummy gate GED, and then ion implantation is performed with this sidewall insulating film SW4 as a mask, thereby forming the n$^+$-type semiconductor region SD. In the third embodiment, the sidewall insulating film SW4 is formed of the sidewall insulating film SW4$a$ and the sidewall insulating film SW4$b$. Thus, the semiconductor layers EP2 and SM1 at a portion straight below the sidewall insulating films SW4$a$ and SW4$b$ serve as the n$^-$-type semiconductor region EX. And, at step S13, of the sidewall insulating films SW4$a$ and SW4$b$, the sidewall insulating film SW4$a$ is removed, and the sidewall insulating film SW4$b$ is left. Thus, while the gate electrode GE is formed in a region where the sidewall insulating film SW4$a$ used to be present, the gate electrode GE is not formed in a region where the sidewall insulating film SW4$b$ is present. Therefore, by adjusting a ratio in thickness between the sidewall insulating film SW4a and the sidewall insulating film SW4b, the overlapping amount between the n⁻-type semiconductor region EX and the gate electrode GE can be controlled at a desired value without changing the dimensions of the n⁻-type semiconductor region EX. Furthermore, since not only the gate insulating film GI but also the sidewall insulating film SW4a is interposed between the metal silicide film SIL and the gate electrode GE, withstand voltage between the gate electrode GE and the metal silicide layer SIL can be improved.

Also in the above-described first embodiment and fourth embodiment, which will be described further below, the sidewall insulating film SW4 of the third embodiment can be applied in place of the sidewall insulating film SW2. In this case, at the above-described step S13 and step S13b, which will be described further below, as with the step S13a of the third embodiment, the sidewall insulating film SW4a can be removed, and the sidewall insulating film SW4b can be left.

Furthermore, in the third embodiment, two layers, that is, the semiconductor layer EP2 and the semiconductor layer EP3, are formed as a source/drain epitaxial layer. With this, the following advantages can be obtained.

That is, in the third embodiment, after the semiconductor layer EP2 is formed, ion implantation for forming the n⁻-type semiconductor region EX is performed. Then, after the semiconductor layer EP3 is formed, ion implantation for forming the n⁺-type semiconductor region SD is performed. Thus, as for the semiconductor layer EP3, while ion implantation for forming the n⁺-type semiconductor region SD is performed, ion implantation for forming the n⁻-type semiconductor region EX is not performed. Therefore, compared with the case in which both ion implantations are performed, a seed crystal tends to be left even if amorphization proceeds with ion implantation. Thus, crystallization (single crystallization) can be easily promoted with the presence of the seed crystal at the time of activation annealing at step S8. Therefore, resistance of the source/drain region can be more lowered, and the performance of the semiconductor device can be further improved.

(Fourth Embodiment)

In the above-described first to third embodiments, the case has been described in which a MISFET is formed on the SOI substrate SUB. In the fourth embodiment, the case is described in which a MISFET is formed on a semiconductor device SUB2. Note that the above-described first, third, and fourth problems can be solved in the fourth embodiment.

Figure 66:
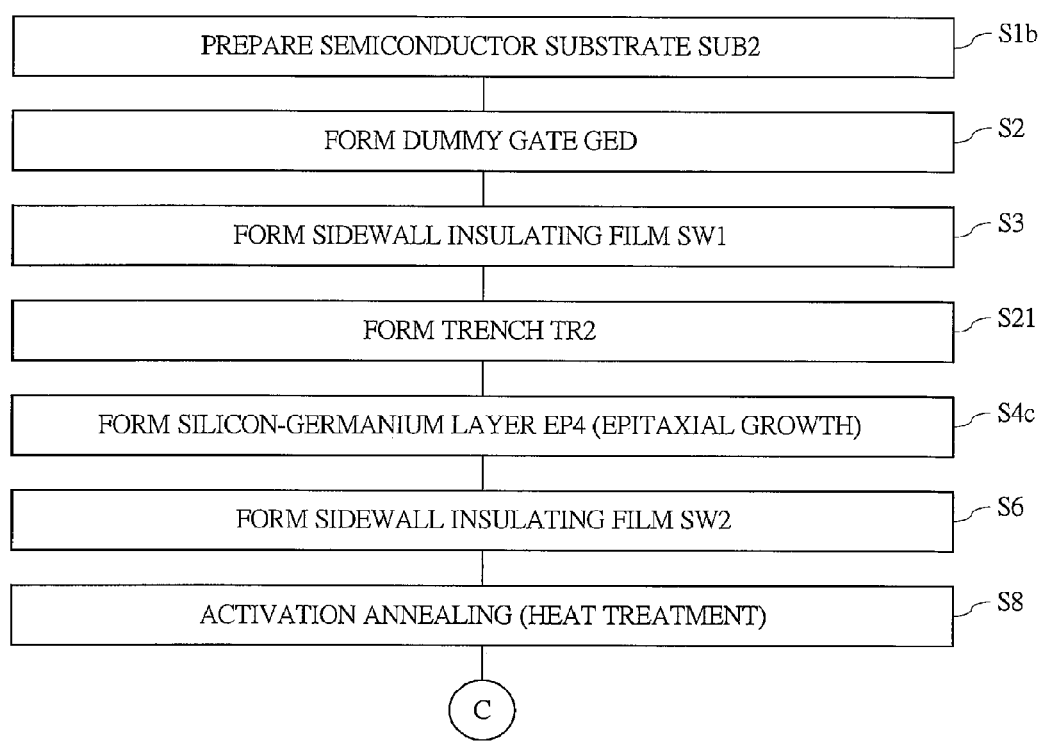
FIG. 66 is a process flow diagram of a process of manufacturing the semiconductor device of the fourth embodiment.
Figure 67:
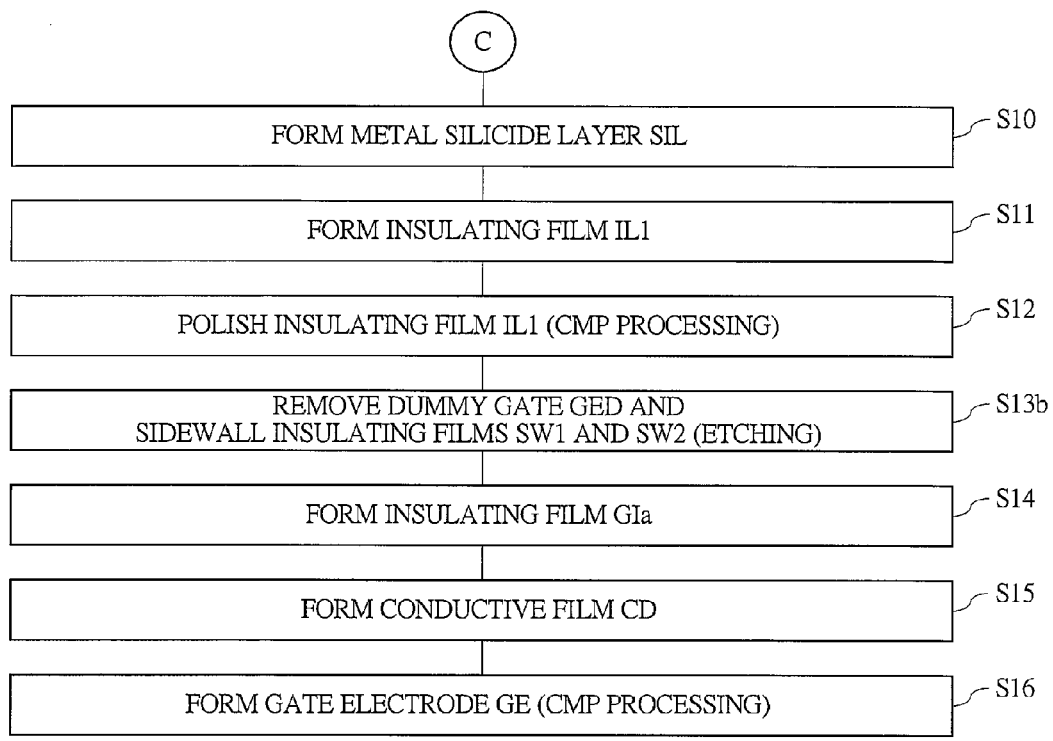
FIG. 67 is a process flow diagram of the process of manufacturing the semiconductor device of the fourth embodiment.

FIG. 66 and FIG. 67 are process flow diagrams of a process of manufacturing a semiconductor device of the fourth embodiment. FIG. 68 to FIG. 83 are cross-sectional views of main parts of the process of manufacturing the semiconductor device of the fourth embodiment.

Figure 68:
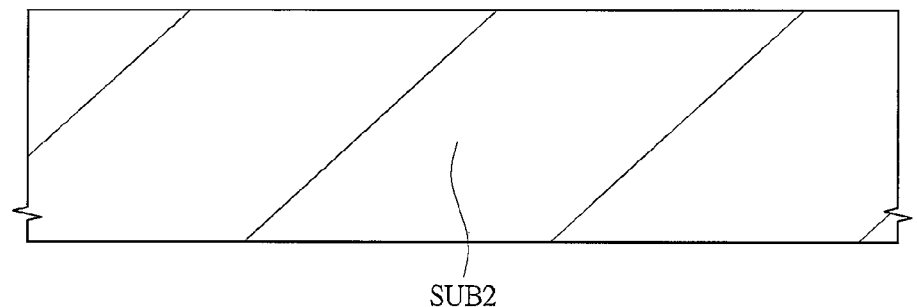
FIG. 68 is a cross-sectional view of main parts in the process of manufacturing the semiconductor device of the fourth embodiment.

First, as depicted in FIG. 68, a semiconductor substrate (semiconductor wafer) SUB2 made of p-type monocrystalline silicon with a resistivity on the order of, for example, 1 Ωcm to 10 Ωcm is prepared (step S1b of FIG. 66).

Next, an element isolation region (not depicted) is formed on the semiconductor substrate SUB2. The element isolation region can be formed by, for example, forming an element isolation trench in the main surface of the semiconductor substrate SUB2 by using a photolithography technique, dry etching technique, and so forth, and burying an insulating film in this element isolation trench by using a film forming technique, CMP technique, and so forth. In the semiconductor substrate SUB2, a MISFET is formed in the active region defined by the element isolation region, as described below.

Figure 69:
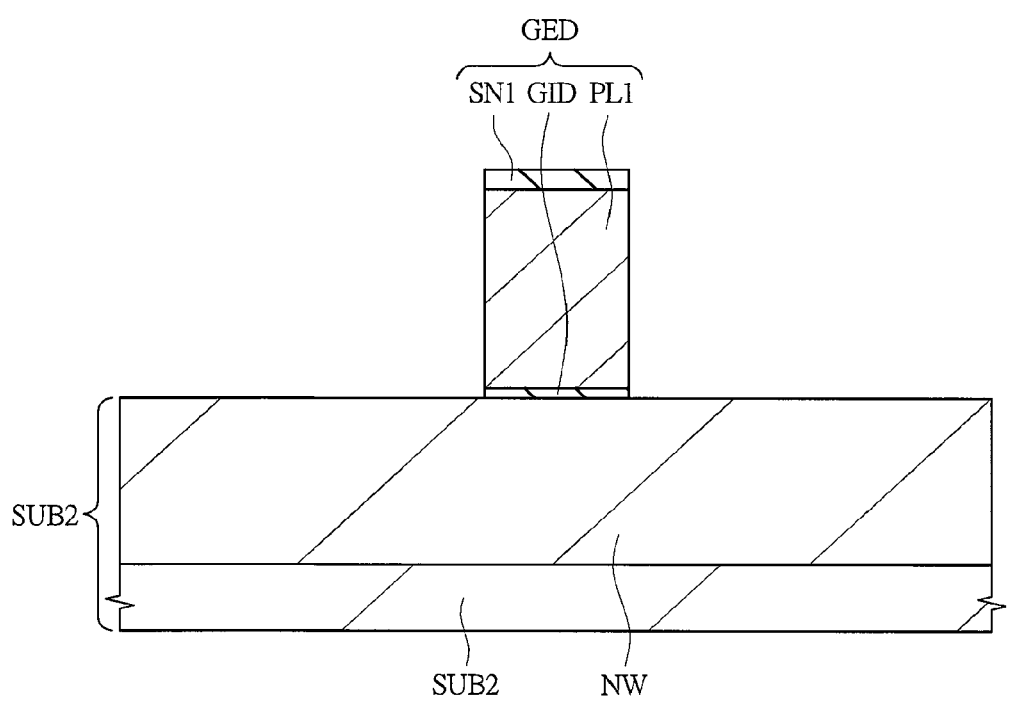
FIG. 69 is a cross-sectional view of main parts in the process of manufacturing the semiconductor device continued from FIG. 68.

Next, as depicted in FIG. 69, an n-type well NW is formed in the semiconductor substrate SUB2 in a region where a p-channel-type MISFET is scheduled to be formed. The n-type well NW can be formed by ion-implanting n-type impurities (for example, arsenic) in the semiconductor substrate SUB2.

Next, the dummy gate GED is formed on the semiconductor substrate SUB2 (step S2 of FIG. 66). The dummy gate GED is formed on the semiconductor substrate SUB2 (on the n-type well NW), and the formation method and structure of the dummy gate GED are similar to those of the above-described first embodiment.

Figure 70:
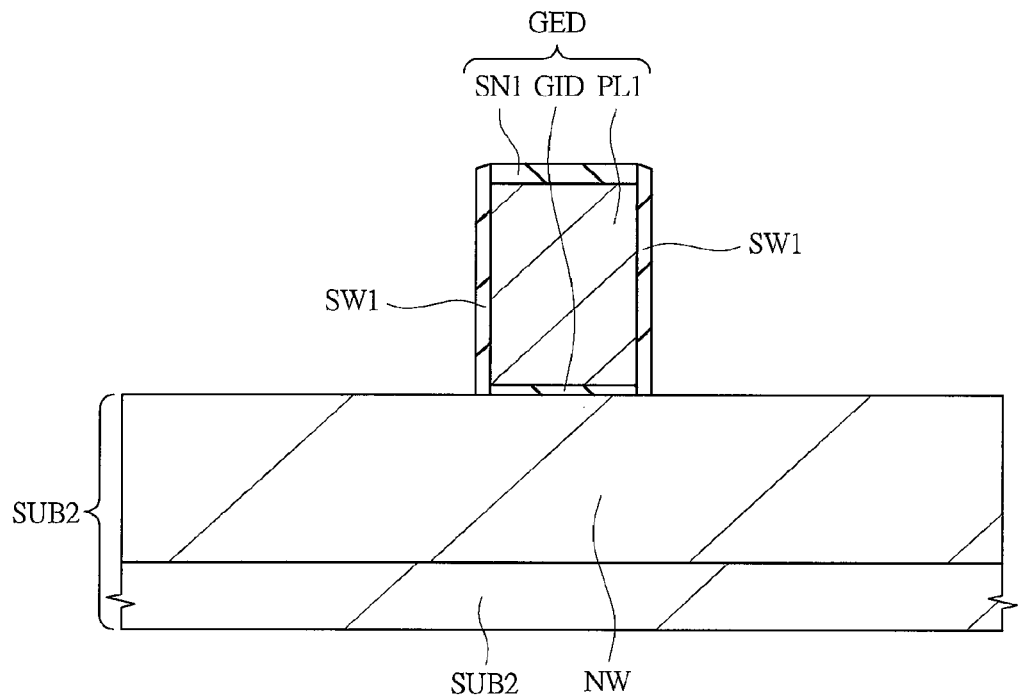
FIG. 70 is a cross-sectional view of main parts in the process of manufacturing the semiconductor device continued from FIG. 69.

Next, as depicted in FIG. 70, the sidewall insulating film SW1 is formed on the sidewall of the dummy gate GED as a sidewall film (step S3 of FIG. 66). The structure and formation method of the sidewall insulating film SW3 are similar to those of the above-described first embodiment, and its repeated description is omitted herein.

Figure 71:
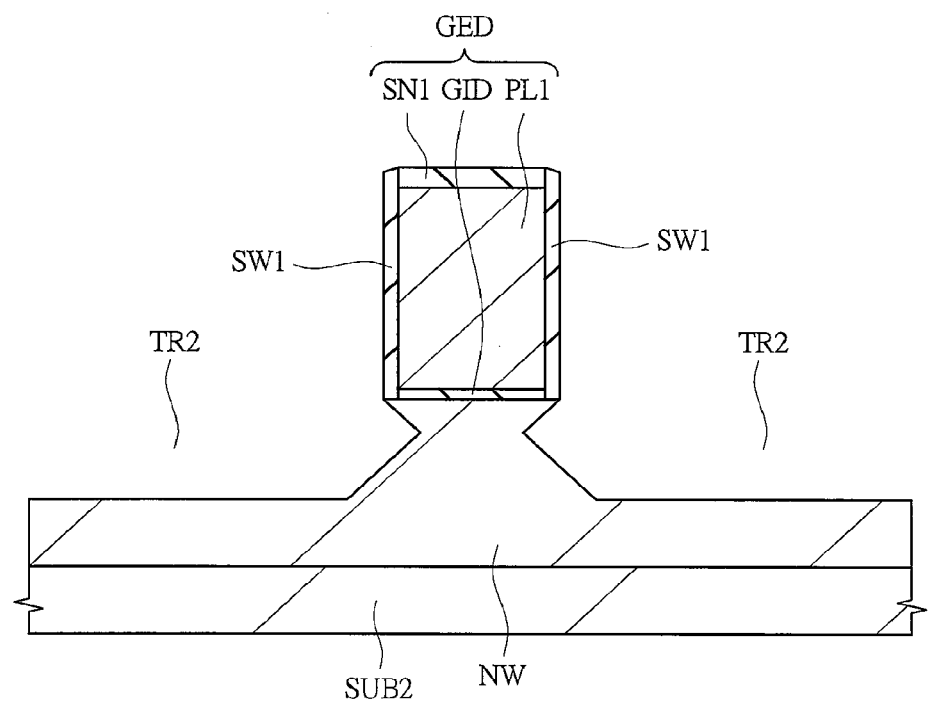
FIG. 71 is a cross-sectional view of main parts in the process of manufacturing the semiconductor device continued from FIG. 70.

Next, as depicted in FIG. 71, by performing either one of anisotropic dry etching and isotropic dry etching or a combination thereof, the semiconductor substrate SUB2 (n-type well NW) is etched to a predetermined depth to form a trench (substrate recessed part, substrate receding part, recessed part, or depressed part) TR2 (step S21 of FIG. 66).

At step S21, the dummy gate GED and the sidewall insulating film SW1 function as an etching mask. Thus, the trench TR2 is formed so as to be self-aligned to the sidewall insulating film SW1 on the sidewall of the dummy gate GED. However, when isotropic dry etching is performed, the trench TR is formed so as to slightly overlap with the sidewall insulating film SW1 and the dummy gate GED. On the bottom surface and the sidewall of the trench TR2, a Si substrate region (a portion of the semiconductor substrate SUB2 configuring the n-type well NW) is exposed. The depth of the trench TR2 can be on the order of, for example, 20 nm to 40 nm.

Figure 72:
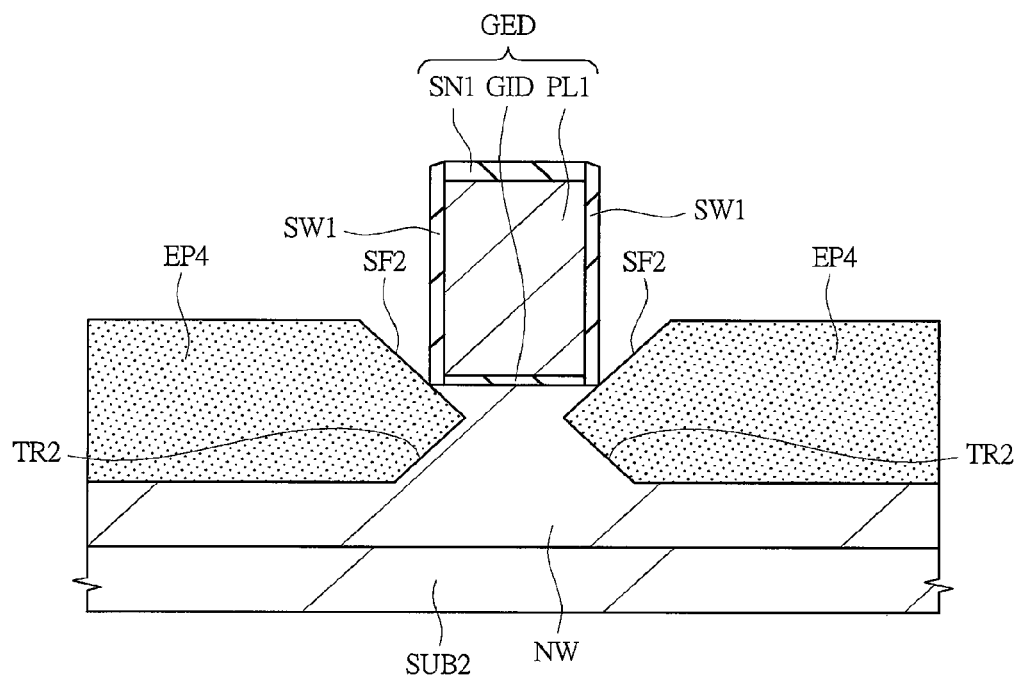
FIG. 72 is a cross-sectional view of main parts in the process of manufacturing the semiconductor device continued from FIG. 71.

Next, as depicted in FIG. 72, a silicon-germanium layer (SiGe layer, silicon-germanium region, or epitaxial silicon-germanium layer) EP4 is epitaxially grown as a semiconductor layer in the trench TR2 of the semiconductor substrate SUB2 (step S4c of FIG. 66).

The silicon-germanium layer EP4 is an epitaxial layer (epitaxial semiconductor layer) formed by epitaxial growth, and made of silicon germanium (monocrystalline silicon germanium). The silicon-germanium layer EP4 is epitaxially grown selectively on the Si substrate region exposed from the trench TR2 of the semiconductor substrate SUB2, and is not formed on the sidewall insulating film SW1 or on the silicon nitride film SN1. Also, as described in the above-described first embodiment, since the polysilicon film PL1 of the dummy gate GED is covered with the silicon nitride film SN1 and the sidewall insulating film SW1, an epitaxial layer is not formed on the polysilicon film PL1.

Also, the silicon-germanium layer EP4 is preferably formed so as to fill in the trench TR2 and so that the silicon-germanium layer EP4 swells more than the main surface of the semiconductor substrate SUB2 (upper surface of a portion of the semiconductor substrate SUB2 where the trench TR2 is not formed). In this case, the upper surface of the silicon-germanium layer EP4 formed at step S4c is positioned higher than the upper surface of the semiconductor substrate SUB2 straight below the dummy gate GED. For example, the silicon-germanium layer EP4 is formed so that the upper surface of the silicon-germanium layer EP4 is higher than the main surface of the semiconductor substrate SUB2 on the order of 10 nm to 40 nm.

Furthermore, while the silicon-germanium layer EP4 is formed so that the upper surface of the silicon-germanium layer EP4 is higher than the main surface of the semiconductor substrate SUB2, the silicon-germanium layer EP4 is preferably epitaxially grown so that the side surface SF2 of a portion of the silicon-germanium layer EP4 higher than the main surface of the semiconductor substrate SUB2 is tapered. That is, the side surface SF2 of the portion of the silicon-germanium layer EP4 higher than the main surface of the semiconductor substrate SUB2 is tilted with respect to the main surface of the semiconductor substrate SUB2. That is, the side surface SF2 of the silicon-germanium layer EP4 is preferably tilted so that the thickness of the silicon-germanium layer EP4 is increased as being away from the dummy gate GED. The taper of the side surface SF2 of the portion of the silicon-germanium layer EP4 higher than the main surface of the semiconductor substrate SUB2 can be controlled by adjusting the composition of film-formation gas of the silicon-germanium layer EP4, film-formation temperature, and so forth.

Furthermore, the silicon-germanium layer EP4 is preferably a silicon-germanium layer EP4 having conduction-type impurities introduced thereto by introducing doping gas at the time of epitaxial growth. To form a p-channel-type MISFET, a p-type silicon-germanium layer EP4 having p-type impurities introduced thereto is preferable. In this case, an ion implantation process for forming a source/drain region does not have to be performed.

Still further, the silicon-germanium layer is suitable as a semiconductor epitaxially grown in the trench TR2 of the semiconductor substrate SUB2. By using silicon germanium, for example, stress acting on a channel can be controlled.

That is, this technique is generally referred as a strained Si transistor using uniaxial stress. In the channel region of the p-channel-type MISFET of the fourth embodiment, compressive stress occurs by the silicon-germanium layer EP4 formed in the source and drain regions. With this compressive stress, the distance between Si atoms in the channel region is narrowed, thereby increasing the mobility of carriers (positive holes) flowing between the source and the drain. Therefore, the current flowing between the source and the drain can be increased. Note in the fourth embodiment that the value of stress occurring in the channel region is equal to or larger than −1.3 GP. Compared with the channel is not strained, the current is increased by 10% or higher.

Note in the fourth embodiment that while the p-channel-type MISFET is mainly taken as an example, when an n-channel-type MISFET is implemented, SiC (silicon carbide) is used in place of SiGe (silicon germanium). That is, in the case of the n-channel-type MISFET, a SiC layer is used in place of the silicon-germanium layer EP4. In this case, in the channel region of the n-channel-type MISFET, tensile stress occurs by the SiC layer formed in the source and drain regions. With this tensile stress, the distance between Si atoms in the channel region is widened, thereby increasing the mobility of carriers (electrons) flowing between the source and the drain. Therefore, the current flowing between the source and the drain can be increased. Note that the value of stress occurring at that time in the channel region is equal to or larger than +1.3 GP. Compared with the channel is not strained, the current is increased by 10% or higher.

Also, by forming the above-described SiGe layer and SiC layer by epitaxial growth, strong stress can be caused. That is, strong stress cannot be caused when a Si layer is simply epitaxially growth and then Ge or C ion implantation is performed.

Furthermore, in the fourth embodiment, of the p-channel-type MISFET and the n-channel-type MISFET, the above-described SiGe layer may be used only for the p-channel-type MISFET, the above-described SiC layer may be used only for the n-channel-type MISFET, or the above-described SiGe layer may be used for the p-channel-type MISFET and the above-described SiC layer may be used for the n-channel-type MISFET.

Figure 73:
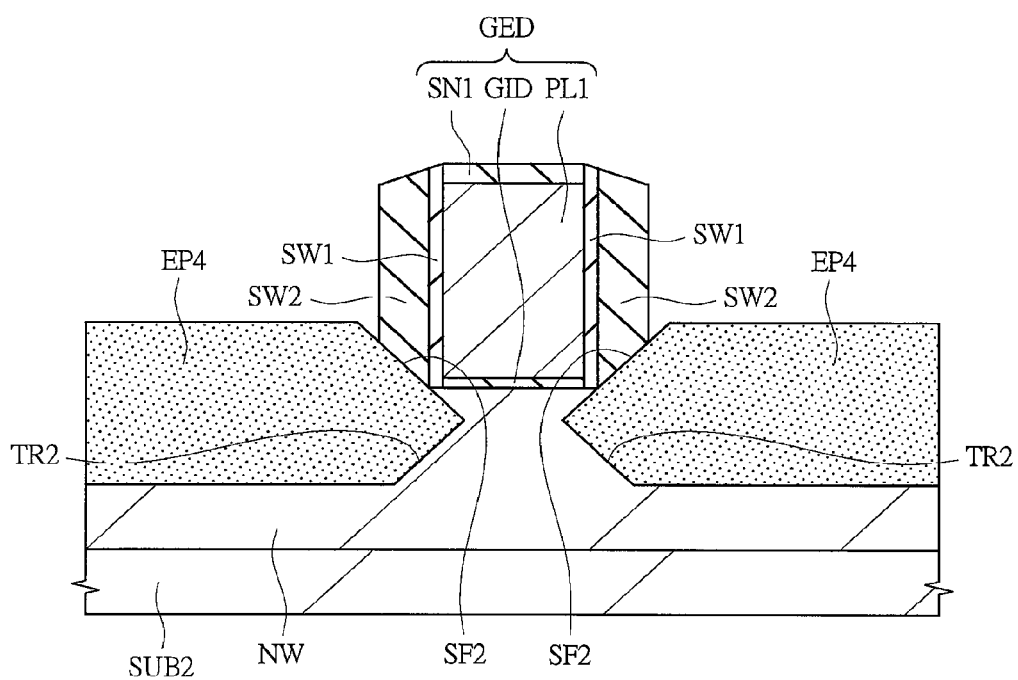
FIG. 73 is a cross-sectional view of main parts in the process of manufacturing the semiconductor device continued from FIG. 72.

Next, as depicted in FIG. 73, the sidewall insulating film SW2 is formed on the sidewall of the dummy gate GED as a sidewall film (step S6 of FIG. 66). The structure and formation method of the sidewall insulating film SW2 are basically identical to those of the above-described first embodiment. However, while the bottom surface of the sidewall insulating film SW2 is in contact with the semiconductor layer EP1 in the above-described first embodiment, the bottom surface of the sidewall insulating film SW2 is in contact with the silicon-germanium layer EP4 in the fourth embodiment.

That is, in the fourth embodiment, the sidewall insulating film SW2 is adjacent to the sidewall of the dummy gate GED via the sidewall insulating film SW1, and is formed on the silicon-germanium layer EP4 (specifically, the tilted side surface SF2 of the silicon-germanium layer EP4). That is, the bottom surface of the sidewall insulating film SW2 is in contact with the silicon-germanium layer EP4 (specifically, the tilted side surface SF2 of the silicon-germanium layer EP4), and the inner wall (side surface facing the dummy gate GED) of the sidewall insulating film SW2 is in contact with the sidewall insulating film SW1 on the sidewall of the dummy gate GED.

Next, activation annealing is performed, which is a heat treatment for activating the impurities introduced to the silicon-germanium layer EP4 and so forth (step S8 of FIG. 66).

Note that when ion implantation is not performed after the sidewall insulating film SW2 is formed at step S6 and before the metal silicide layer SIL is formed at step S10 which is described later, activation annealing at step S8 can be performed before the sidewall insulating film SW2 is formed at step S6 and after the silicon-germanium layer EP4 is formed at step S4c.

Figure 74:
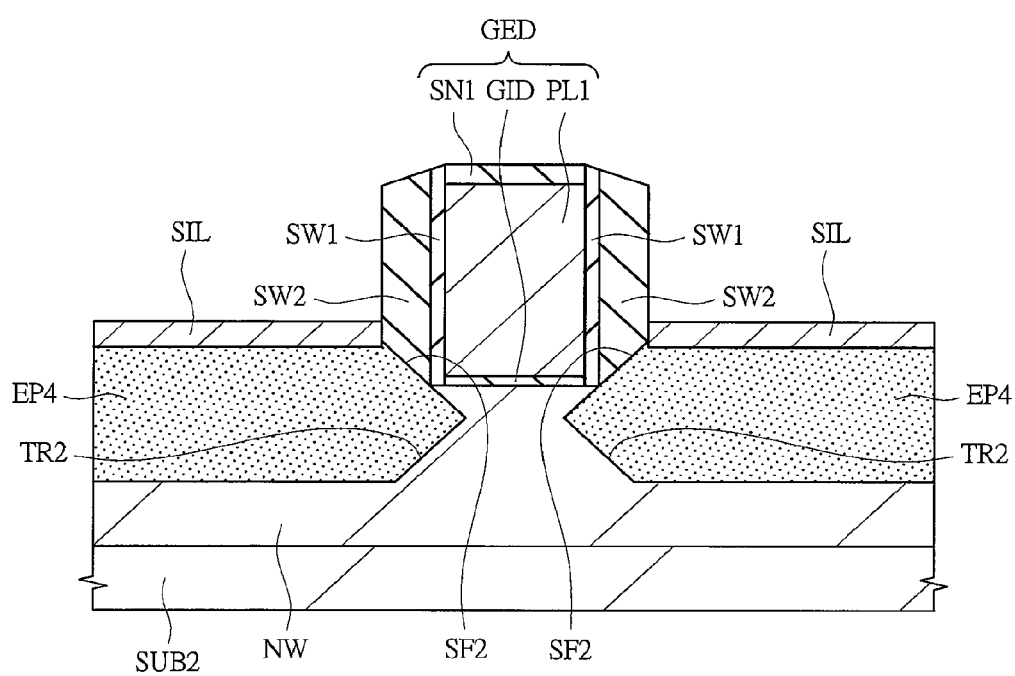
FIG. 74 is a cross-sectional view of main parts in the process of manufacturing the semiconductor device continued from FIG. 73.

Next, as depicted in FIG. 74, the metal silicide layer SIL is formed on a surface (upper layer part) of the silicon-germanium layer EP4 by Salicide technique (step S10 of FIG. 67).

The metal silicide layer SIL forming process at step S10 in the fourth embodiment is basically identical to that of the above-described first embodiment. However, while the metal silicide layer SIL is formed mainly in the semiconductor layer EP1 in the above-described first embodiment, the metal silicide layer SIL is formed in the silicon-germanium layer EP4 in the third embodiment. Also, as with the above-described first embodiment, since the silicon nitride film SN1 is formed on the polysilicon film PL1 of the dummy gate GED, a metal silicide layer is not formed on the surface of the polysilicon film PL1 of the dummy gate GED.

Figure 75:
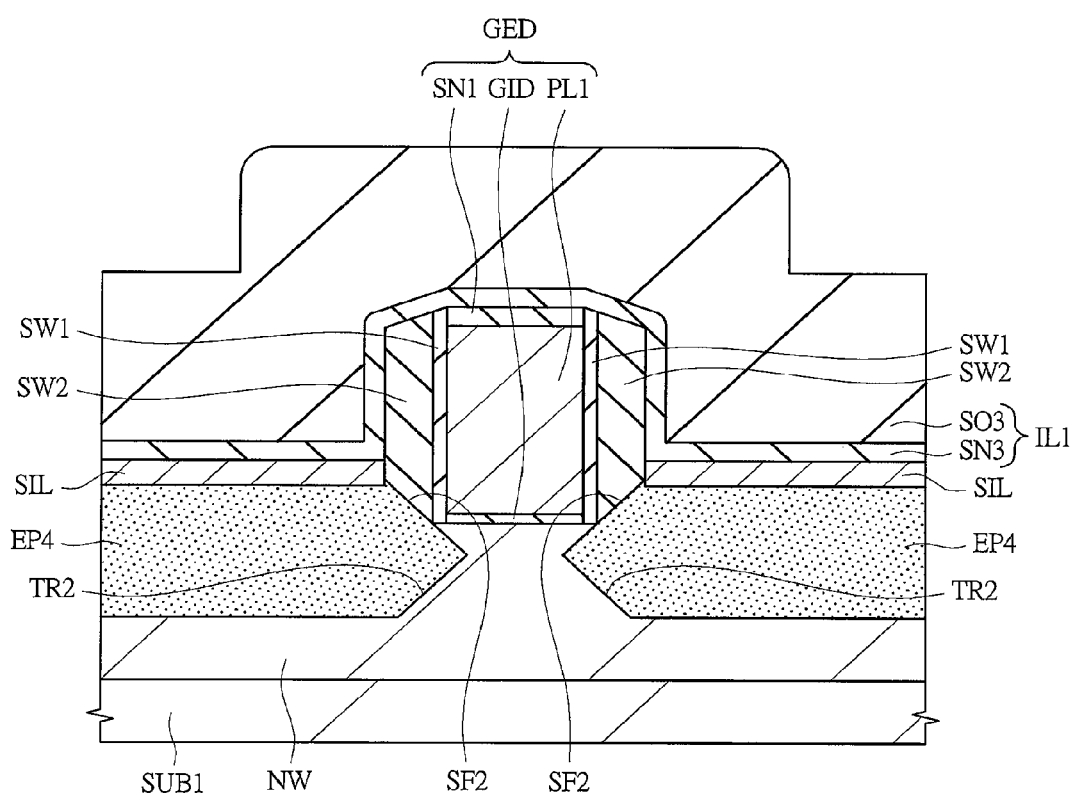
FIG. 75 is a cross-sectional view of main parts in the process of manufacturing the semiconductor device continued from FIG. 74.

Next, as depicted in FIG. 75, as with the above-described first embodiment, the insulating film IL1 is formed on the main surface (entire surface of the main surface) of the substrate SUB2 (step S11 of FIG. 67). That is, the insulating film IL1 is formed on the main surface of the substrate SUB2 so as to cover the dummy gate GED and the sidewall insulating films SW1 and SW4. Since the insulating film IL' has been described in the above-described first embodiment, its repeated description is omitted herein.

Figure 76:
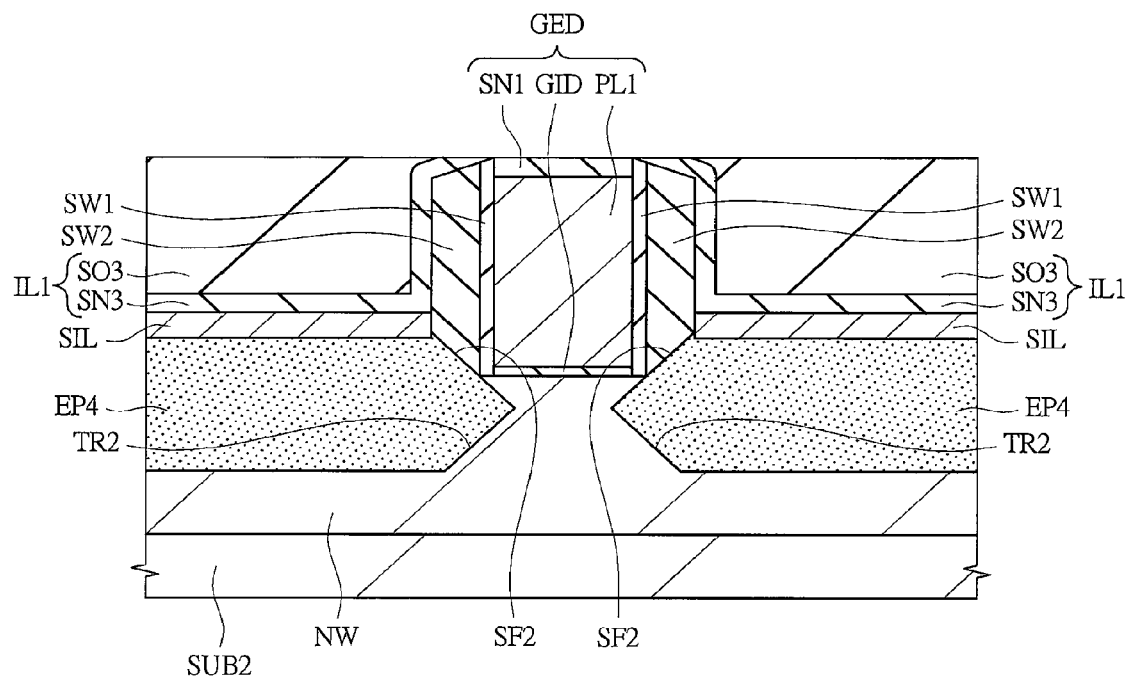
FIG. 76 is a cross-sectional view of main parts in the process of manufacturing the semiconductor device continued from FIG. 75.

Next, as depicted in FIG. 76, as with the above-described first embodiment, by polishing the surface (upper surface) of the insulating film IL1 with a CMP technique, the upper surface of the dummy gate GED (that is, the upper surface of the silicon nitride film SN1) is exposed (step S12 of FIG. 67).

Figure 77:
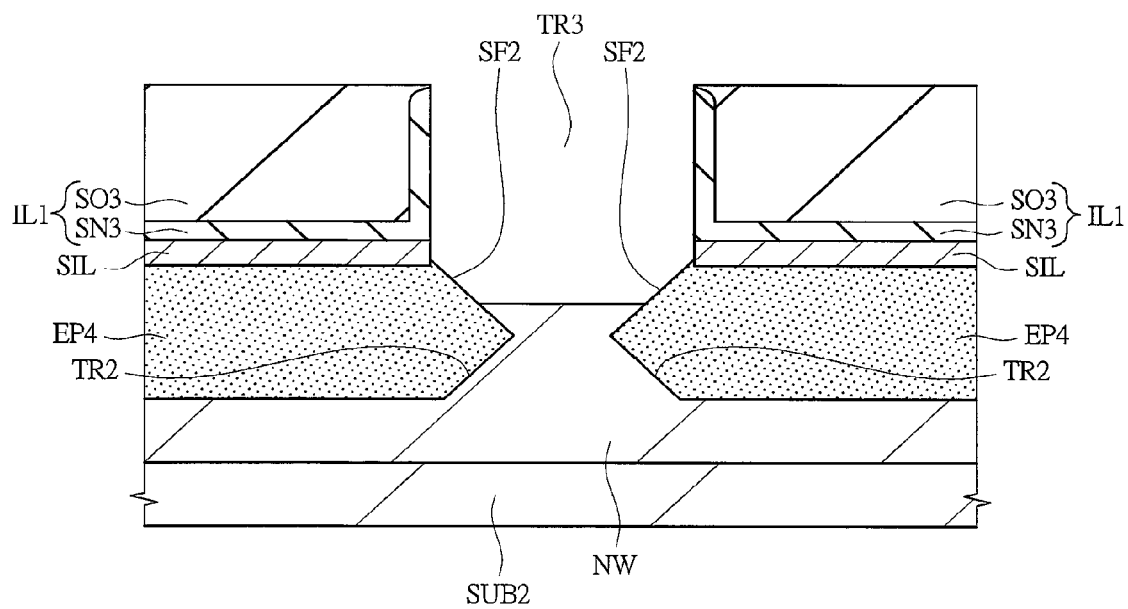
FIG. 77 is a cross-sectional view of main parts in the process of manufacturing the semiconductor device continued from FIG. 76.

Next, as depicted in FIG. 77, the dummy gate GED and the sidewall insulating films SW1 and SW4a are removed by etching (step S13b of FIG. 67).

By removing the dummy gate GED and the sidewall insulating films SW1 and SW2 at this step S13b, a trench (recessed part, opening, or depressed part) TR3 is formed. The trench TR3 is formed of a region (space) where the dummy gate GED and the sidewall insulating films SW1 and SW2 used to be present before removal of the dummy gate GED and the sidewall insulating films SW1 and SW2. From the trench TR3, (the upper surface of) the semiconductor substrate SUB2, (the tilted side surface SF2 of) the silicon-germanium layer EP4, and the inner surface of the silicon nitride film SN3 of the insulating film IL1 are exposed.

The bottom surface of the trench TR3 is formed of the upper surface of the semiconductor layer SM1 and the tiled side surface SF2 of the silicon-germanium layer EP4. The side surface (sidewall) of the trench TR3 is formed of the inner wall of the silicon nitride film SN3. A portion from the upper surface of the semiconductor substrate SUB2 exposed from the trench TR3 to the tilted side surface SF2 of the silicon-germanium layer EP4 can be regarded as the bottom surface of the trench TR3. An upper portion of the trench TR3 is open. Here, the inner wall of the silicon nitride film SN3 corresponds to a surface opposite to the side in contact with the insulating film SO3.

Etching at step S13b is preferably performed by the following three stages (a first stage, a second stage, and a third stage, refer to FIG. 78 to FIG. 80) of etching.

Figure 78:
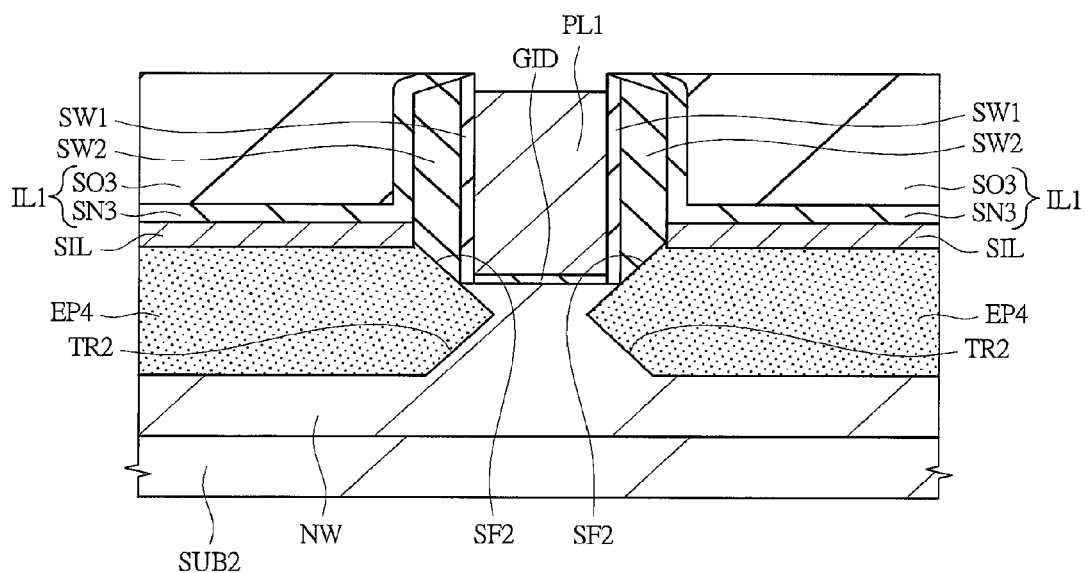
FIG. 78 is a cross-sectional view of main parts in the process of manufacturing the semiconductor device continued from FIG. 77.

First, as the first stage of etching at step S13b, the silicon nitride film SN1 of the dummy gate GED is removed, as depicted in FIG. 78. This first stage of etching in the fourth embodiment is also similar to that (the first stage of etching at the above-described step S13) of the above-described first embodiment. By the first stage of etching, the silicon nitride film SN1 is removed, and the polysilicon film PL1 is exposed.

Figure 79:
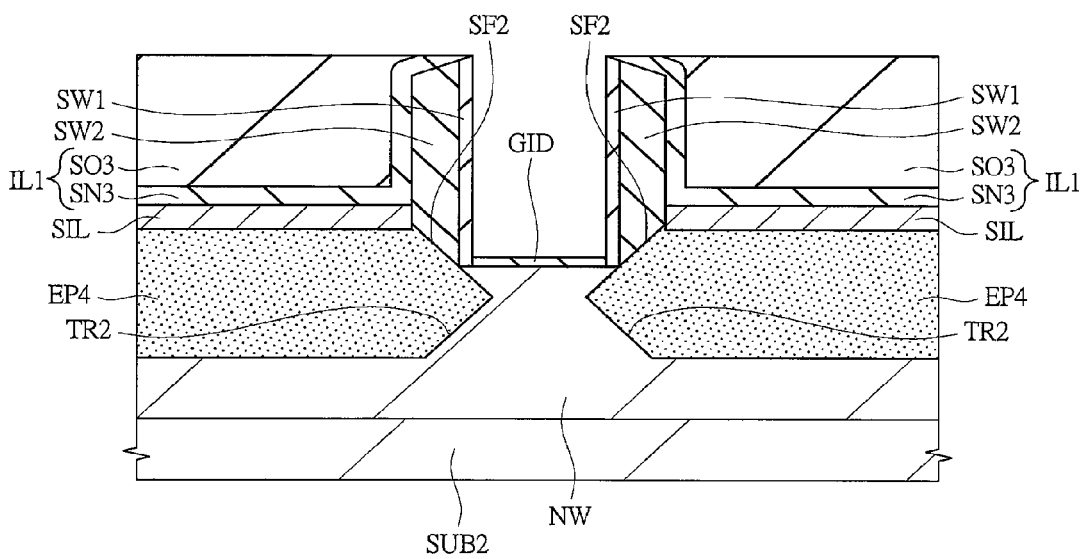
FIG. 79 is a cross-sectional view of main parts in the process of manufacturing the semiconductor device continued from FIG. 78.

Next, as the second stage of etching at step S13b, the polysilicon film PL1 of the dummy gate GED is removed, as depicted in FIG. 79. This second stage of etching in the fourth embodiment is also similar to that (the second stage of etching at the above-described step S13) of the above-described first embodiment. By the second stage of etching, the polysilicon film PL1 is removed, and the sidewall insulating film SW1 and the insulating film GID are exposed.

The third stage of etching at step S13b is basically similar to that of the above-described first embodiment, and can be performed as follows.

Figure 80:
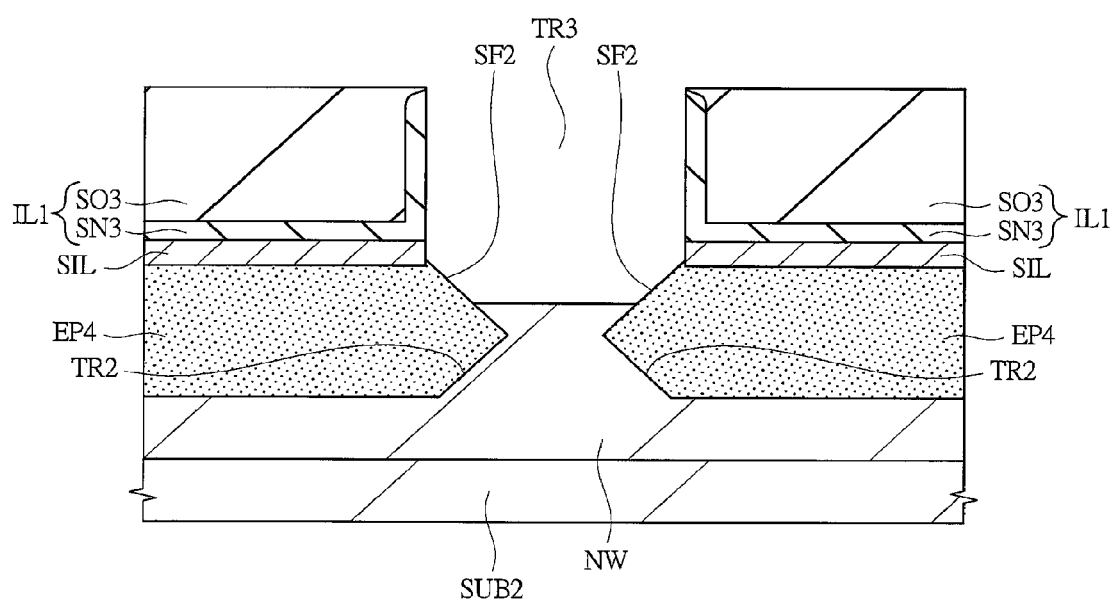
FIG. 80 is a cross-sectional view of main parts in the process of manufacturing the semiconductor device continued from FIG. 79.

That is, in the fourth embodiment, in the etching process at step S13b, after the polysilicon film PL1 is removed in the second stage of etching, the etching conditions are changed, and the sidewall insulating films SW1 and SW2 and the insulating film GID are removed by the third stage of etching, as depicted in FIG. 80. In this third stage of etching, the insulating films SW1 and SW2 and the insulating film GID are preferably etched selectively with etching conditions in which the etching speed of the insulating films SW1 and SW2 and the insulating film GID is faster than the etching speed of the semiconductor substrate SUB2 (n-type well NW) and the silicon-germanium layer EP4. With this, the semiconductor substrate SUB2 (n-type well NW) and the silicon-germanium layer EP4 can be inhibited or prevented from being etched by the third stage of etching. If the sidewall insulating film SW1 and the sidewall insulating film SW2 are formed of the same material (here, silicon oxide), the sidewall insulating film SW1 and the sidewall insulating film SW2 can be continuously etched with the same etching processing. Also, if the insulating film GID and the sidewall insulating films SW1 and SW2 are formed of the same material (here, silicon oxide), the insulating film GID can be removed in the same etching processing for removing the sidewall insulating films SW1 and SW2.

Also in the third stage of etching, while the sidewall insulating films SW1 and SW2 are removed, the silicon nitride film SN3 of the insulating film IL is preferably left. Thus, in the fourth embodiment, the sidewall insulating films SW2 is formed of a material different from that of the silicon nitride film SN3 of the insulating film IL1, and the third stage of etching is performed with etching conditions in which the etching speed of the sidewall insulating films SW1 and SW2 (specifically, silicon oxide) is faster than the etching speed of the silicon nitride film SN3 of the insulating film IL1, the semiconductor substrate SUB2, and silicon-germanium layer EP4. Here, since the sidewall insulating films SW1 and SW2 are formed of silicon oxide, it is easy to ensure a high etching selection ratio between the sidewall insulating films SW1 and SW2 and the silicon nitride film SN3 of the insulating film IL1. That is, in the third stage of etching, the sidewall insulating films SW1 and SW2 can be etched, and the silicon nitride film SN3 of the insulating film IL1 can function as an etching stopper. Also, since the sidewall insulating films SW1 and SW2 are formed of silicon oxide, it is also easy to ensure a high etching selection ratio between the sidewall insulating films SW1 and SW2 and the semiconductor substrate SUB2 and silicon-germanium layer EP4.

By removing the dummy gate GED and the sidewall insulating films SW1 and SW2 with the above-described three stages (the first stage, the second stage, and the third stage) of etching at step S13b, the trench TR3 is formed as depicted in FIG. 77 and FIG. 80.

Furthermore, also in the fourth embodiment, as with the above-described first embodiment, the above-described step S9 may be performed to form the above-described sidewall insulating film SW3 on the sidewall of the dummy gate GED via the sidewall insulating films SW1 and SW2, and then the metal silicide layer SIL may be formed at step S10. In this case, as with the above-described first embodiment, also in the fourth embodiment, the sidewall insulating film SW3 is preferably left at step S13, and the side surface (sidewall) of the trench TR3 is formed of the inner wall of the sidewall insulating film SW3.

Still further, in the fourth embodiment, as with the above-described second embodiment, the sidewall insulating films SW1 and SW2 can be formed of silicon nitride. In this case, etching at step S13b can be formed in a manner similar to that at step S13 of the above-described second embodiment.

Figure 81:
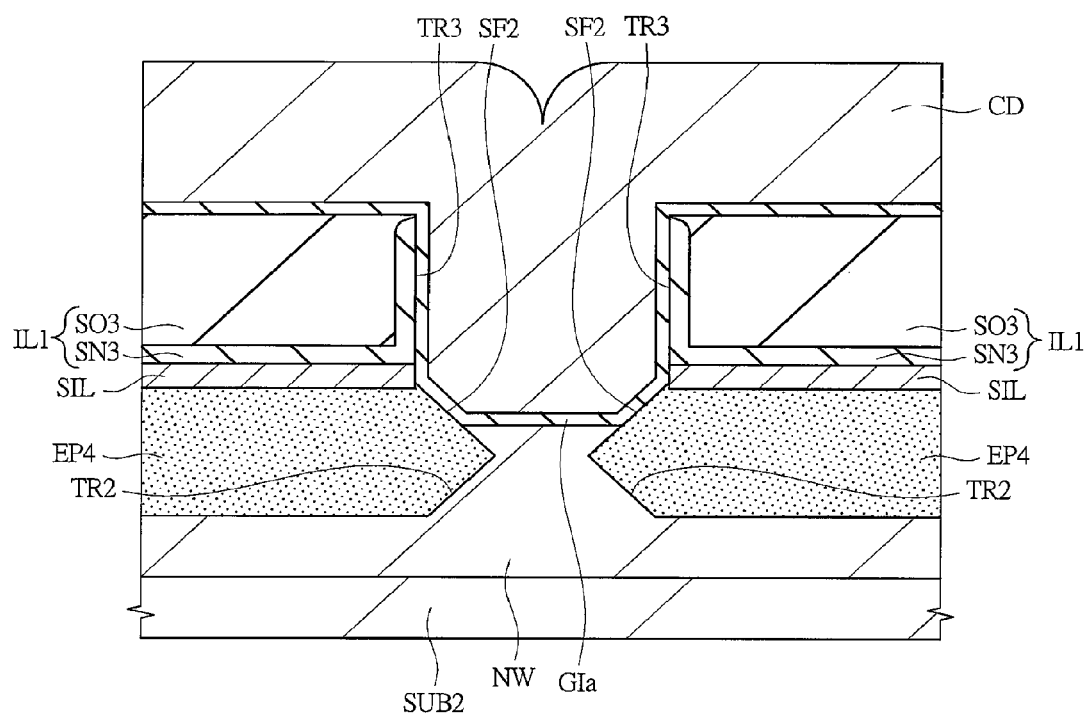
FIG. 81 is a cross-sectional view of main parts in the process of manufacturing the semiconductor device continued from FIG. 77 and FIG. 80.

Next, as with the above-described first embodiment, as depicted in FIG. 81, the insulating film GIa for the gate insulating film is formed on the main surface (entire surface of the main surface) of the semiconductor substrate SUB2 including the bottom surface and the side surface (sidewall) of the trench TR3, that is, on the insulating film IL1 including the bottom surface and the sidewall of the trench TR1 (step S14 of FIG. 67). Since the insulating film GIa has been described in the above-described first embodiment, its repeated description is omitted herein. Note that, as with the above-described first embodiment, a silicon oxide film equal to or smaller than 1 nm may be formed as an interface layer before the insulating film GIa is formed.

Figure 82:
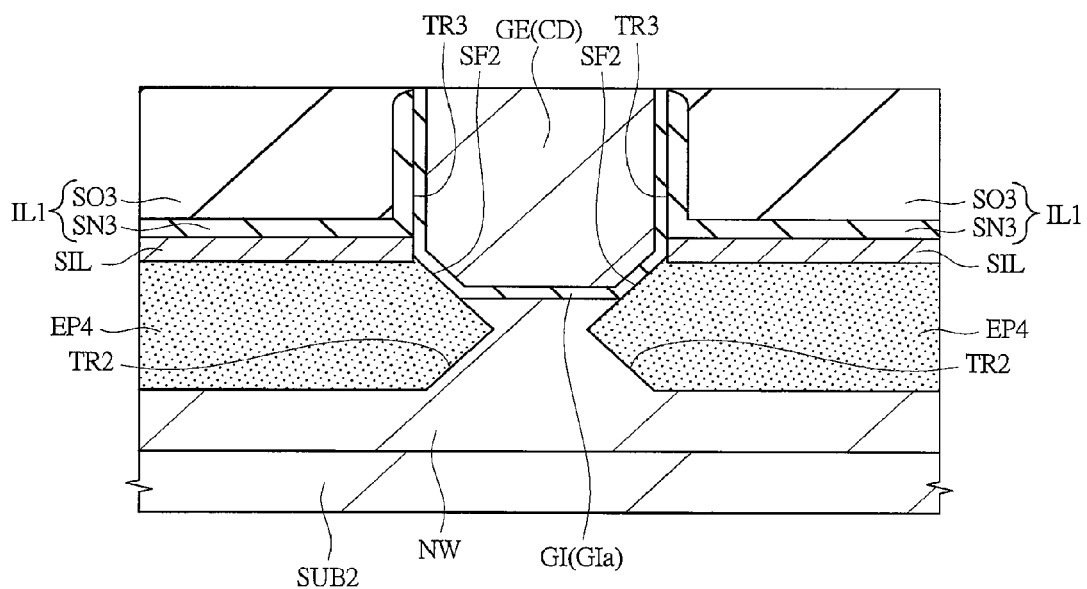
FIG. 82 is a cross-sectional view of main parts in the process of manufacturing the semiconductor device continued from FIG. 81.

Next, as with the above-described first embodiment, as depicted in FIG. 82, the gate-electrode conductive film (conductive material film) CD is formed on the main surface of the semiconductor substrate SUB2, that is, on the insulating film GIa, so as to fill the trench TR3 (step S15 of FIG. 67). Since the conductive film CD has been described in the above-described first embodiment, its repeated description is omitted herein.

Next, as depicted in FIG. 82, the gate electrode GE and the gate insulating film GI are formed by leaving the conductive film CD and the insulating film GIa in the trench TR3 and removing portions of the conductive film CD and the insulating film GIa outside the trench TR3 by a CMP technique or the like (step S16 of FIG. 67). Since step S16 in the third embodiment is similar to that of the above-described first embodiment, its repeated description is omitted herein. Step S16 is a process of forming the gate electrode GE in the trench TR1 via the gate insulating film GI. Note that, as with the above-described first embodiment, the gate electrode GE may have a laminated structure of a metal film and a polysilicon film or a structure with different metal films laminated.

The conductive film CD left in the trench TR3 serves as the gate electrode GE, and the insulating film GIa left in the trench 3 serves as the gate insulating film GI. And, the gate insulating film GI is in a state of being interposed between the gate electrode GE and the upper surface of the semiconductor substrate SUB2, between the gate electrode GE and the tilted side surface SF2 of the silicon-germanium layer EP4, and between the gate electrode GE and (the inner surface of) the silicon nitride film SN3. The gate electrode GE and the gate insulating film GI function as a gate electrode and a gate insulating film, respectively, of the MISFET.

A channel region of the MISFET is formed in the semiconductor SUB2 positioned below the gate electrode GE via the gate insulating film GI (insulating film GIa). Also, a semiconductor region (impurity diffusion layer) which functions as a source or drain of the MISFET is formed of the silicon-germanium layer EP4.

In this manner, a p-channel-type MISFET is formed.

In the fourth embodiment, the sidewall insulating film SW2 formed on the sidewall of the dummy gate GED and positioned on the silicon-germanium layer EP4 is removed at step S13b together with the dummy gate GED, and the gate electrode GE is formed in that removed region (trench TR3). Thus, the gate electrode GE can be formed not only in the region where the dummy gate GED used to be present but also in the region where the sidewall insulating film SW2 used to be present. Thus, the dimension of the gate electrode GE in the gate length direction can be made longer than the dimension of the dummy gate GED, and parts of the gate electrode GE (on both end sides in the gate length direction) are positioned on the silicon-germanium layer EP4, that is, ride onto the silicon-germanium layer EP4. Therefore, the end parts of the gate electrode GE in the gate length direction are positioned on the silicon-germanium layer EP4. And, part of the silicon-germanium layer EP4 (therefore, part of the source or drain semiconductor region) is positioned straight below the gate electrode GE.

Figure 83:
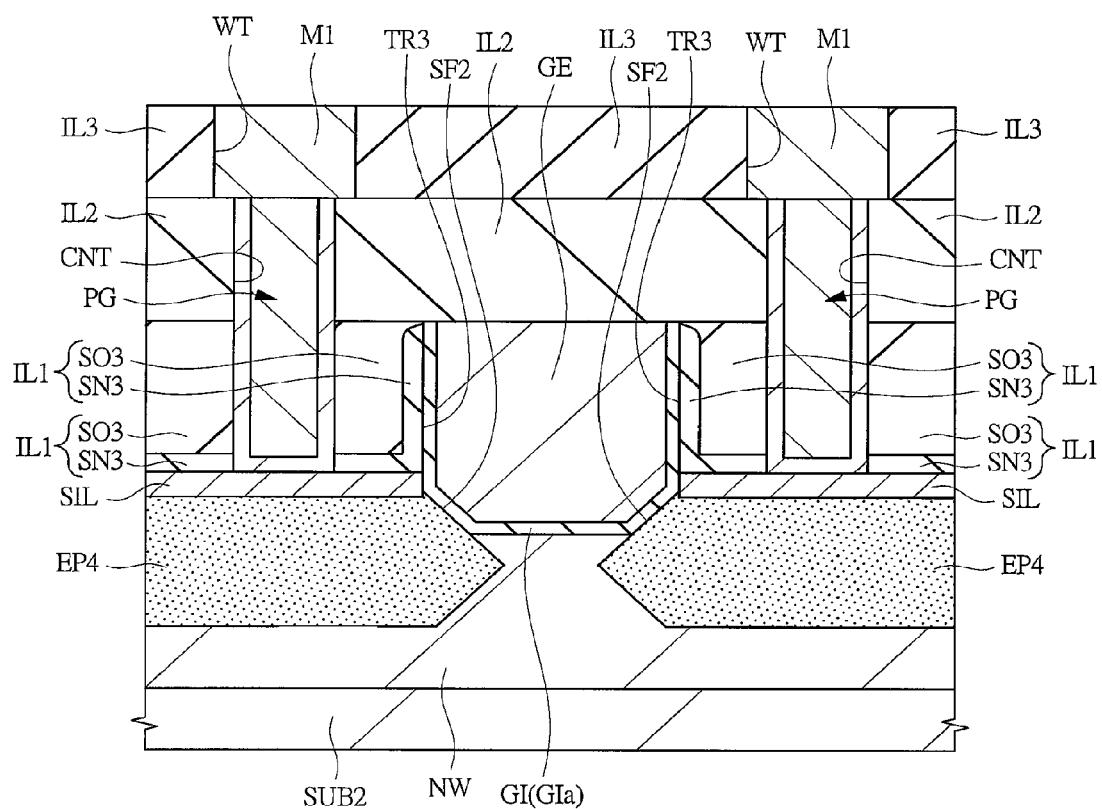
FIG. 83 is a cross-sectional view of main parts in the process of manufacturing the semiconductor device continued from FIG. 82.

Subsequent processes are substantially similar to those of the above-described first embodiment. That is, as depicted in FIG. 83, as with the above-described first embodiment, the above-described insulating film IL2 is formed, the above-described contact hole CNT is formed, the above-described plug PG is formed in the contact hole CNT, the above-described insulating film IL3 is formed, and the above-described wiring M1 is formed.

Figure 84:
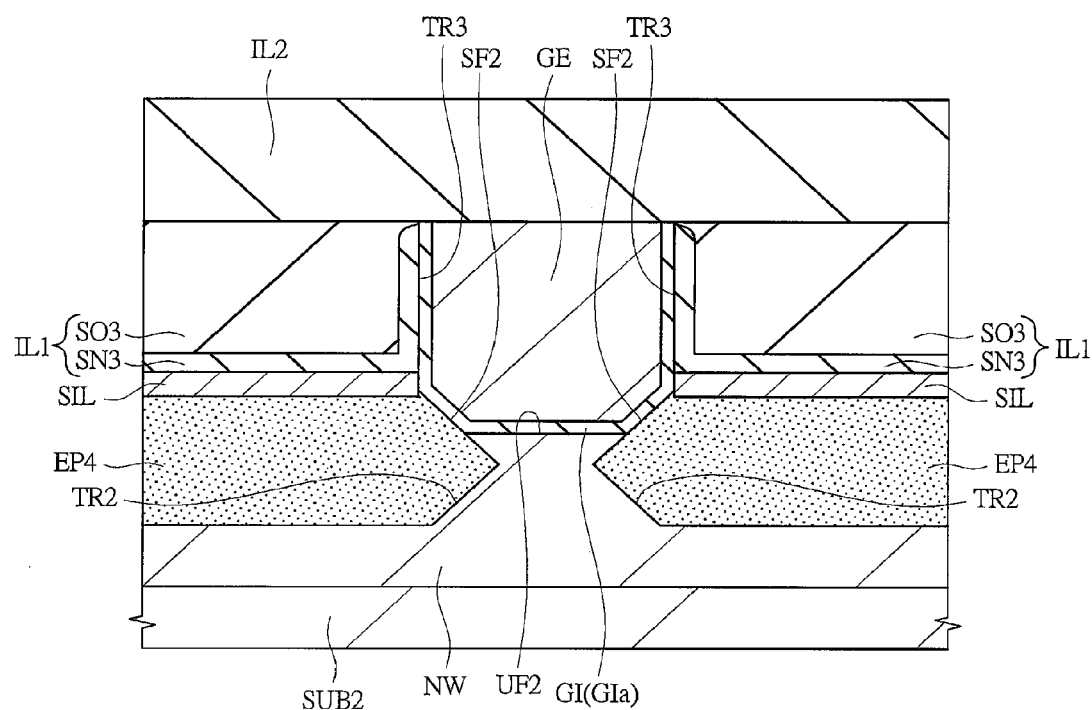
FIG. 84 is a cross-sectional view of main parts of the semiconductor device of the fourth embodiment.

FIG. 84 is a cross-sectional view of main parts of the semiconductor device of the fourth embodiment.

In the fourth embodiment, the MISFET is formed not on the SOI substrate but on the semiconductor substrate SUB2 in a bulk state. On this semiconductor substrate SUB2, the gate electrode GE is formed via the gate insulating film GI. Also, the trench TR2 is formed in the semiconductor substrate SUB2, and the silicon-germanium layer EP4 is formed in this trench TR2 as a source/drain epitaxial layer.

That is, the trench TR2 is formed in the semiconductor substrate SUB2, and the source/drain epitaxial layer is buried in this trench TR2. The source/drain epitaxial layer buried in this trench TR2 is the silicon-germanium layer EP4 in the case of a p-type-channel MISFET. As described above, when the fourth embodiment is applied to an n-channel-type MISFET, the source/drain epitaxial layer buried in this trench TR2 is a SiC layer. While FIG. 84 exemplarily depicts the case of a p-channel-type MISFET, when the fourth embodiment is applied to an n-channel-type MISFET, the n-type well NW is replaced by the p-type well and the silicon-germanium layer EP4 is replaced by the SiC layer in FIG. 84. Note that the channel region of the MISFET is formed in a silicon substrate region of the semiconductor substrate SUB2 (a monocrystalline Si region (Si substrate region) configuring the n-type well NW in the case of the p-channel-type MISFET, and a monocrystalline Si region (Si substrate region) configuring the p-type well in the case of the n-channel-type MISFET).

While the silicon-germanium layer EP4 is formed on both sides (both sides in the gate length direction) of the gate electrode GE, the end parts of the gate electrode GE in the gate length direction are positioned on the silicon-germanium layer EP4. In other words, in the gate length direction of the MISFET (MISFET with the gate electrode GE as a gate electrode), the end parts of the gate electrode GE are positioned on the silicon-germanium layer EP4. That is, the end parts (both ends in the gate length direction) of the gate electrode GE ride onto the silicon-germanium layer EP4.

That is, while the center side of the gate electrode GE in the gate length direction is on a portion of the semiconductor substrate SUB2 where the silicon-germanium layer EP4 is not formed, both end sides of the gate electrode GE in the gate length direction ride onto the silicon-germanium layer EP4. That is, while the center side (center side in the gate length direction) of the gate electrode GE does not overlap with the silicon-germanium layer EP4 (does not overlap in a thickness direction of the semiconductor substrate SUB2), the end parts (ends in the gate length direction) of the gate electrode GE overlap with the silicon-germanium layer EP4 (overlap in the thickness direction of the semiconductor substrate SUB2). In other words, the silicon-germanium layer EP4 is present straight below portions near the end parts of the gate electrode GE (portions near the both ends in the gate length direction), and the silicon-germanium layer EP4 is not present (the Si substrate region is present) straight below the center side of the gate electrode GE (the center side in the gate length direction).

And, while the silicon-germanium layer EP4 is formed (buried) in the trench TR2 of the semiconductor substrate SUB2, the upper surface of the silicon-germanium layer EP4 is positioned higher than the upper surface of the semiconductor substrate SUB2 straight below the gate electrode GE. Here, the upper surface of the semiconductor substrate SUB2 straight below the gate electrode GE corresponds to the surface (upper surface) of a portion of the semiconductor substrate SUB2 in contact with the gate insulating film GI below the gate electrode GE, and is provided with a character UF2 in FIG. 84 and denoted as the upper surface UF2.

Since p-type impurities are introduced to the silicon-germanium layer EP4, the silicon-germanium layer EP4 is a semiconductor region which functions as a source or drain. The semiconductor substrate SUB2 below the gate electrode GE serves as a region (channel formation region) where a channel of the MISFET is to be formed. Thus, part of the source or drain semiconductor region (here, the silicon-germanium layer EP4) is positioned straight below the gate electrode GE.

Note that the insulating film IL1 is formed on the SOI substrate SUB so as to cover the semiconductor layer EP1 and the gate electrode GE is buried in the trench TR formed in the insulating film IL1 in the above-described first embodiment. On the other hand, in the fourth embodiment, the insulating film IL1 is formed on the semiconductor substrate SUB2 so as to cover the silicon-germanium layer EP4 and the gate electrode GE is buried in the trench TR3 formed in the insulating film IL1. Also, in the above-described first embodiment, the gate insulating film GI is formed on the side surface and the bottom surface of the trench TR, and the gate electrode GE is buried in the trench TR via the gate insulating film GI. On the other hand, in the fourth embodiment, the gate insulating film GI is formed on the side surface and the bottom surface of the trench TR3, and the gate electrode GE is buried in the trench TR3 via the gate insulating film GI.

Furthermore, in the above-described first embodiment, the side surface SF1 of the semiconductor layer EP1 is tilted, and the end parts of the gate electrode GE in the gate length direction are positioned on the tilted side surface SF1 of the semiconductor layer EP1. On the other hand, in the fourth embodiment, the side surface SF2 of the silicon-germanium layer EP4 is tilted, and the end parts of the gate electrode GE in the gate length direction are positioned on the tilted side surface SF2 of the silicon-germanium layer EP4. In other words, the side surface (side surface on the gate electrode GE side) SF2 of the silicon-germanium layer EP4 is tilted in the gate length of the MISFET (MISFET with the gate electrode GE as a gate electrode), and the end parts of the gate electrode GE are positioned on the tilted side surface SF2 of the semiconductor layer EP1 in the gate length of the MISFET (MISFET with the gate electrode GE as a gate electrode). That is, the end parts (ends in the gate length direction) of the gate electrode GE ride onto the tilted side surface SF2 of the silicon-germanium layer EP4.

In this semiconductor device, the following effects can be obtained.

That is, when the silicon-germanium layer EP4 is formed at step S4c as an epitaxial layer doped with conduction-type impurities (p-type impurities when a p-channel-type MISFET is formed), overlapping between the source or drain semiconductor region (silicon-germanium layer EP4) and the dummy gate GED is less prone to be formed. Thus, unlike the present embodiment, in the case of using the polysilicon film PL1 of the dummy gate GED as a gate electrode of the semiconductor device without removing it, overlapping between the source or drain semiconductor region (silicon-germanium layer EP4) and the gate electrode is insufficient, thereby possibly increasing parasitic resistance between the source or drain semiconductor region and the channel region.

Also, as a modification example of the fourth embodiment, there is a case in which ion implantation for forming a $p^-$-type semiconductor region EX is performed in a manner similar to that of the above-described step S5 after the silicon-germanium layer EP4 is formed at step S4c as an undoped or low-concentration-doped silicon-germanium layer, and then ion implantation for forming a $p^+$-type semiconductor region SD is performed in a manner similar to that of the above-described step S7 after the sidewall insulating film SW2 is formed at step S6. In this case, the $p^-$-type semiconductor region EX and the $p^+$-type semiconductor region SD are formed mainly in the silicon-germanium layer EP4. However, since the upper surface of the silicon-germanium layer EP4 is positioned higher than the upper surface of the semiconductor substrate SUB2 straight below the gate electrode GE, the p-type impurities introduced by ion implantation are less prone to be diffused to a region straight below the dummy gate GED. Therefore, overlapping between the source or drain semiconductor region and the dummy gate GED is less prone to be formed. Thus, unlike the present embodiment, in the case of using the polysilicon film PL1 of the dummy gate GED as a gate electrode of the semiconductor device without removing it, overlapping between the source or drain semiconductor region (silicon-germanium layer EP4) and the gate electrode is insufficient, thereby possibly increasing parasitic resistance between the source or drain semiconductor region and the channel region.

By contrast, in the fourth embodiment, the sidewall insulating film SW2 formed on the sidewall of the dummy gate GED after formation of the silicon-germanium layer EP4 is removed at step S13b together with the dummy gate GED, and then the gate electrode GE is formed. With this, the gate electrode GE is formed not only in the region where the dummy gate GED used to be formed but also in the region where the sidewall insulating film SW2 used to be formed. Thus, the end parts (both ends in the gate length direction) of the gate electrode GE ride onto the silicon-germanium layer EP4, and the end parts of the gate electrode GE in the gate length direction are positioned on the silicon-germanium layer EP4. Therefore, overlapping between the source or drain semiconductor region (silicon-germanium layer EP4) and the gate electrode GE can be reliably ensured, and parasitic resistance between the source or drain semiconductor region and the channel region can be inhibited. That is, parasitic resistance can be inhibited in both of the case in which the silicon-germanium layer EP4 is grown as a p-type-doped epitaxial layer and the case, as in the above-described modification example of the fourth embodiment, in which the above-described $p^-$-type semiconductor region EX and $n^+$-type semiconductor region SD are formed in the silicon-germanium layer EP4 by ion implantation. Thus, the above-described first problem can be solved.

Therefore, the characteristics (electrical characteristics) of the semiconductor device including a MISFET can be improved. Furthermore, fluctuations in characteristics for each MISFET due to fluctuations of the value of parasitic resistance can also be inhibited. Thus, the performance of the semiconductor device can be improved. Still further, also in the fourth embodiment, the structure in which the gate electrode GE rides onto the silicon-germanium layer EP4 can be formed in a self-aligned manner.

Furthermore, also in the fourth embodiment, the silicon-germanium layer EP4 has a tilted part (tilted side surface SF2), and the gate insulating film GI (insulating film GIa) and the gate electrode GE are formed along the tilted part (tilted side surface SF2). Thus, in the trench TR3, the film thickness of the gate insulating film GI (insulating film GIa) can be uniformly formed with ease. Therefore, inconvenience such as a decrease in withstand voltage of the MISFET as described in the above-described third problem can be solved.

Still further, also in the fourth embodiment, the diameter of the trench TR3 can be made larger than the length of the dummy gate GED. Thus, as depicted in FIG. 81, the aspect ratio can be ensured (the aspect ratio of the trench TR3 can be decreased), and therefore vacancy is less prone to occur even if the conductive film CD serving as the gate electrode GE is deposited in the trench TR3. Therefore, inconvenience as described in the above-described fourth problem can be solved.

Still further, also in the MISFET of the fourth embodiment, since the length of the upper part of the gate electrode GE is longer (than the length of the lower part of the gate electrode GE), the volume of the entire gate electrode GE can be increased, and therefore the resistance of the gate electrode GE can be decreased.

In the foregoing, the invention made by the inventors of the present invention has been concretely described based on the embodiments. However, it is needless to say that the present invention is not limited to the foregoing embodiments and various modifications and alterations can be made within the scope of the present invention.

EXPLANATION OF REFERENCE NUMERALS

BOX1 Insulating layer
BR Barrier conductive film
CD Conductive film
CNT Contact hole
EG End part
EG1, EG2, EG3, EG4 Corner part
EP1, EP2, EP3 Semiconductor layer
EP4 Silicon-germanium layer
EX n$^-$-type semiconductor region
GE, GE 101, GE 102 Gate electrode
GED Dummy gate
GI, GI101, GI102 Gate insulating film
GIa Insulating film
GID Insulating film
IL1, IL2, IL3 Insulating film
IL101 interlayer Insulating film
M1 Wiring
ME Metal film
MC1 Main conductive film
PG Plug
PL1 Polysilicon film
NW n-type well
SD n$^+$-type semiconductor region
SF1, SF1a, SF2 Side surface
SIL Metal silicide layer
SM1, SM2 Semiconductor layer
SN1, SN2, SN101, SN103 Silicon nitride film
SN3 Liner film
SO1, SO2, SO103 Silicon oxide film
SO3 Insulating film
SUB SOI substrate
SUB1 Substrate
SUB2 Semiconductor substrate
SW1, SW1a, SW2, SW2a, SW3, SW4, SW4a, SW4b Sidewall insulating film
TR, TR1, TR2, TR3, TR101 Trench
UF1, UF2 Upper surface
WT Wiring trench

What is claimed is:

1. A semiconductor device including a MISFET, comprising:
a plurality of first grooves formed in a semiconductor substrate;
a first epitaxial layer for a source of the MISFET and a second epitaxial layer for a drain of the MISFET embedded in the first grooves, respectively,
a first insulating film formed over the first and second epitaxial layers;
a second groove formed in the first insulating film;
a gate insulating film of the MISFET formed over side surfaces and a bottom surface of the second groove; and
a gate electrode of the MISFET embedded in the second groove through the gate insulating film,
wherein each of the first and second epitaxial layers has a protruding portion such that an upper surface of the protruding portion is positioned higher than an upper surface of the semiconductor substrate,
wherein each of protruding portions has a tilted side surface having a thickness which gradually increases, and
wherein, in a gate length direction of the MISFET, both edges of the gate electrode are arranged over the first and second epitaxial layers, respectively.

2. The semiconductor device according to the claim 1, wherein, in the second groove, the gate insulating is formed along the tilted side surfaces of the first and second epitaxial layers.

3. The semiconductor device according to the claim 2, wherein, in the second groove, the gate electrode is formed along the tilted side surfaces of the first and second epitaxial layers through the gate insulating.

4. The semiconductor device according to the claim 1, wherein the gate insulating film includes a metal oxide film.

5. The semiconductor device according to the claim 4, wherein the gate insulating film includes a silicon oxide film formed on the semiconductor substrate between the first and second epitaxial layers.

6. The semiconductor device according to the claim 1, wherein the gate electrode include a metal film.

7. The semiconductor device according to the claim 1, wherein silicide layers are formed on the first and second epitaxial layers.

8. The semiconductor device according to the claim 1, wherein the semiconductor substrate is formed of silicon, wherein the MISFET is a p-type MISFET,
wherein a channel region of the p-type MISFET is formed in the silicon, and
wherein the first and second epitaxial layers include SiGe, respectively.

9. The semiconductor device according to the claim 1, wherein the semiconductor substrate is formed of silicon, wherein the MISFET is an n-type MISFET,
wherein a channel region of the n-type MISFET is formed in the silicon, and
wherein the first and second epitaxial layers include SiC, respectively.

* * * * *